United States Patent [19]

Bromberg et al.

[11] 4,007,443
[45] Feb. 8, 1977

[54] HAND-HELD INTERACTIVE TERMINAL

[75] Inventors: Michael Arnold Bromberg, Boston, Mass.; William E. Fletcher, Nashua, N.H.; Richard E. Morley, Greenville, N.H.; George G. Schwenk, Nashua, N.H.

[73] Assignee: Termiflex Corporation, Nashua, N.H.

[22] Filed: May 6, 1974

[21] Appl. No.: 467,283

[52] U.S. Cl. .................... 340/172.5; 179/2 DP; 340/365 S
[51] Int. Cl.² .................... G06F 3/00; H04M 11/00
[58] Field of Search ........ 340/172.5, 149 A, 152 R, 340/365 R, 365 S; 179/2 DP, 2 CA, 98 R; 178/17 C, 17.5, 79, 81, 21; 197/98 R

[56] References Cited

UNITED STATES PATENTS

| | | | |
|---|---|---|---|
| 3,389,404 | 6/1968 | Koster | 340/172.5 |
| 3,403,225 | 9/1968 | Mislan et al. | 340/172.5 |
| 3,623,588 | 4/1969 | Prodan | 340/365 S |
| 3,675,513 | 7/1972 | Flanagan et al. | 179/2 DP |
| 3,680,077 | 7/1972 | Hoberecht | 340/172.5 |
| 3,728,710 | 4/1973 | Berg | 340/172.5 |
| 3,778,819 | 12/1973 | Bhagawan et al. | 340/365 S |
| 3,833,765 | 9/1974 | Hilborn et al. | 340/365 R |
| 3,870,821 | 3/1975 | Steury | 179/2 DP |

OTHER PUBLICATIONS

Stuckert: Input Keyboard, IBM Technical Disclosure Bull., vol. 14, No. 3, Aug. 1971, pp.952–959.

Primary Examiner—Jerry Smith
Attorney, Agent, or Firm—Mattern, Ware, Davis & Stoltz

[57] ABSTRACT

An interactive terminal which is capable of complete hand-held operation with total freedom of position and location is provided. The terminal incorporates a self contained full 128-character keyboard, a 20-character alphanumeric readout, and a 1000-character memory. The terminal allows the generation of all 128 ASCII characters plus "break." In order to assure review of any message, a conveniently positioned scroll switch is incorporated to advance or roll back any messsage in the memory for presentation on the display.

When previous messages are displayed and incoming information is being received by the terminal, the light intensity of the displayed messages modulates to indicate to the operator that information is being received but not displayed. The unique, totally portable, hand-held interactive terminal is provided with a 20 key keyboard which is operated with one hand, while the other hand selects one of four different information levels for each key. Consequently, each of the 20 keys is capable of transmitting four different characters or other information thereby assuring easy, compact transmission of all numeric, alphabetic, and punctuation characters, and command information to an interconnected device.

The interactive computer terminal prevents the transmission of information when more than one of the twenty keys of the keyboard is depressed simultaneously In addition, the terminal allows for the automatic transmission of any characters when the corresponding key is depressed for a short period of time. Furthermore, an audible alarm is incorporated which automatically sounds when improper keyboard operation is attempted.

The interactive terminal provides for local operation that allows the invention to display information without transmitting this information to any interconnected device. The display of the present terminal incorporates a cursor that indicates the position, type and information level of the next character to be generated and transmitted if a keyboard key is depressed.

Furthermore, the interactive terminal provides for the selection of various parameters; including communication speed, parity, half-duplex or full-duplex mode, upper or lower case alphanumeric transmission from the keyboard, and a "justify" operation for presenting of words on more than one line if these words are equal to or less than 10 characters.

68 Claims, 66 Drawing Figures

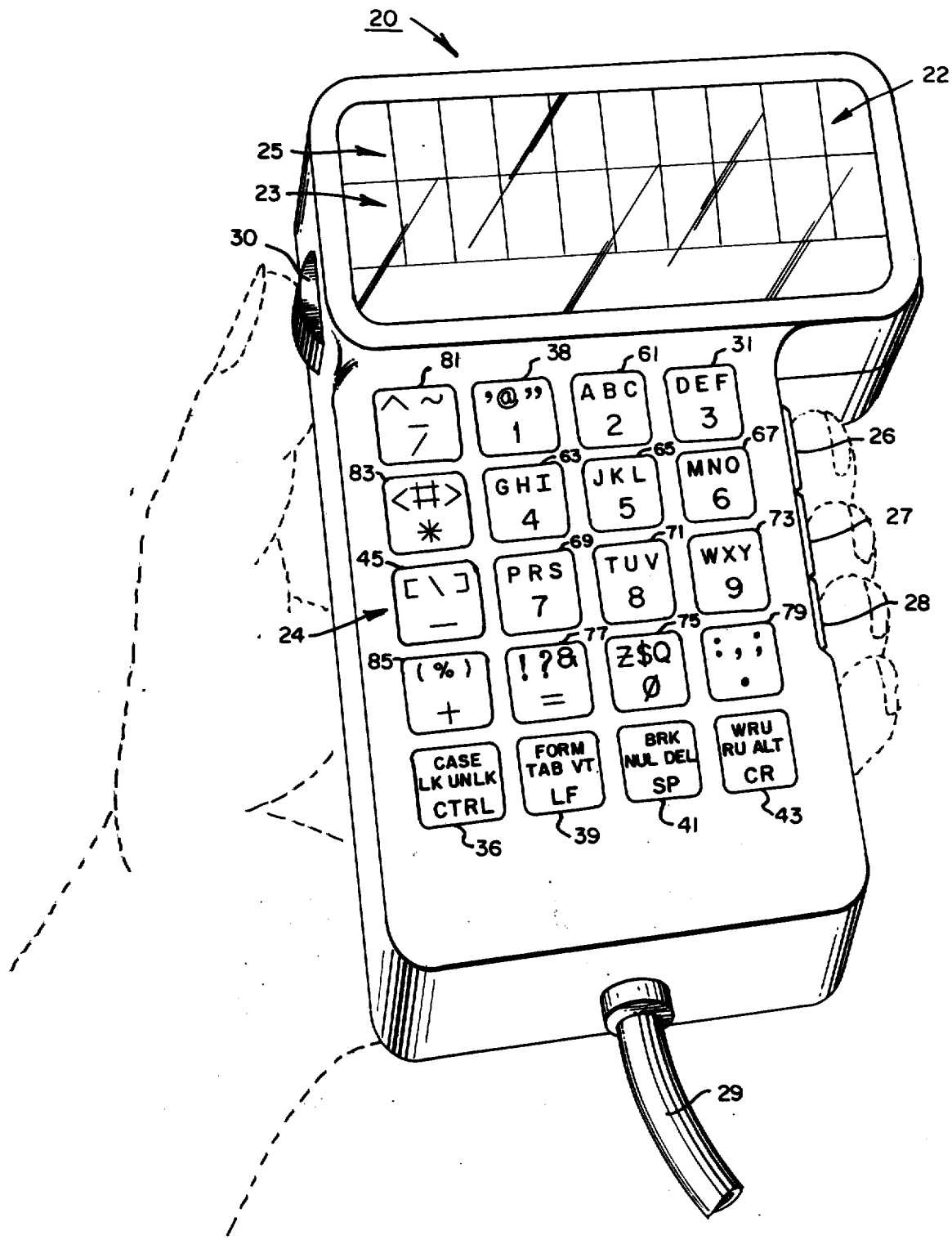
FIG. IA

CURSORS

DIRECT CONNECT
ACOUSTIC COUPLER

RS232C/CURRENT LOOP

FIG. 9

| FIG. 9A | FIG. 9B |
|---------|---------|
| FIG. 9C | FIG. 9D |

FIG. 10

| FIG. 10A | FIG. 10B |
|----------|----------|
| FIG. 10C | FIG. 10D |

FIG. 11

| FIG. 11A | FIG. 11B |
|----------|----------|
| FIG. 11C | FIG. 11D |

FIG. 12

| FIG. 12A | FIG. 12B | FIG. 12C |
|----------|----------|----------|
|          | FIG. 12D |          |

FIG. 13

| FIG. 13A | FIG. 13B |
|----------|----------|
| FIG. 13C | FIG. 13D |

FIG. 14

| FIG. 14A | FIG. 14B |
|----------|----------|
| FIG. 14C | FIG. 14D |

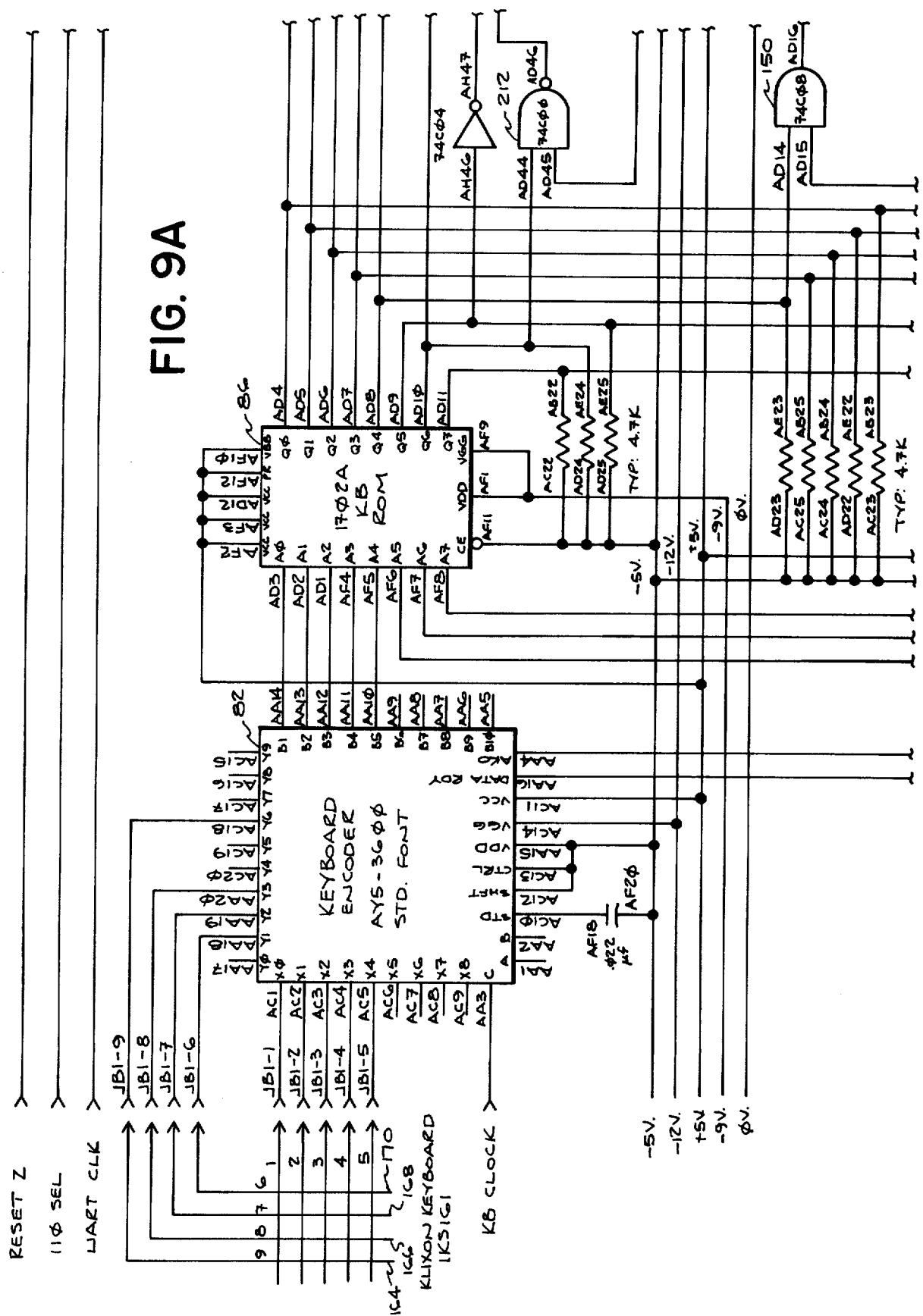

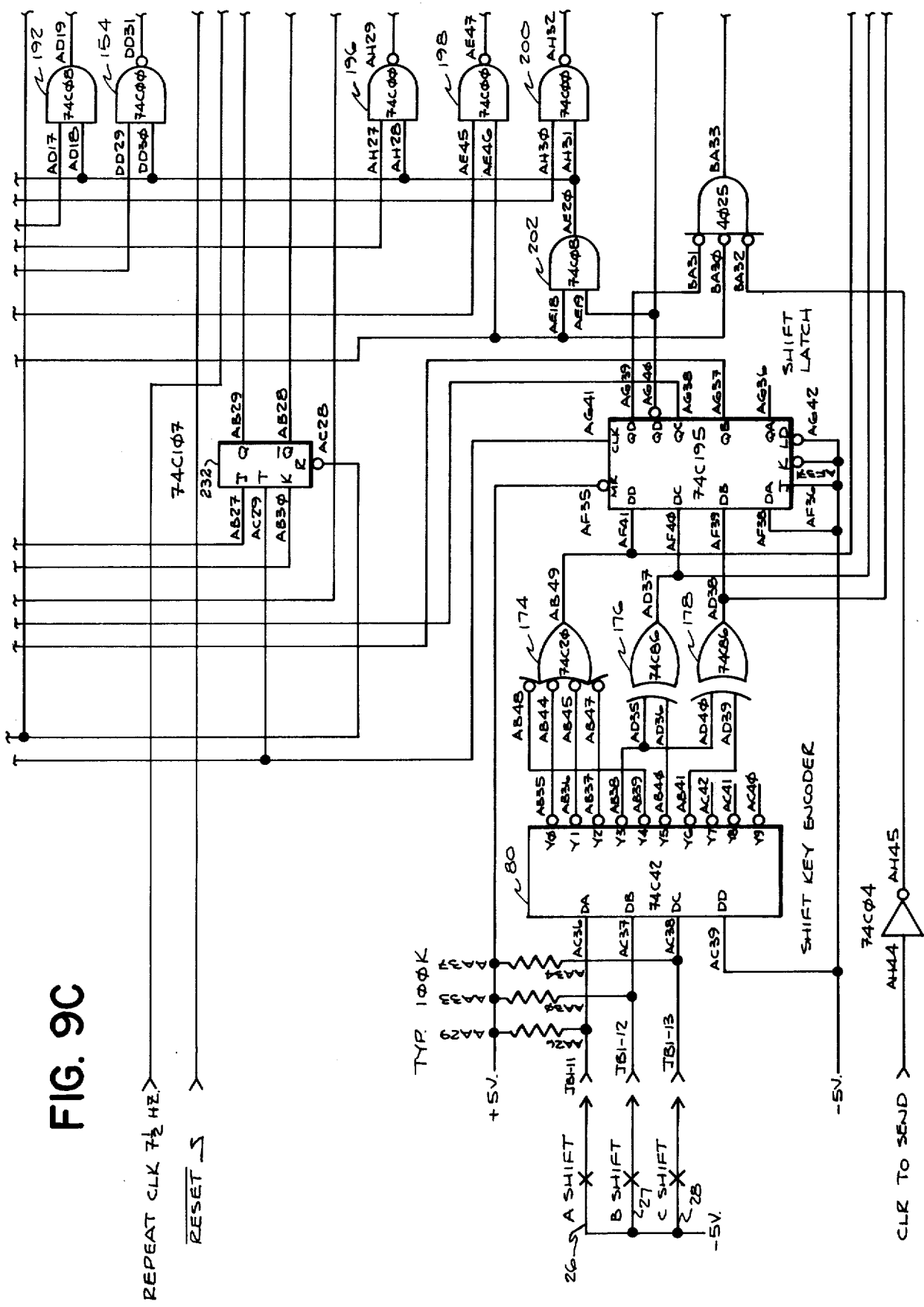

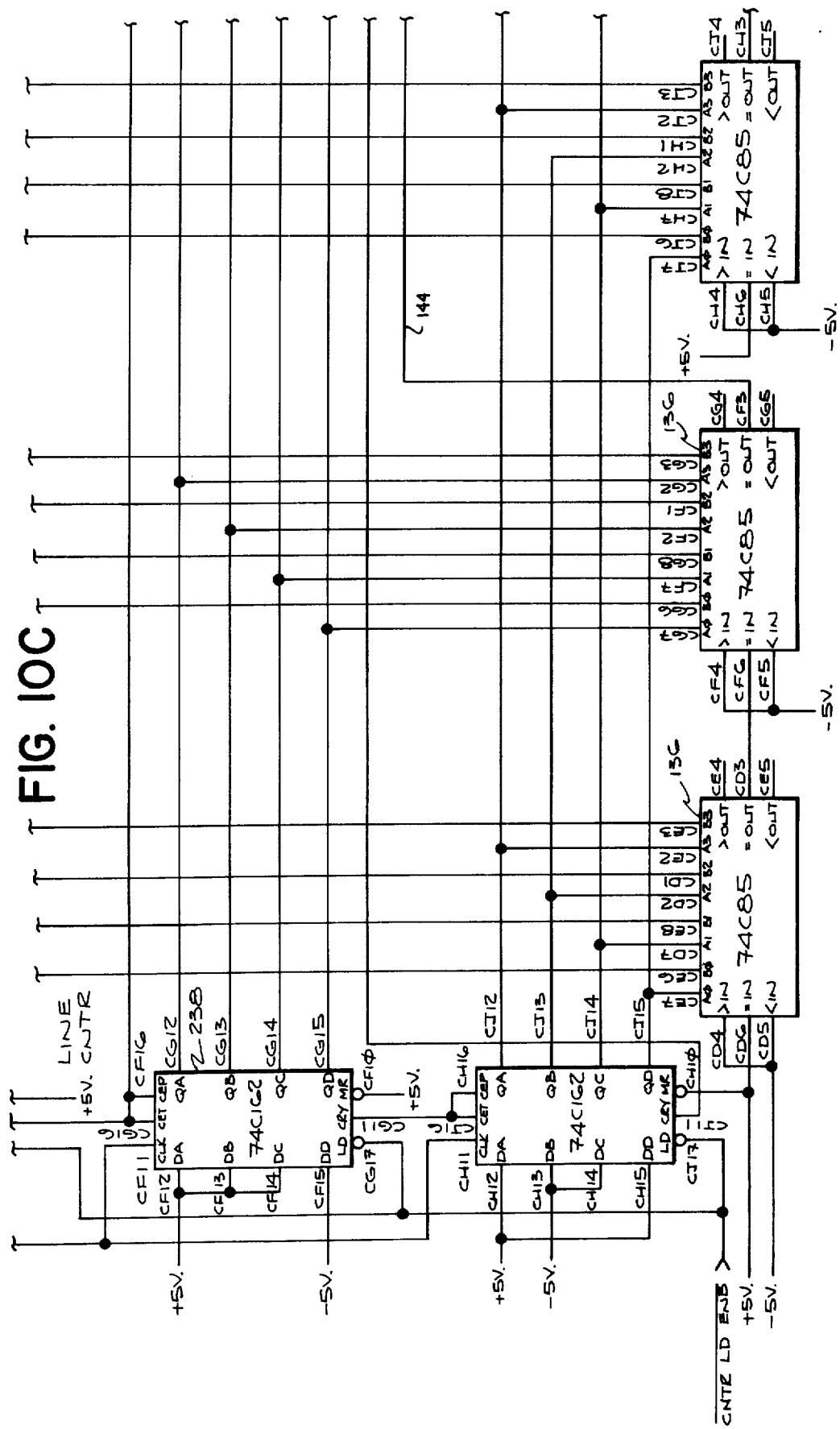

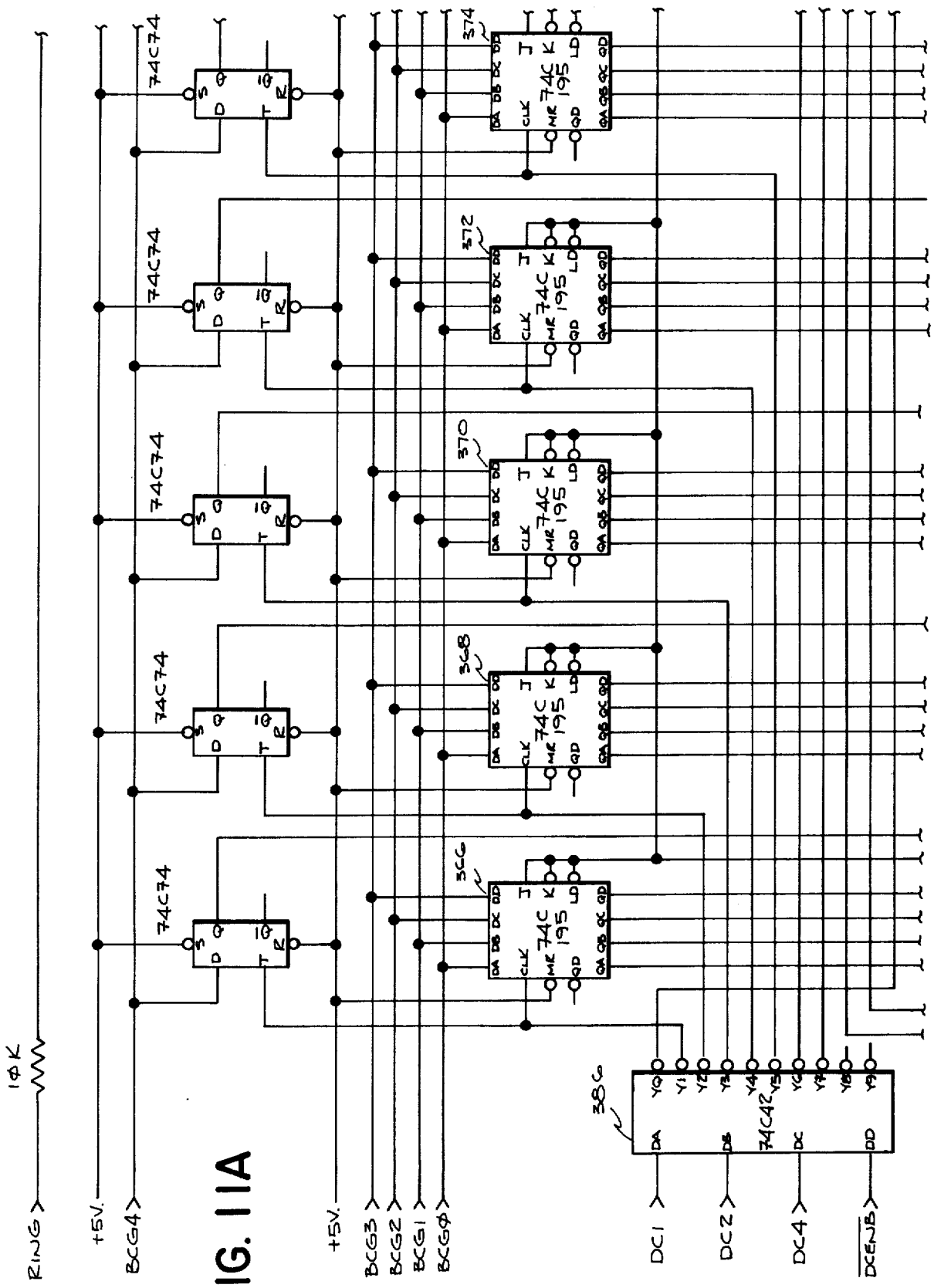
FIG. IIA

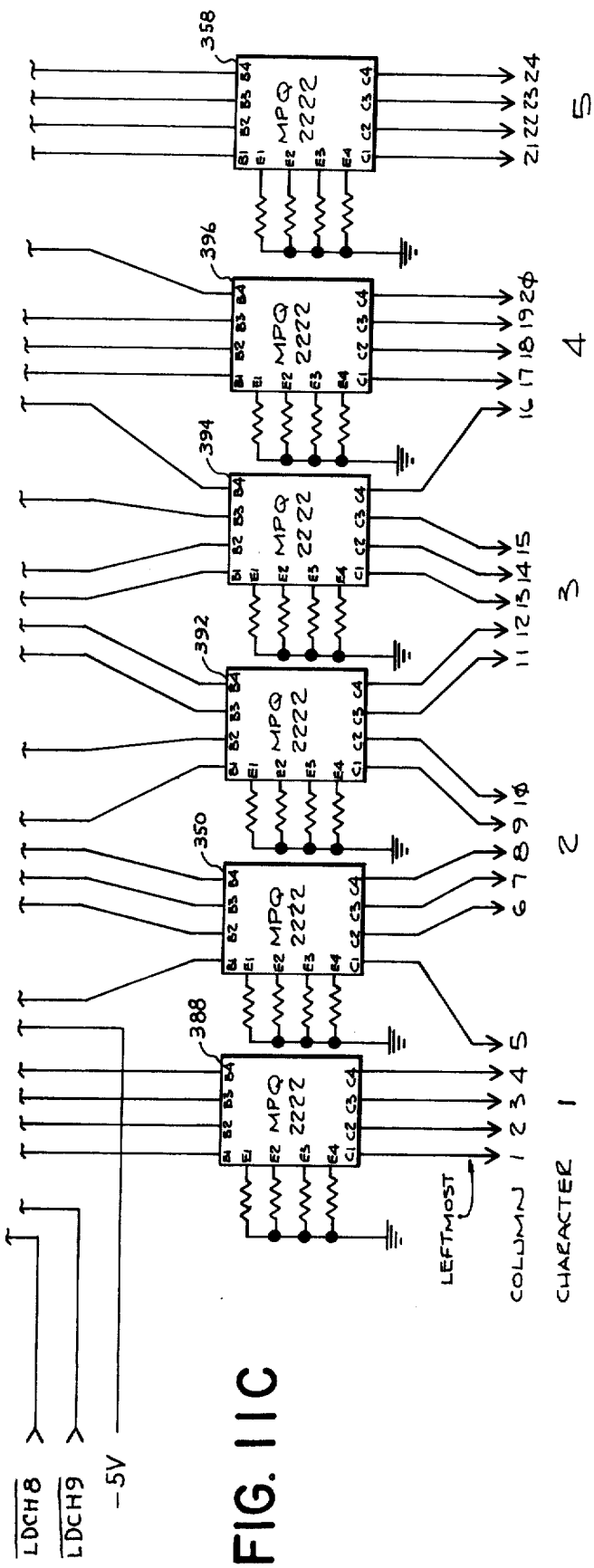

FIG. 15

| FIG. 15A | FIG. 15B | FIG. 15C | FIG. 15D |

FIG. 16

| FIG. 16A | FIG. 16B | FIG. 16C |

FIG. 17

| FIG. 17A | FIG. 17B |
| FIG. 17C | FIG. 17D |

FIG. 18

| FIG. 18A | FIG. 18B |
| FIG. 18C | FIG. 18D |

FIG. 16B
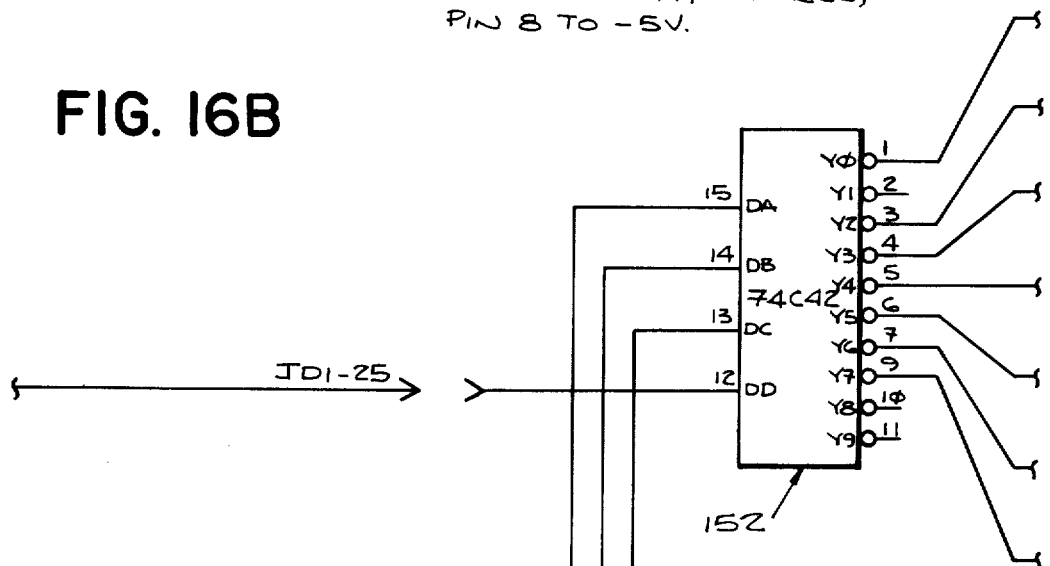
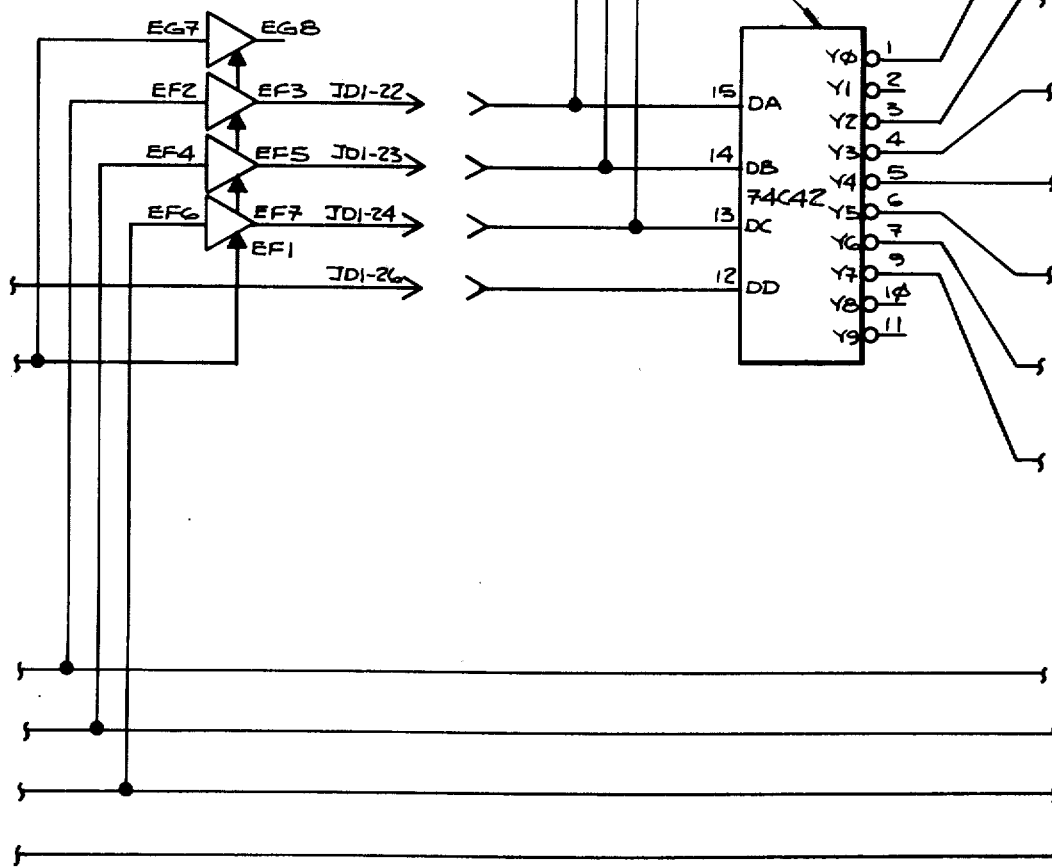

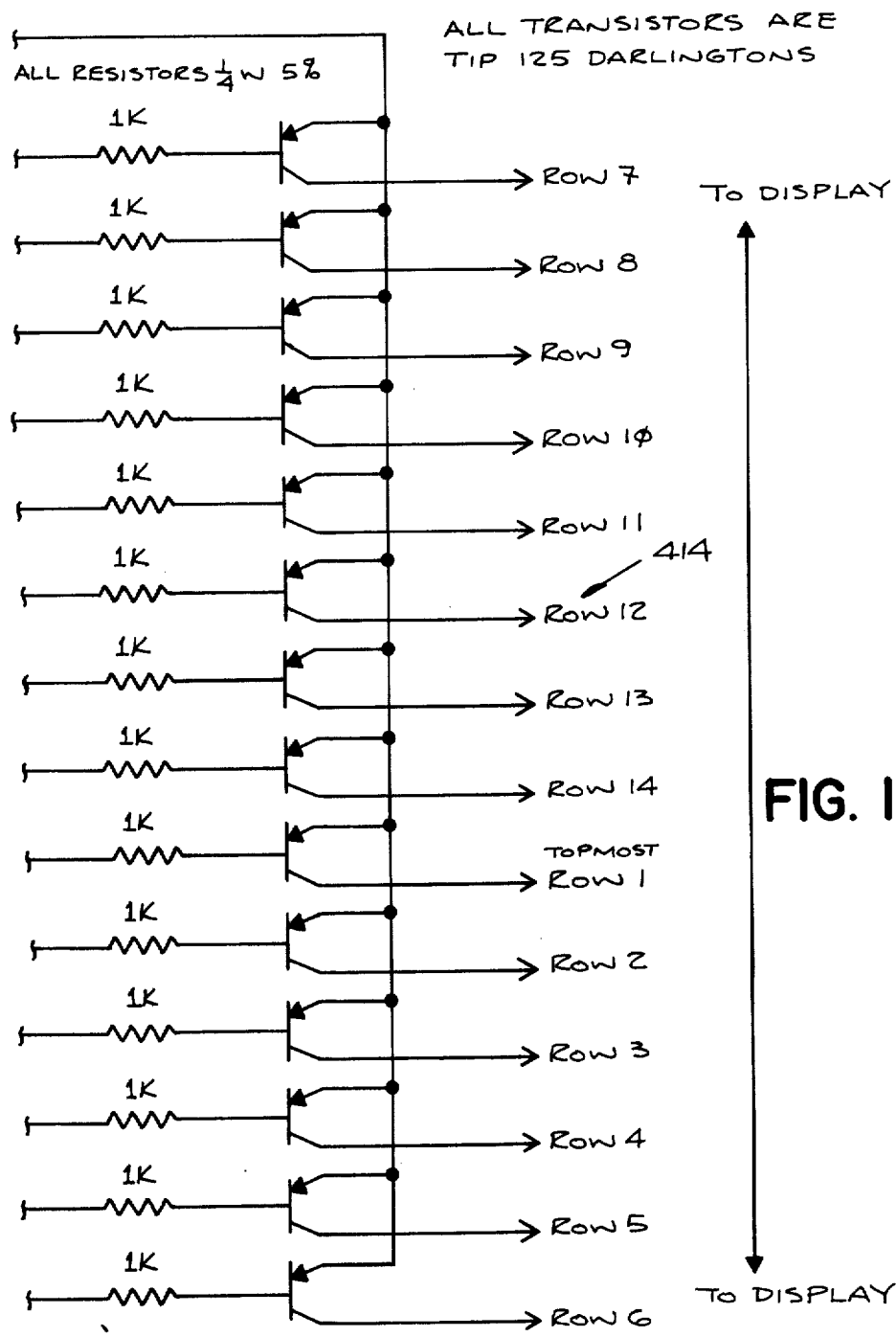
FIG. 16C
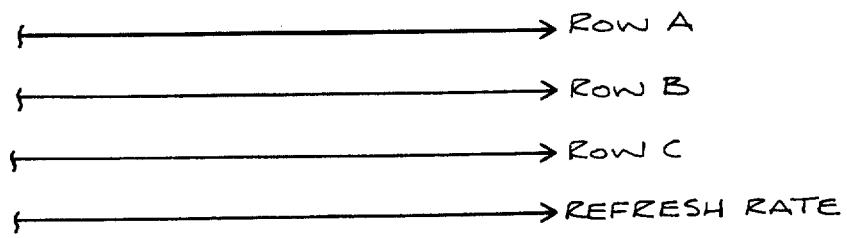

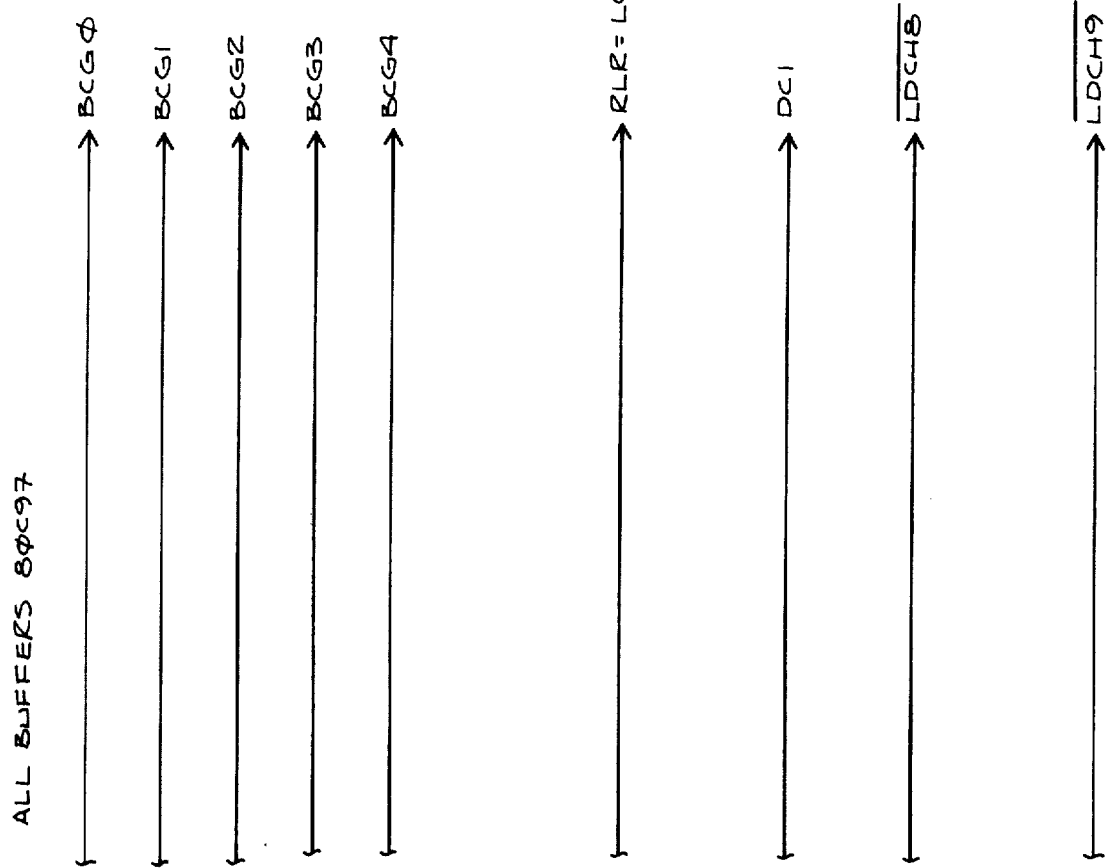

HAND-HELD INTERACTIVE TERMINAL

CROSS-REFERENCE TO RELATED APPLICATION

The present Application is assigned to the same Assignee as U.S. Pat. application Ser. No. 600,575, filed July 31, 1975, a continuation application of U.S. Pat. application, Ser. No. 417,827, filed Nov. 21, 1973, entitled Hand-held Interactive Terminal and now abandoned. The present application hereby incorporates the above continuation application by reference.

BACKGROUND OF THE INVENTION

The present invention relates to interactive terminals, and more particularly to interactive computer terminals which are completely portable or capable of being hand-held and operated.

Most computer terminals known in the art require a fixed position and a specific location. Generally, they are at least as large as a suitcase, and certainly not capable of being portable or hand-held. Such a cumbersome arrangement prevents flexibility in position and requires placement of the computer terminal in a location which is convenient to its operation.

The typical present-day teletype transmits a serial code as each key of the teletypewriter is depressed. This code thus represents a particular ASCII character that may be numeric, alphabetic, punctuation, or control. Similarly, when a code is received, it is immediately printed on paper and represents the particular ASCII character transmitted by the external device. Most present-day teletypewriter operate in a full-duplex mode; that is, only information received is placed on the readout paper, and a record of information transmitted is obtained via an echo system from the interconnected device which transmits the received informationn from the teletype back to the teletype. Some teletypewriter utilize a half-duplex mode wherein transmitted data is also printed on the readout paper as the information is being transmitted.

The present invention performs all the functions of a standard teletypewriter including the generation of a full 128-character ASCII format plus "break." However, since the present invention is hand-held, it may be used in many areas where a standard teletypewriter is impossible to use due to its size and weight. Furthermore, the present invention may intercommunicate with an acoustic coupler which in turn communicates with an external device such as a computer so as to allow an operator to communicate with a computer wherever a telephone is available.

Although other teletypewriter terminals are presently available that allow an operator to view and vary a message before it is transmitted or even allow the operator to perform some actual computation before the information is transmitted to the computer, none of these so-called "smart" or "intelligent" teletype terminals are portable.

It is therefore apparent that the present invention adds a new dimension to computer communication by allowing the operator of the present invention to communicate to computers from practically any location.

The applications of such a hand-held interactive computer terminal are innumerable and include such applications as: allowing a physician at his office to monitor a hospitalized patient's vital signs and acting upon this displayed information to transmit a laboratory order for immediate execution; allowing a salesman to communicate with his home office computer regarding the present inventory of a particular product; and allowing a real estate broker at a prospective customer's office to run through a computer generated list of available commercial properties. It is thus apparent that these are but a few of the types of applications possible with the present hand-held interactive computer terminal.

SUMMARY OF THE INVENTION

The computer terminal of this invention incorporates a 20 character alphanumeric display, a 1000 character memory, and a full 128 character capability on a 20 key keyboard. The entire self-contained silent computer terminal can be held in one hand, while the other hand operates the 20 key keyboard. Each key is capable of transmitting four different characters by selection of a particular character information level while upper or lower case alphanumeric transmission is obtainable through switching means.

In the preferred embodiment, three shift level control keys located on one side of the handheld terminal, and are operated by the hand holding the terminal. Each leg or button is capable of selecting one level of information, while the non-depression of all these buttons results in the selection of a fourth information level. As a result, each of the 20 keys on the keyboard has a capability of transmitting four different characters or other information. Consequently, 80 characters including command codes also known as command characters or command signals can be transmitted simply and easily by the small 20 key keyboard. Furthermore, with the use of one of a set of parameter selectable switches, some of the 80 possible characters or command codes generated by the 20 key keyboard in conjunction with the three shift buttons may be varied to represent a second type of character and command information. More particularly, the transmission of either lower case or upper case alphanumeric information of the 128 character ASCII format is possible with the present invention.

The hand-held silent interactive computer terminal also incorporates a self-contained memory which is capable of storing at least 100 lines of information. Associated with the memory storage is a scroll switch to allow changing the display to present to the operator in sequential order all of the information stored in the memory. As would be obvious to one skilled in the art, the size of the alphanumeric display and the storage capability of the memory can be easily varied, depending upon the size limitations required for providing a conveniently sized hand-held terminal.

The hand-held terminal of this invention is capable of receiving and transmitting data to a computer, or teletypewriter receiver, by simply coupling the hand-held computer terminal of this invention to well-known equipment existing in the art. In one embodiment, the hand-held computer terminal of this invention can be simply plugged into well-known "MODEM" telephone link equipment which is capable of communicating with either a computer or a teletypewriter receiver. In another embodiment of this invention, the hand-held computer terminal can directly communicate with a computer using standard serial data transmission levels. In still a further embodiment of this invention, the hand-held computer terminal can be connected to a battery-operated radio frequency emitter capable of transmitting the signal to a receiver associated with a telephone link, teletype power source, or directly with a computer.

The hand-held computer terminal of the present invention is a functional equivalent to present-day teletypewriter except that the display of information is produced by electronic means instead of by a paper printout.

The present invention allows the operator to transmit and receive the full 128 ASCII characters plus a "break" character which electronically disconnects the invention from an interconnected computer or other device.

In addition, the present hand-held computer terminal incorporates a control/case key on the 20 key keyboard that alters the mode of transmission of the next key depressed so that ASCII control codes and opposite case codes can be transmitted from the keyboard.

Furthermore, the present invention incorporates a 37 lockout" function that prevents the transmission of incorrect character or control code information when more than one of the level shift buttons or front keys are depressed simultaneously.

In addition, the present invention incorporates an audible bell that is sounded when an improper keyboard operation is attempted as well as when a "bell" code is received from the interconnected computer.

In addition, the present invention incorporates a character-repeat feature that allows for the automatic transmission of a chosen character at a high-speed rate following depression of that character for a short predetermined amount of time. This repeat feature is also utilized on the scroll switch so as to automatically sequentially view the information stored in the hand-held computer terminal memory.

Furthermore, the present hand-held coputer terminal incorporates a switch that allows the invention to be used in a LOCAL mode where characters depressed on the keyboard are shown in the display but are not transmitted to any interconnected device. In addition, the display incorporates a cursor that indicates the position where the next character will be shown; wherein this cursor also indicates whether or not any of the 3 level control keep are depressed and also whether the information displayed in an upper or lower case character or that the invention is in a control mode.

In addition, the present invention includes switches that allow the operator to choose one of four communication speeds; odd, even, mark or space parity; half-duplex or full-duplex transmission mode; upper or lower case character mode; and a "justify" option that prevents words of 10 characters or less from being diplayed on more than one line of readout at any particular time.

Furthermore, the present invention incorporates a modulation function that varies the light intensity of display information if data is received when a cursor is not being displayed, so as to indicate to the operator that information is being received in the terminal's memory but not being presently displayed.

As would be obvious to one skilled in the art, the ability to have a hand-held interactive computer terminal completely portable and operable by two hands without any confinement to position and location as well as providing the various features previously discussed, provides an enormous number of possibilities for various important uses of this invention. The flexibility which is now provided by the hand-held terminal of this invention provides limitless potential application for such a convenient and novel step forward in the development of this art.

OBJECTS OF THE INVENTION

It is therefore a principal object of this invention to provide an interactive computer terminal which is completely capable of being operated while being hand-held in an operator's hand.

Another object of this invention is to provide a computer terminal of the above character which is completely silent in operation.

Another object of this invention is to provide a computer terminal of the above character capable of providing all the functions found in much larger present-day display computer terminals.

A further object of this invention is to provide a computer terminal of the above character which incorporates a self-contained alphanumeric display with a capability of reviewing the messages entered or received by the computer terminal.

A still further object of the present invention is to provide a computer terminal of the above character which is capable of receiving, transmitting and displaying upper and lower case alphanumeric information.

Another object of the present invention is to provide a computer terminal of the above character that is able to receive and transmit non-alphanumeric information including ASCII control characters and "break."

Another object of the present invention is to provide a computer terminal of the above character that is able to generate an audible signal upon receipt of a "bell" ASCII control signal.

A further object of the present invention is to provide a computer terminal of the above character that is able to generate an audible signal when an improper keyboard operation is attempted.

An additional object of the present invention is to provide means for the automatic transmission of characters or forward or backward scrolling when the selected switches are continuously depressed for a preselected short period of time.

Another object of the present invention is to provide a computer terminal of the above character that modulates the light intensity of the displayed characters when information is being received by the computer terminal but is not presently being displayed by the terminal.

A still further object of the present invention is to provide a computer terminal of the above character that generates a cursor in the next character location of the display that indicates whether a control code or displayable character code is to be next transmitted as well as indicating the transmission information level of the displayable character or control code.

A further object of the present invention is to provide a computer terminal of the above character that incorporates a keyboard key that is able to alter the mode of transmission of the next key depressed so that ASCII control codes or opposite case alphanumeric characters can be transmitted from the keyboard.

An additional object of the present invention is to provide a computer terminal of the above character that prevents the transmission of any information when more than one transmission information level switch is depressed simultaneously.

A still further object of the present invention is to provide a computer terminal of the above character that provides for the local generation of display information while preventing this information from being transmitted to any interconnected device.

Another object of this invention is to provide a computer terminal of the above character that is able to store 1000 display characters.

An additional object of the present invention is to provide a computer terminal of the above character that provides for the selection of the various communication speeds, various parity modes, half-duplex or full-duplex transmission modes, and upper or lower case alphanumeric transmission as the normal case mode for trnsmission from the keyboard.

A still further object of the present invention is to provide a computer terminal of the above character that prevents the displaying of words consisting of 10 characters or less or more than one display line of the present invention.

Other objects of the invention will in part be obvious and will in part appear hereinafter.

The invention accordingly comprises the features of construction, combinations of element, and arrangement of parts which will be exemplified in the construction hereinafter set forth, and the scope of the invention will be indicated in the claims.

THE DRAWINGS

FIG. 1A is a perspective view of the interactive hand-held computer terminal of this invention showing upper case alphanumeric information;

Figure 9B:
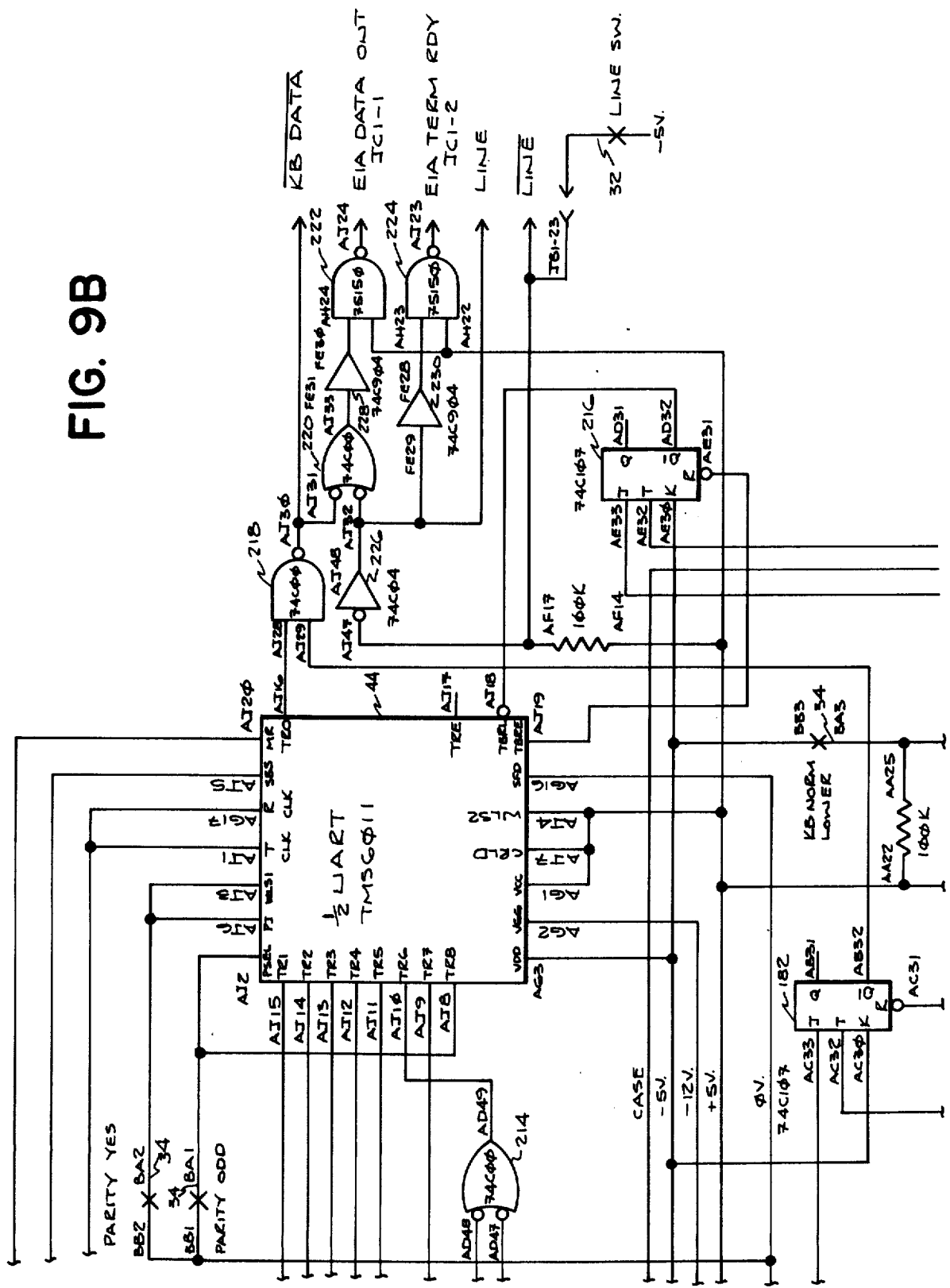
FIGS. 9 through 18 are schematic diagrams showing one embodiment of the construction and arrangement of the electronics of the hand-held computer terminal of FIG. 1.
Figure 9D:
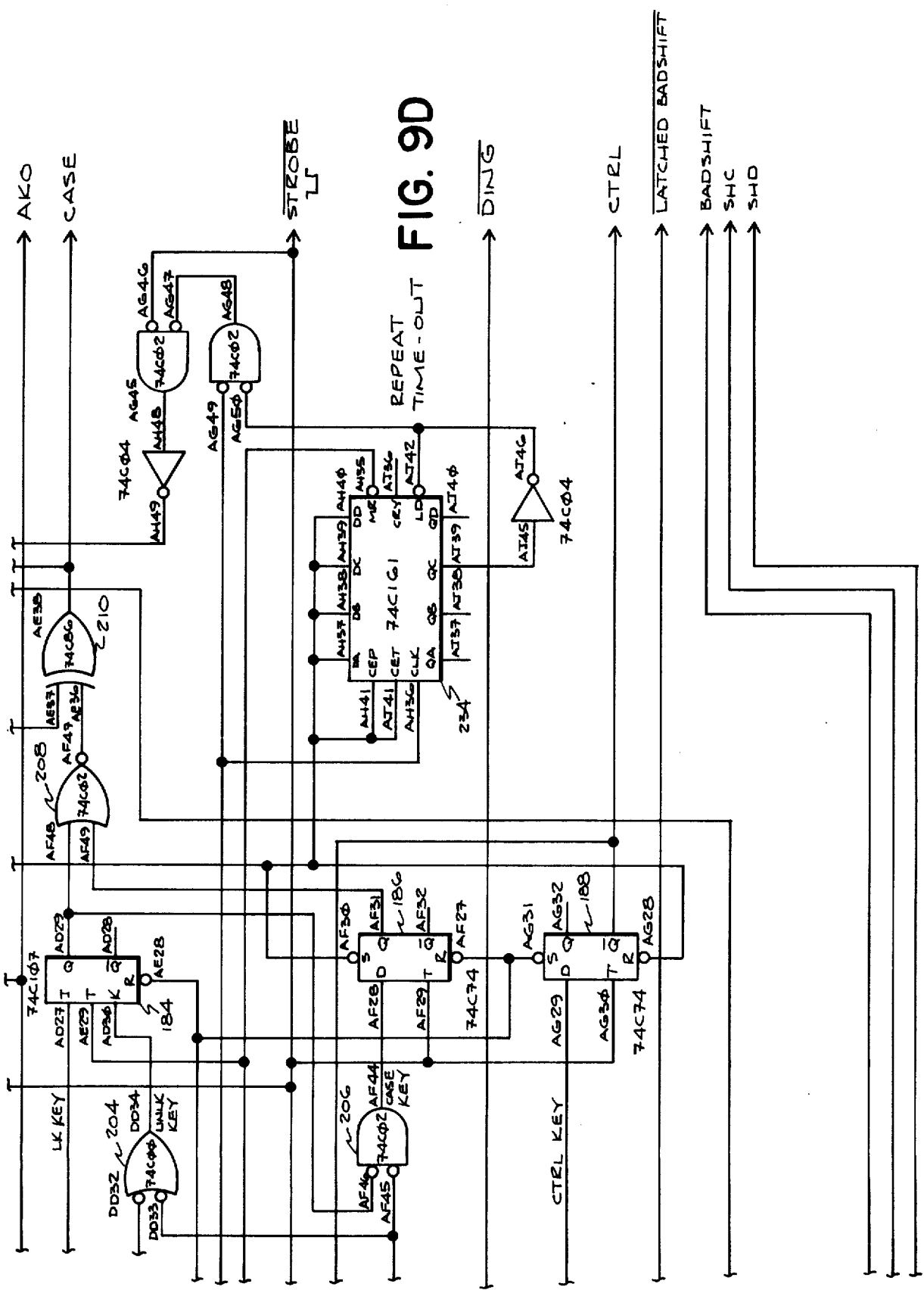
Figure 10A:
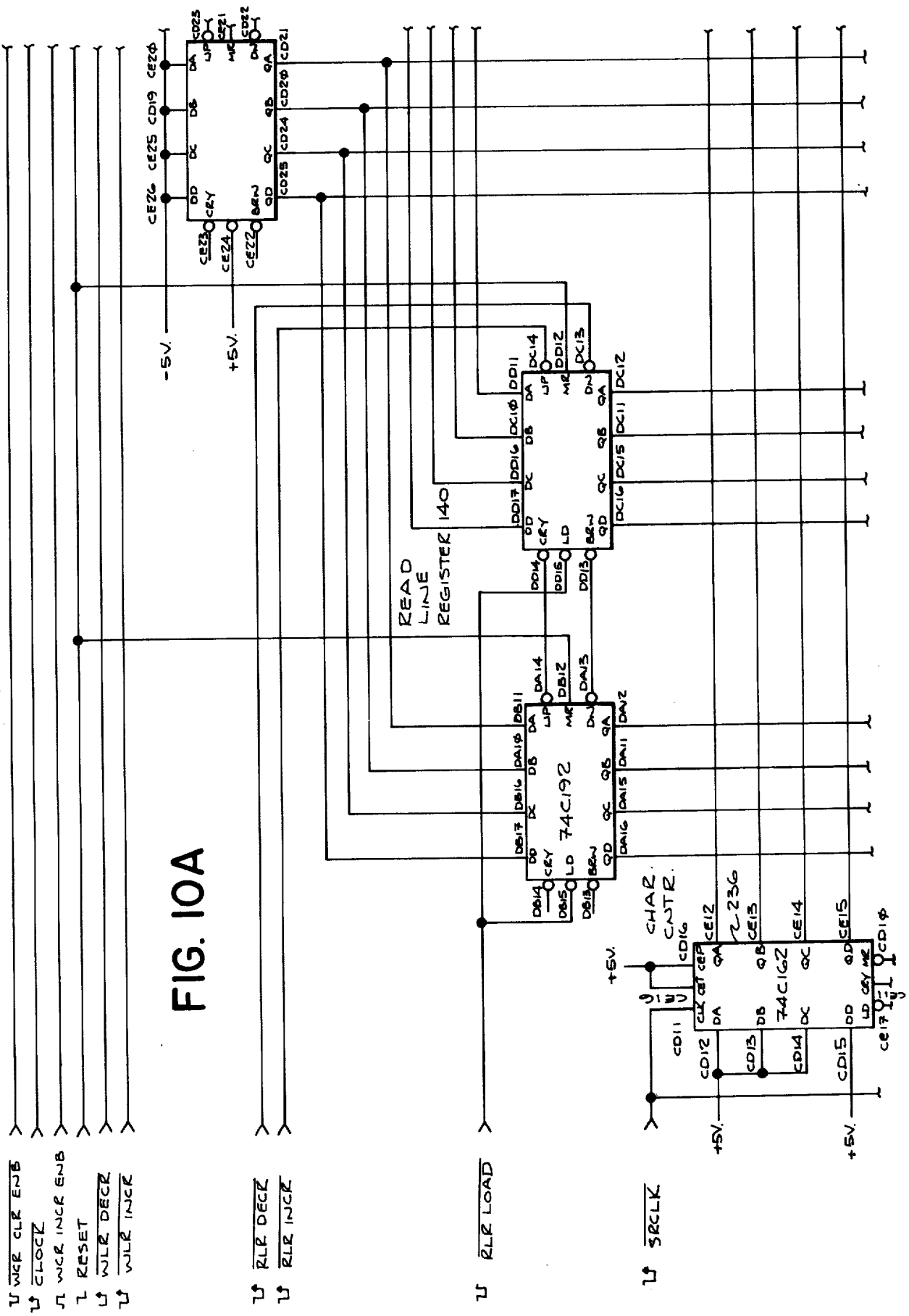
Figure 10B:
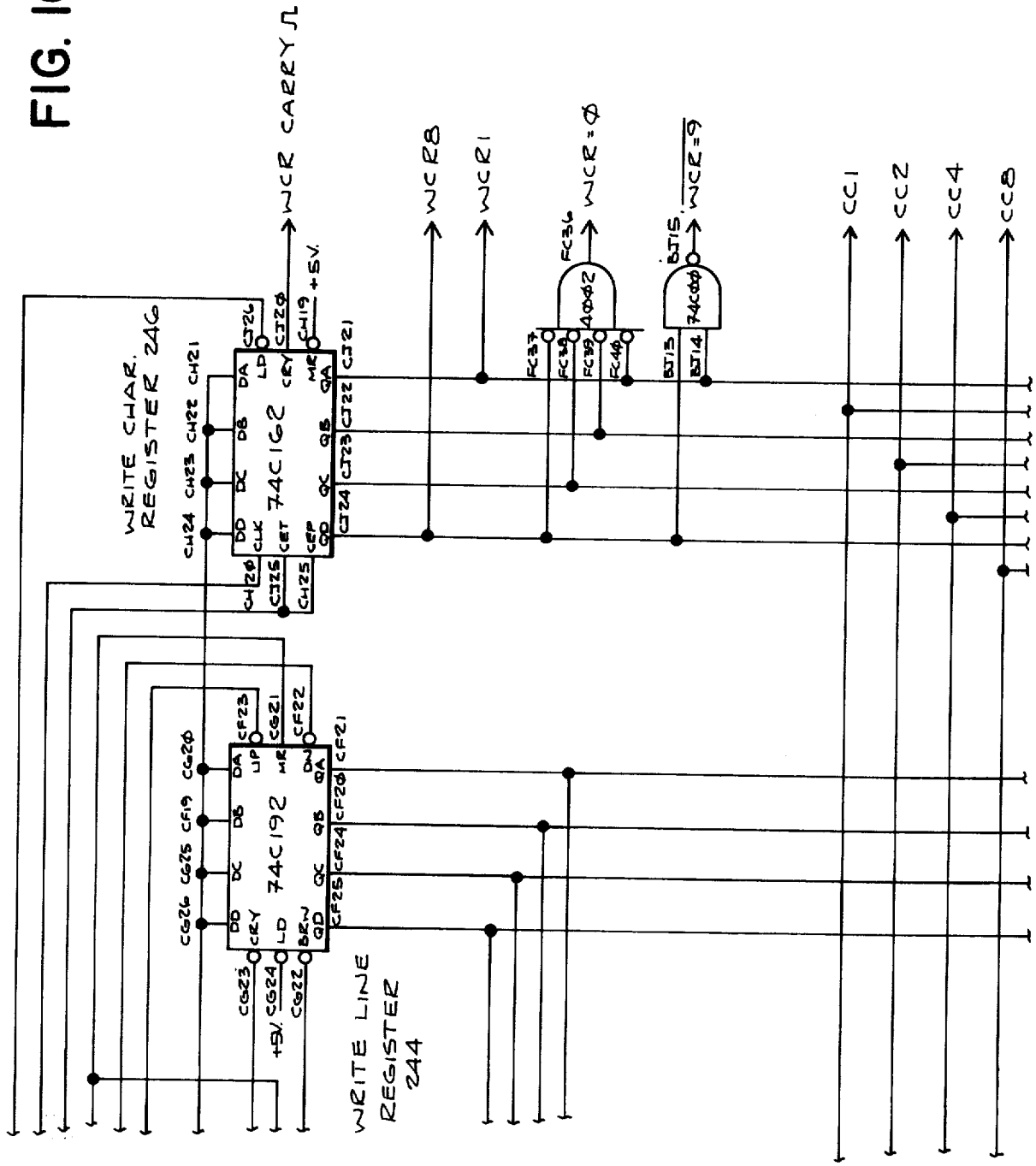
Figure 10D:
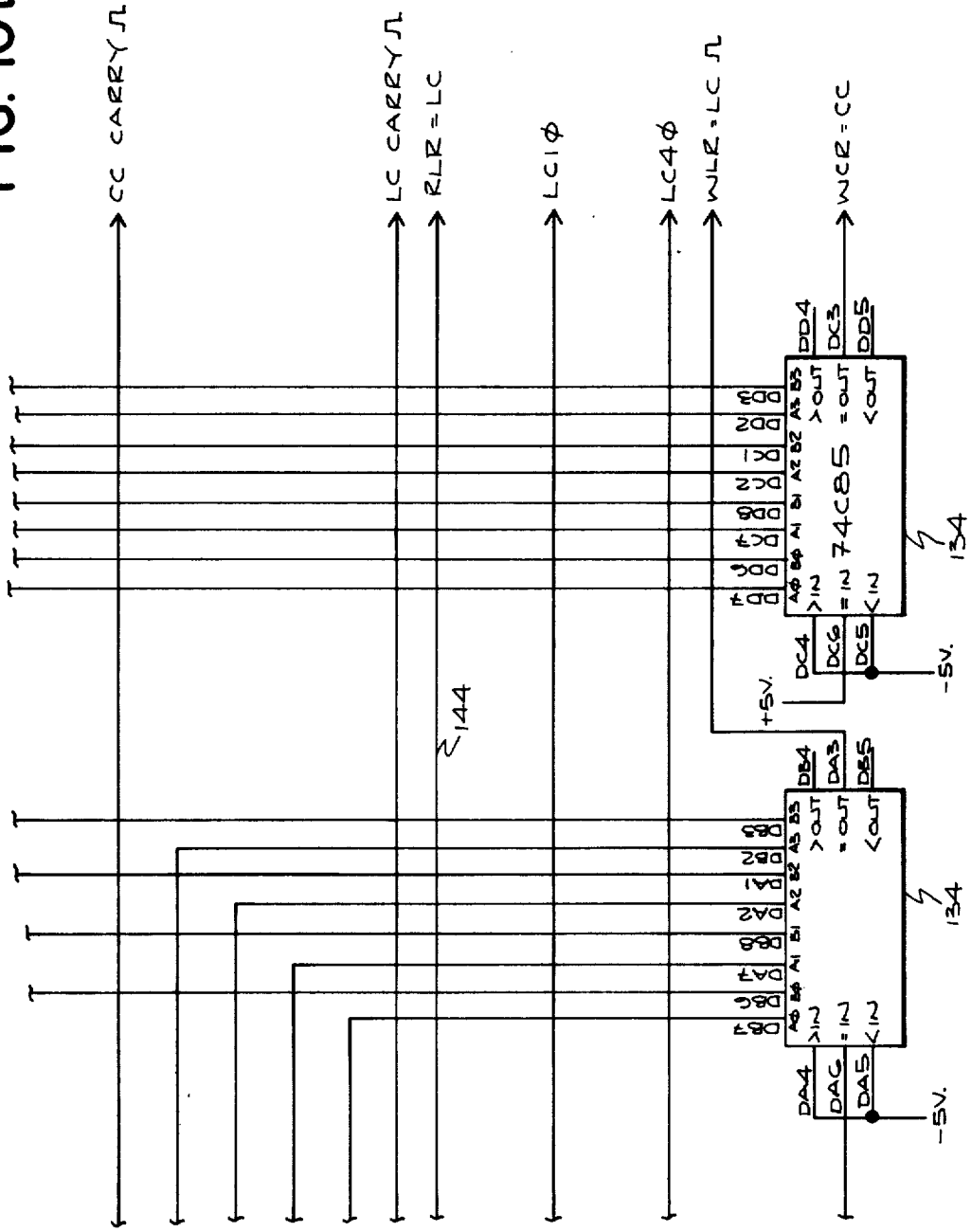
Figure 11B:
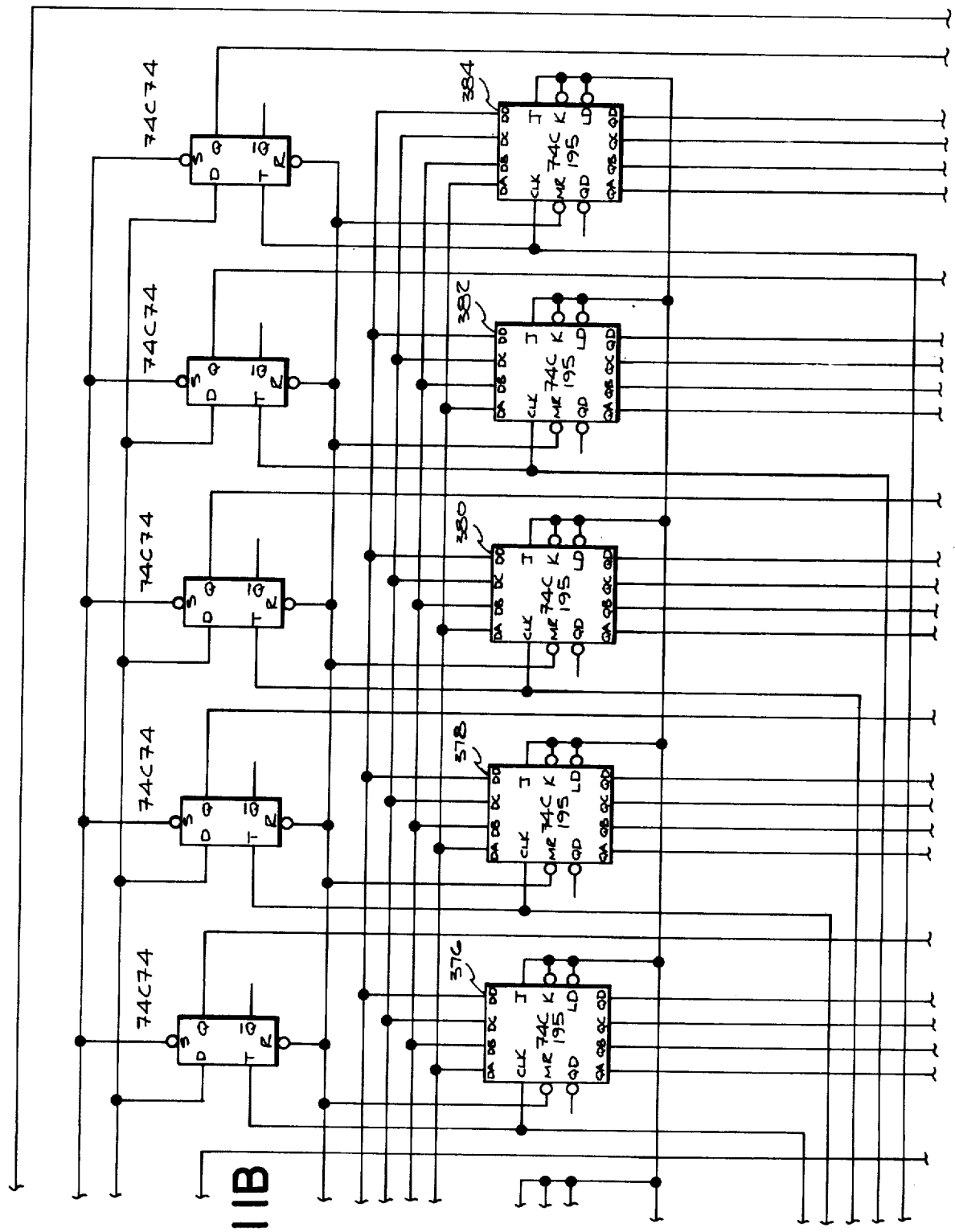
Figure 11D:
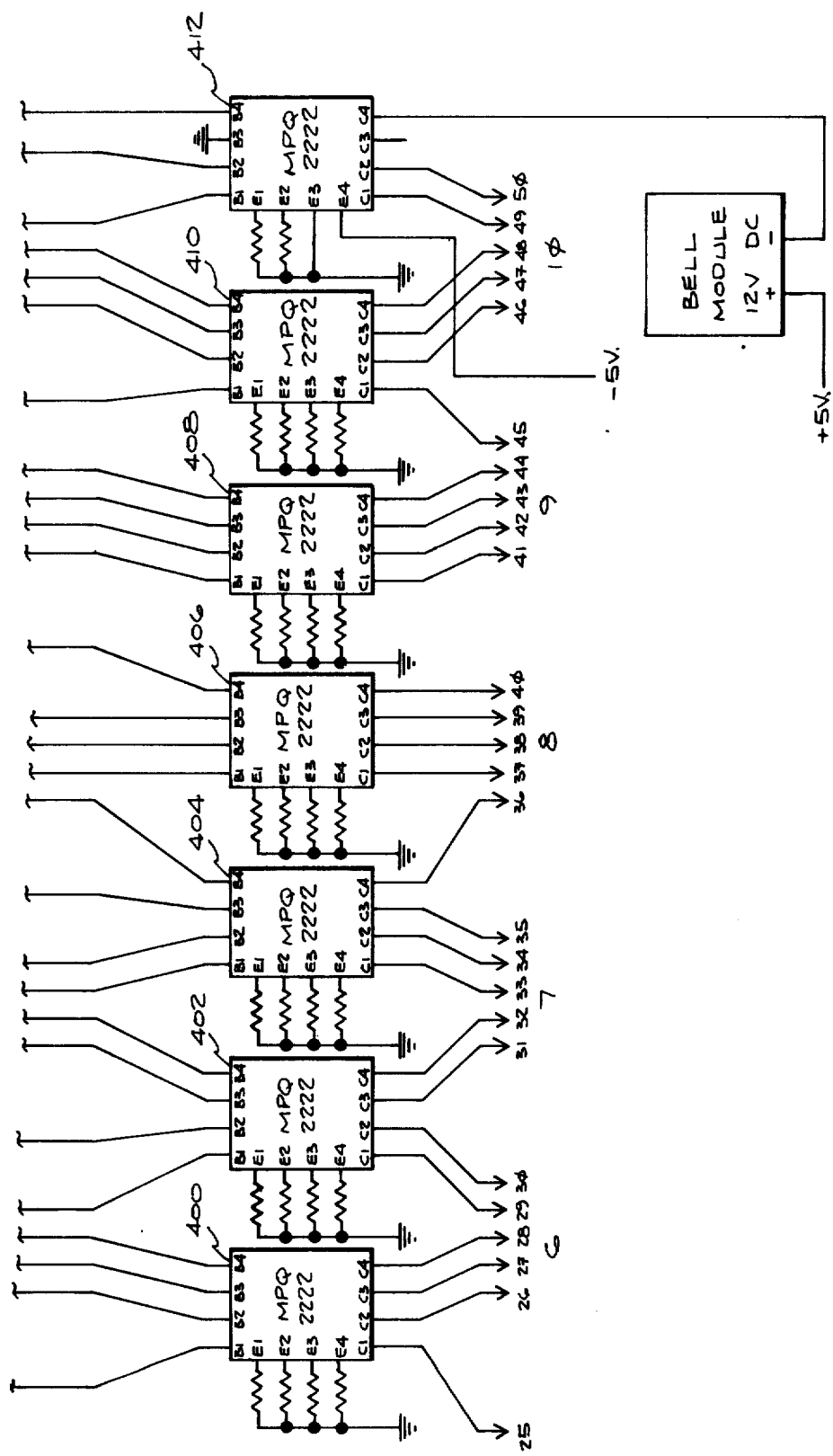
Figure 15A:
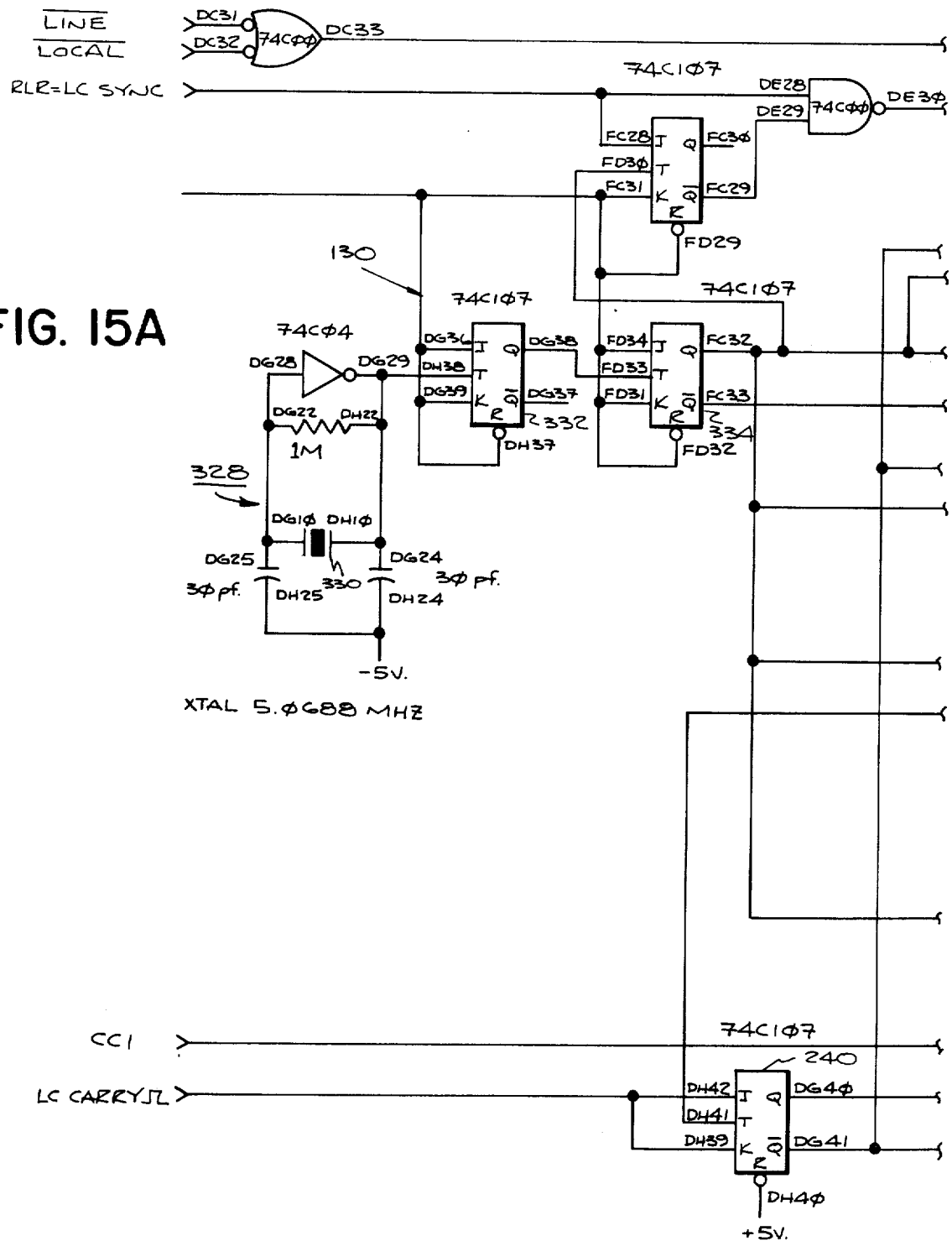
Figure 15B:
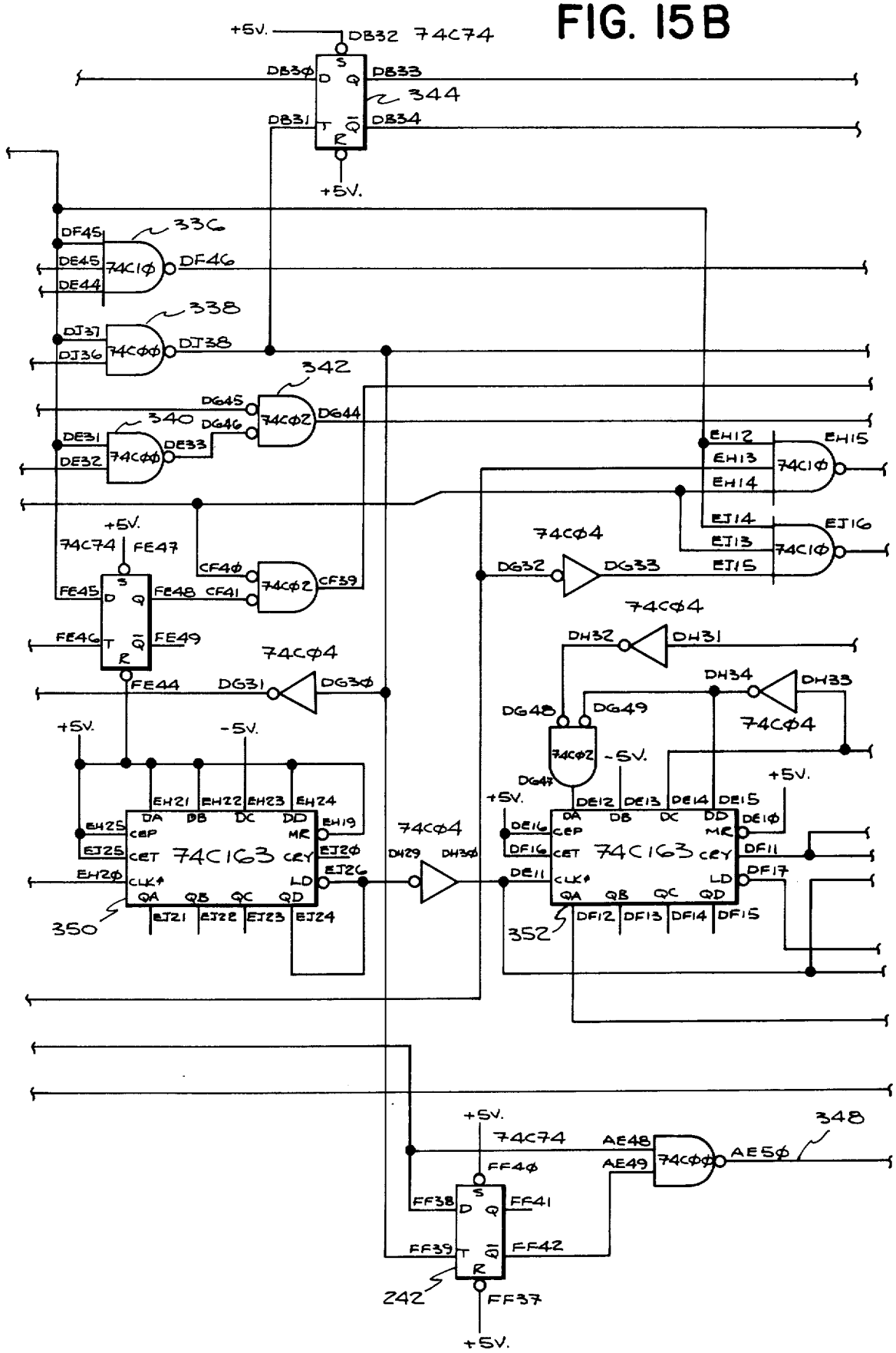
Figure 15C:
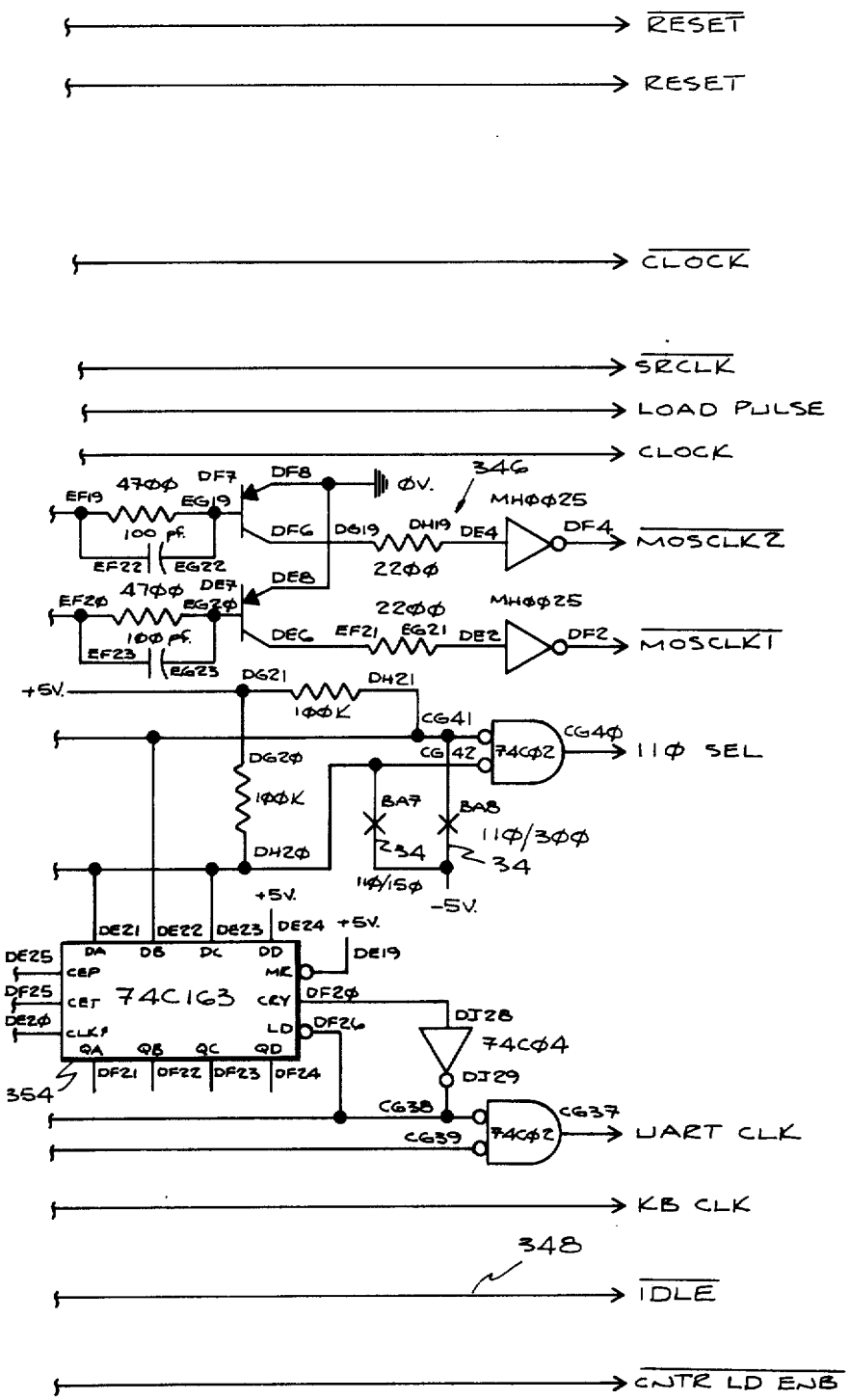
Figure 15D:
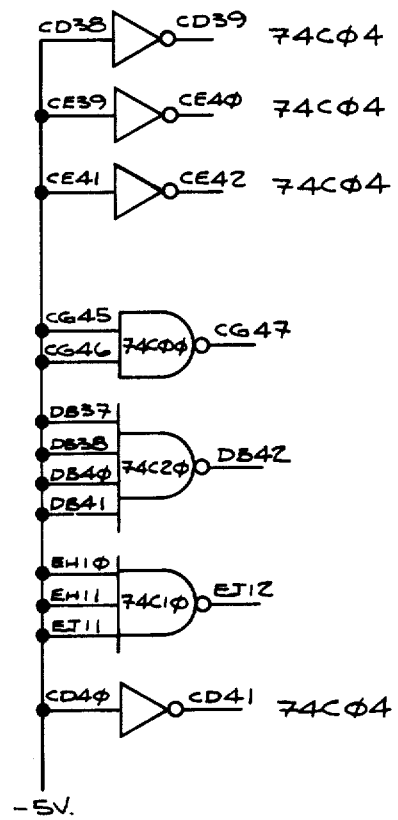
Figure 16A:
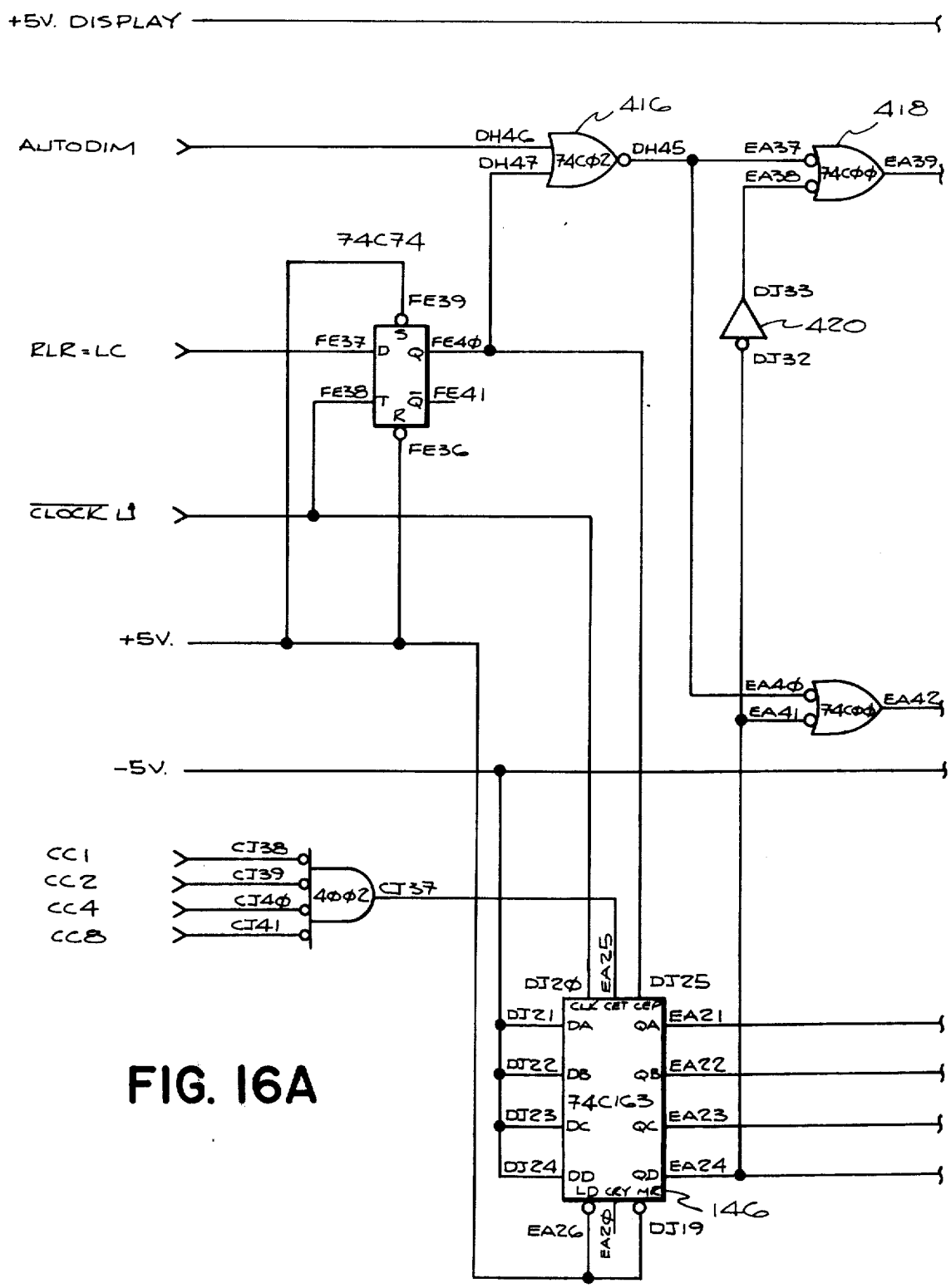
Figure 18A:
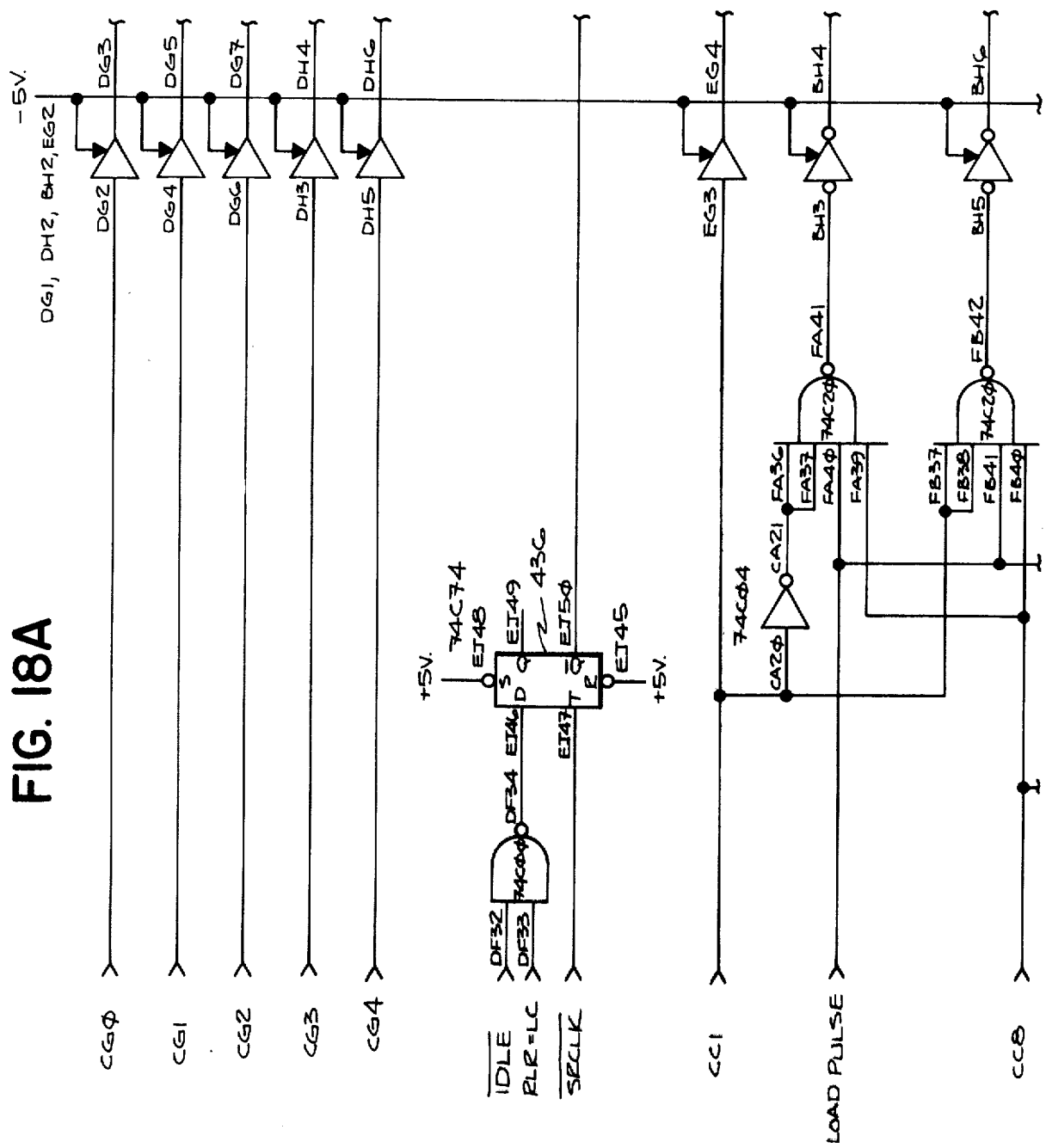
Figure 18C:
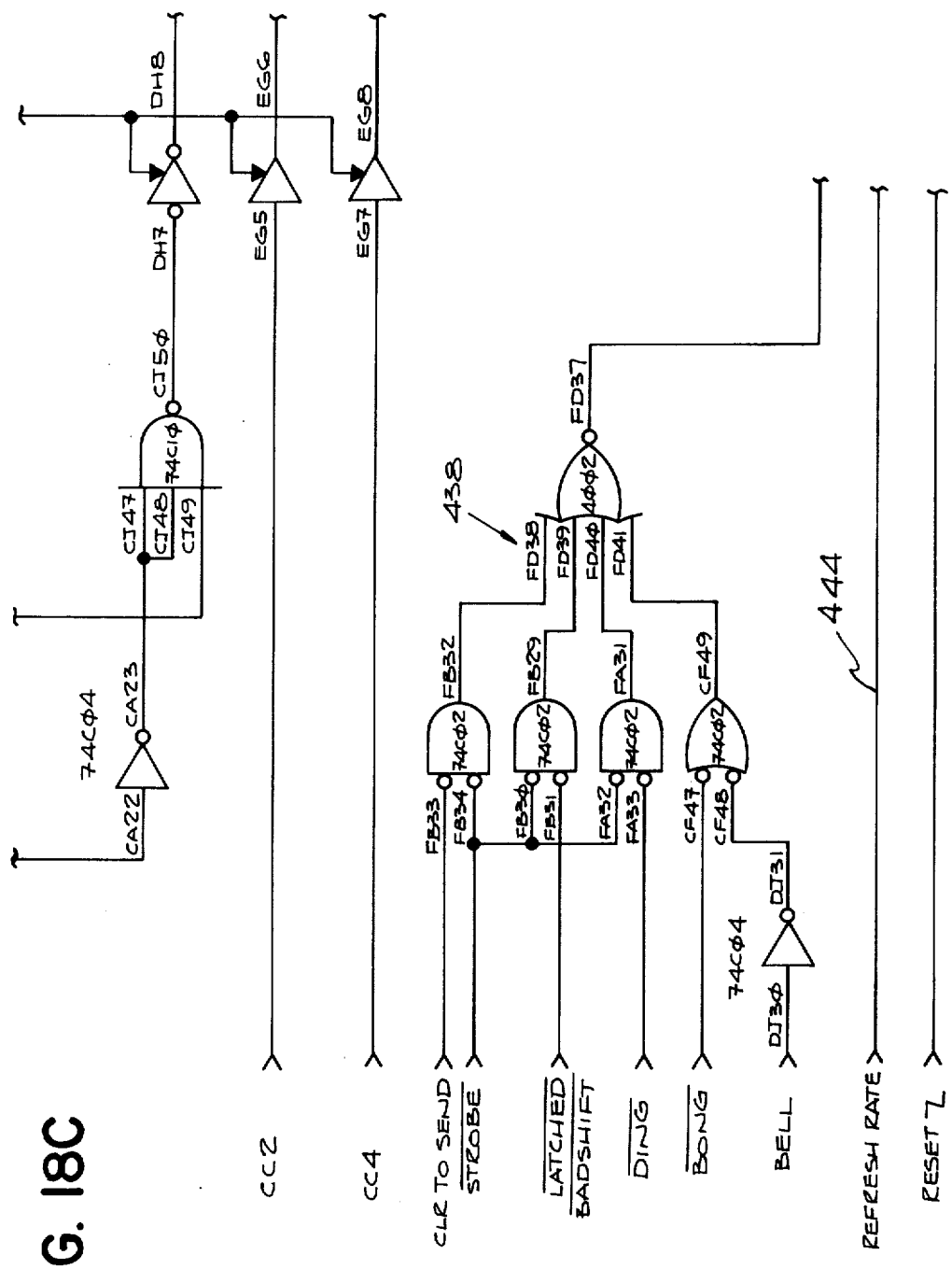
Figure 18D:
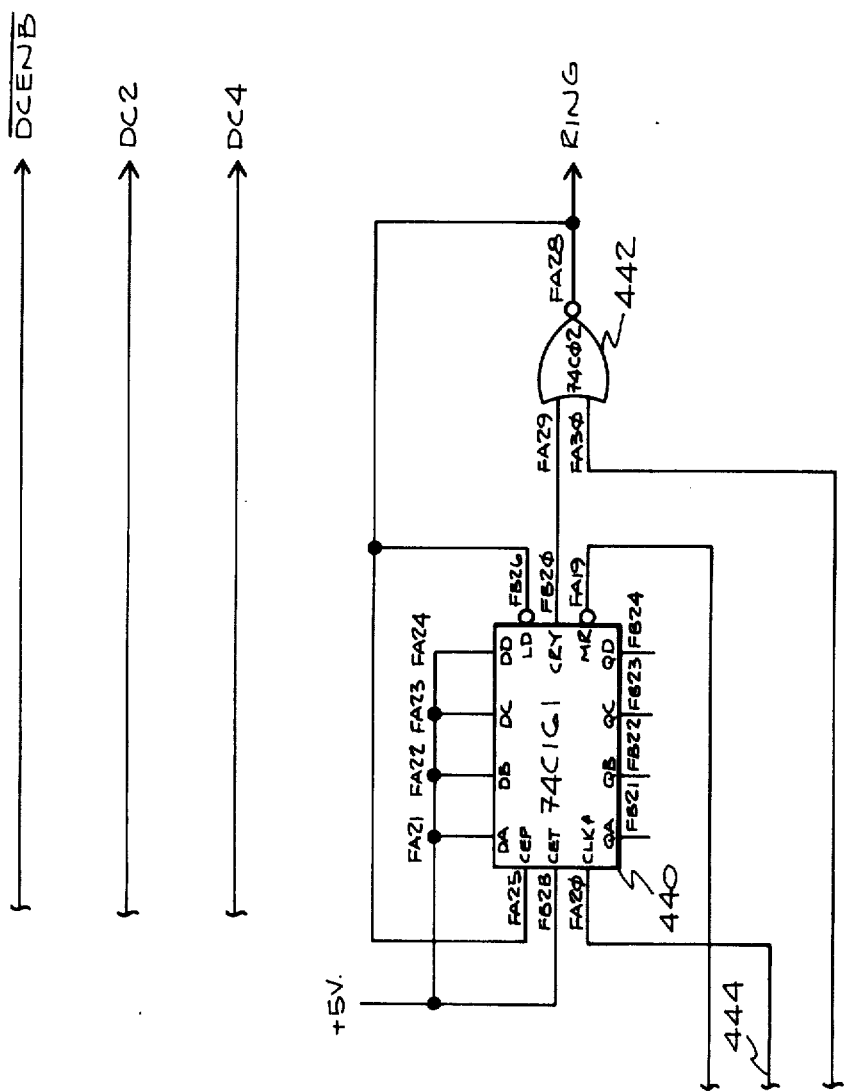

FIGS. 9A, 9B, 9C, and 9D are detailed schematic diagrams of the keyboard and transmitter circuitry of the hand-held computer terminal of FIG. 1;

FIG. 9 is a diagram showing how FIGS. 9A, 9B, 9C, and 9D are put together to form FIG. 9;

FIGS. 10A, 10B, 10C, and 10D are detailed schematic diagrams of the read line register, write line register, and read line comparator of the hand-held computer terminal of FIG. 1;

FIG. 10 is a diagram showing how FIGS. 10A, 10B, 10C, an 10D are put together to form FIG. 10;

FIGS. 11A, 11B, 11C, and 11D are detailed schematic diagrams of the electronic circuitry receiving signals from the character generators of the hand-held computer terminal of FIG. 1 transferring the signals to ten 5-bit registers;

FIG. 11 is a diagram showing show FIGS. 11A, 11B, 11C, and 11D are put together to form FIG. 11;

FIGURES 12A, 12B, 12C, and 12D are detailed schematic diagrams of the electronic circuitry of the hand-held computer terminal of FIGURE 1, utilized in processing information received from external communication lines as well as the decoding of this information;

FIGURE 12 is a diagram showing how FIGURES 12A, 12B, 12C and 12D are put together to from FIGURE 12;

FIGURES 13A, 13B, 13C, and 13D are detailed schematic diagrams of the memory portion of the hand-held computer terminal of FIGURE 1;

FIG. 13 is a diagram showing how FIGS. 13A, 13B, 13C, and 13D are put together to form FIG. 13;

FIGS. 14A, 14B, 14C, and 14D are detailed schematic diagrams of the control logic of the hand-held computer terminal of FIG. 1;

FIG. 14 is a diagram showing how FIGS. 14A, 14B, 14C, and 14D are put together to form FIG. 14;

FIGS. 15A, 15B, 15C, and 15D are detailed schematic diagrams of the clock generators for the logic and memory portions of the hand-held computer terminal of FIG. 1;

FIG. 15 is a diagram showing how FIGS. 15A, 15B, 15C, ad 15D are put together to form FIG. 15;

FIGS. 16A, 16B, and 16C are detailed schematic diagrams of the row counters and the display output circuitry of the hand-held computer terminal of FIG. 1;

FIG. 16 is a diagram showing how FIGS. 16A, 16B, and 16C are put together to form FIG. 16;

FIGS. 17A, 17B, 17C, and 17D are detailed schematic diagrams of the automatic dim feature and the scroll circuitry of the hand-held computer terminal of FIG. 1;

FIG. 17 is a diagram showing how FIGS. 17A, 17B, 17C, and 17D are put together to form FIG. 17;

FIGS. 18A, 18B, 18C, and 18D are detailed schematic diagrams of row synchronization circuitry as well as bell generation logic circuitry of the hand-held computer terminal of FIG. 1; and FIG. 18 is a diagram showing how FIGS. 18A, 18B, 18C, and 18D are put together to form FIG. 18.

DETAILED DESCRIPTION

BASIC OPERATION

As best seen in FIG. 1A, the hand-held interactive terminal 20 of this invention is shown being held in the operator's hand ready for operation. As best seen in FIGS. 1, 3, and 4 terminal 20 comprises a 20 character alphanumeric display 22, a top mounted information entry keyboard 24, side-mounted shift level control keys 26, 27 and 28, all positioned adjacent to each other on one side of terminal 20, side-mounted scroll switch 30 positioned on the side opposite the three adjacent keys 26, 27 and 28, a top side-mounted line-/off/local switch 32 and a back mounted array of switches 34 that control the state of several selectable parameters as will be discussed more fully further in this specification.

Keys 26, 27, 28 and 30 are all conveniently positioned for ease of operation by the operator. Scroll switch 30 is positioned for easy operation by the left-hand thumb of the operator, while keys 26, 27 and 28 are positioned for easy operation by the left-hand index, middle and ring fingers of the operator. It is also readily apparent that terminal 20 may be constructed in a mirror image so as to enable a person's right hand to operate keys 26, 27 and 28 as well as scroll switch 30.

In the embodiment shown in FIGS. 1, 3 and 4, alphanumeric display 22 comprises two lines, 23 and 25, with each line having a 10 character display capability. As is clearly obvious to one skilled in the art, this is merely one of an infinite number of display possibilities that can be employed in the terminal of this invention. The only limitation on the lines and number of characters in each line which could be employed is dependent only on the size of each character desired in order to assure easy readability as well as size limitations of the terminal itself. In the present invention, each character comprises a 35-dot (5×7) light-emitting diode (LED) matrix. It has been found that by employing the 35-dot matrix, a highly readable display is achieved which is capable of clearly displaying every one of the printable characters in the ASCII code.

Figure 1B:
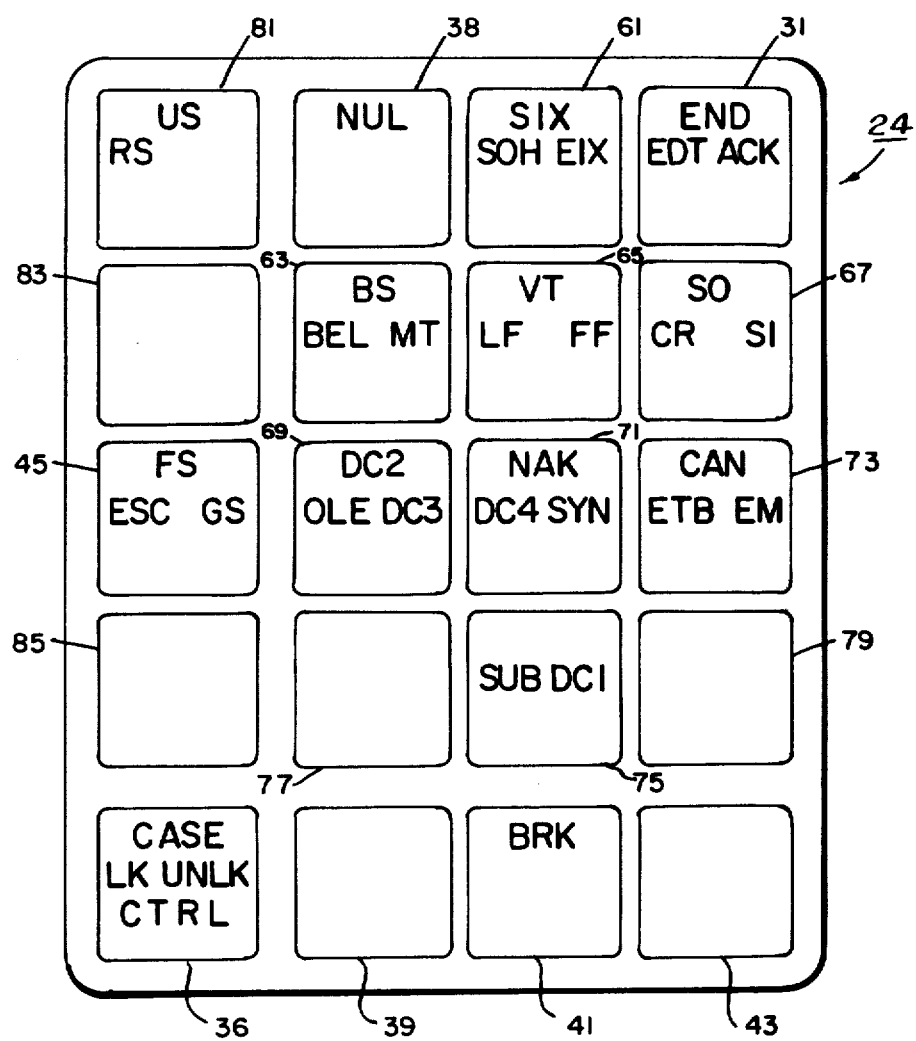
FIG. 1B is a front view of the keyboard used by the hand-held terminal of FIG. 1A showing control codes in various key locations.

As best seen in FIG. 1A, information entry keyboard 24 comprises 20 keys, each key representing four different information levels that is, each key of keyboard 24 will cause the transmission of one of four different ASCII characters or control codes represented by that key depending upon the information level selected at the time of depression of the key. Lowermost indicia on the keys of keyboard 24 are in the first information level, indicia in the upper left-hand corner of each key is in the second information level, indicia in the upper middle portion of each key is in the third information level, and indicia in the upper right-hand portion of each key is in the fourth information level. The actual character or control code generated by depression of one of the keys of keyboard 24 is alterable so as to represent characters or control codes other than those shown in FIG. 1A, such as the characters and control codes illustrated in FIGS. 1B and 1C, depending upon the state of an upper/lower case switch of the array of eight switches 34 (see FIG. 4C) as well as the state of keyboard key 36 prior to depression of any of the remaining keyboard keys.

Figures 4A, 4B:
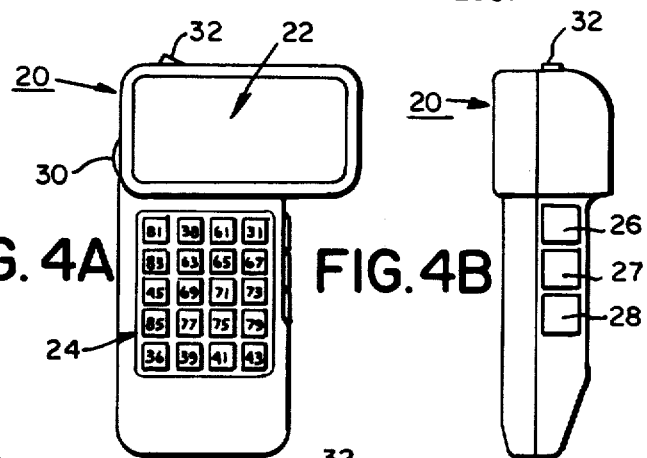
FIG. 4A is a front view of the hand-held terminal of FIG. 1.
FIG. 4B is a right side elevational view of the hand-held terminal of FIG. 1.
Figures 4C, 4D:
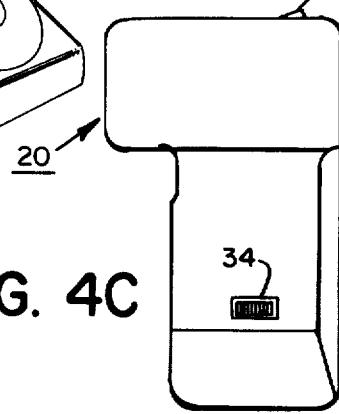
FIG. 4C is a back view of the hand-held terminal of FIG. 1.
FIG. 4D is a left side elevational view of the hand-held terminal of FIG. 1.

As best seen in FIG. 4C, one switch of the array of eight switches 34 is an upper/lower case switch which correspondingly causes the letters shown on keyboard keys 24 to generate lower or upper case alphabetic information when the terminal is in its normal case mode. Thus, by incorporating the four levels on each of the 20 keys of the keyboard 24 as well as the use of the upper and lower case switch of switch array 34, all characters in the ASCII code as well as the control codes shown by the indicia on keyboard keys 39, 41 and 43 in FIGS. 1A and 1C may be generated by the present invention.

The operator may quickly and easily select any desired information level by employing side-mounted keys 26, 27 and 28.

Thus, non-depression of keys 26, 27 and 28 causes the first information level to be selected, depression of shift level control key 26 causes the second information level to be selected, depression of key 27 causes the third information level to be selected and depression of key 28 causes the fourth information level to be selected. Furthermore, it is possible that up to N information levels can be selected by using N-1 shift level control keys to individually represent the N information levels, each shift level control key corresponding to one information level and the non-depression of all shift level control keys representing the Nth information level.

Furthermore, N information levels can also be represented by $log_2N$ shift level control keys if N is equal to an integer power of 2. Thus, combinations of depressions of the shift level control keys can be interpreted as representing distinct information levels. The number of keys necessary for generating the N information levels is dependent upon the number of permutations possible with the shift level control keys. For two-position shift level control keys, this number is equal to $log_2N$ if the number N is equal to an integer power of 2 and is equal to 1 plus the truncated value of $log_2N$ if N is not equal to an integer value of 2. Thus, if four information levels are desired, N is equal to 4, and $log_24$ is equal to 2. Thus, two shift level control keys can select any of the four information levels. That is, the non-depression of both keys represents a first information level, depression of the first shift key without depression of the second shift key represents a second information level, depression of the second key without depression of th first shift key represents a third information level, and depression of both keys at the same time represents a fourth information level.

If five information levels are desired, N is equal to 5 which is not equal to an integer value of 2, and therefore, the minimum number of shift level control keys is equal to 1 plus the truncated value of $log_25$ or 1 plus 2 which equals 3. It is similarly found that at least three shift level control keys are necessary for selecting six, seven and eight distinct information levels. If one desires nine information levels, at least four shift level control keys are necessary, and because up to four shift level control keys can generate sixteen permutations for two-position switches, the four shift level control keys can also represent up to sixteen separately selectable information levels.

As will be discussed more fully below, any of the displayable characters or controls positioned in the lower or first information level of a key may be transmitted by merely pressing that particular key while not pressing any of the side-mounted keys. As a result, if the operator wished to enter the number 3, key 31 bearing the number 3 in the lower portion thereof would merely be depressed.

Key 31 can also cause letters D, E, and F to be transmitted. In order to enter the first letter in this series on key 31 (second information level), namely the letter D, side-mounted button 26 is first depressed and held, and then key 31 is depressed. In order to enter the second character in this series (third information level), in this example the letter E, button 27 is first depressed and held and then key 31 is depressed. Similarly, when the last character in the series (fourth information level), in this situation the letter F, is to be transmitted, side-mounted button 28 is depressed and held and then key 31 is depressed and held. Thus, the particular unit of information transmitted, be it an ASCII characters or control code, is generated by the hand-held computer terminal corresponding to the keyboard key depressed and the particular information level selected during the depression of the keyboard key. This information level may be simultaneously selected with the depression of the keyboard key, or may be first selected and held while the keyboard key is depressed. It should be noted that it would be apparent to one skilled in the art to have side-mounted shift keys 26, 27 and 28 operate in a latched manner allowing the information level selected to be operable on the next keyboard key depressed regardless of when it is depressed. That is, it would not be necessary to keep a shift key depressed while depressing a keyboard key.

As is best seen in FIGS. 1A and 1B, keyboard 24 includes mode-select key 36 which when depressed while the first information level is selected causes the next keyboard depressed to generate a control code. The indicia on key 36 for the first information level is consequently denoted "CTRL" which is the abbreviated form of control. As is best seen in FIG. 1B several of the remaining keys of keyboard 24 generate various ASCII control codes when depressed. It should be noted that all these control codes are in the second, third or fourth information level of the terminal and therefore side-mounted buttons 26, 27 or 28 must be first depressed after key 36 is depressed before a valid control code may be transmitted by terminal 20. Thus if a NULL ASCII control code is desired to be transmitted by terminal 20, control key 36 is first depressed followed by depression of side-mounted key 27 (representing the third information level), and subsequently depressing key 38 while side-mounted key 27 is depressed.

It should also be noted that several other nonalphanumeric codes may be generated by the present invention without first depressing control key 36. Thus a LINE FEED code is generated by depressing key 39 and a SPACE code and a CARRIAGE RETURN code are generated by depressing keys 41 and 43 respectively. Keys 39, 41 and 43 also may generate other nonalphanumeric characters for transmission by first depressing side keys 26, 27 or 28.

Figure 1C:
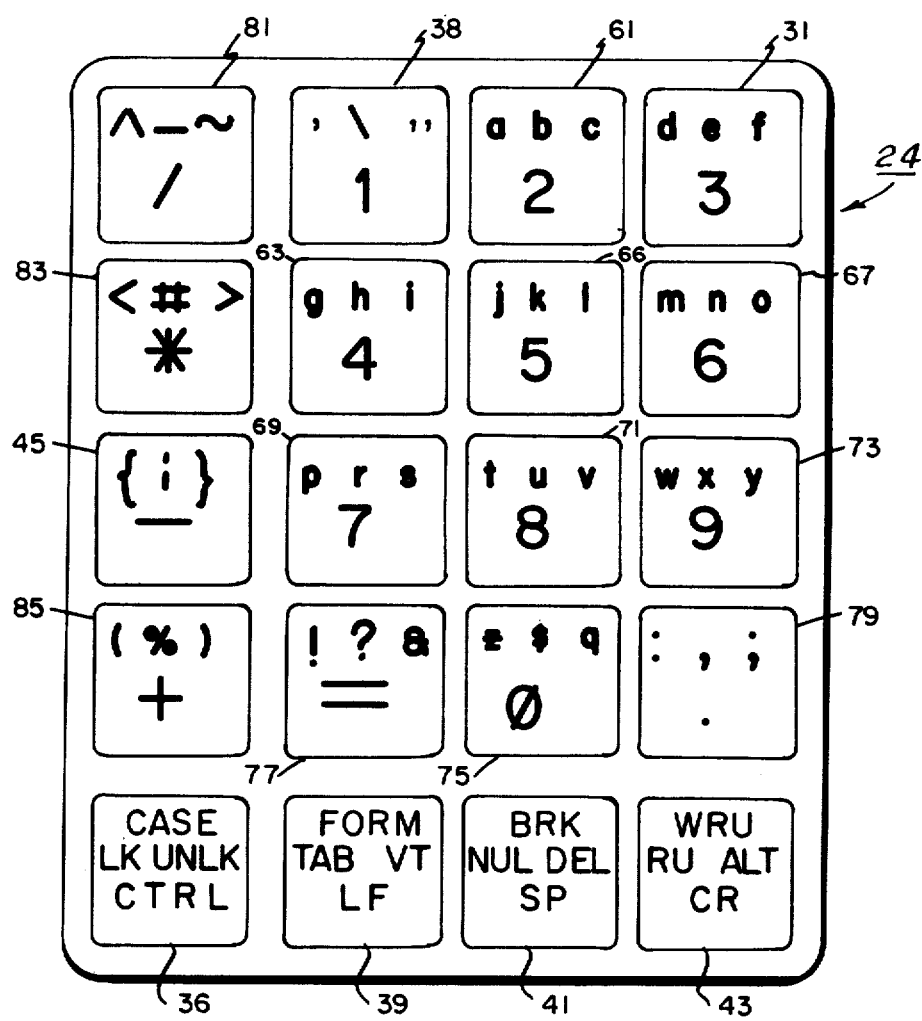
FIG. 1C is a front view of the keyboard of the hand-held terminal of the invention showing the lower case alphanumeric information on the keys.

As best seen in FIG. 1C, it is readily apparent that the lower case keyboard of the present invention generates substantially the same alphanumeric characters as generated in the upper case keyboard except that the aliphabetic characters are in the lower case. It should be noted however that the braces and vertical slash generated by depressing key 45 in conjunction with side keys 26 27, and 28 for the lower case keyboard are different than the brackets and back slash respectively generated by the upper case key 45. The reason for this difference as well as the accent grave and the and character generated by key 38 and the simultaneous depression of side key 27, is that the lower case ASCII code utilizes somewhat different puncuation marks then the upper case ASCII code.

The control codes shown in FIG. 1B are the control codes generated by the ASCII code. These codes as well as the lower case keyboard information are all capable of being generated by the keyboard shown in FIG. 1A provided that the proper keys and switches are depressed.

The control codes illustrated in FIG. 1B, as will be discussed more fully infra, are selectable by first depressing control key 36 while shift level control keys 26, 27 and 28 remain undepressed and following depression of control key 36 with depression of the remaining keyboard keys and the simultaneous or prior selection of the information level at which the particular control code for the keyboard key is located. Thus, if the "nul" control code is desired to be generated, first control key 36 is depressed and released followed by depression and holding of shift level control key 27 while keyboard key 38 is depressed.

As is typical with present-day teletypewriter, the present hand-held computer terminal may transmit its information to an interconnected device in both a fullduplex mode and half-duplex mode. These modes, as is well known in the state of the art, designate the type of transmission and display that is produced by the handheld terminal. More particularly, when a full-duplex terminal is utilized, all information generated by depressing the various keys of the present invention are automatically transmitted to the interconnected device via cable 29 and the particular auxiliary equipment shown in FIGS. 3A, 3B, or 3C. As this information is received by the interconnected device, an echo of this information is transmitted from the interconnected device back to the computer terminal. This returned information is then shown on display 22 and allows the operator to verify that the correct information has been transmitted to the interconnected device. This echo return of information transmitted to the interconnected device is referred to as "ECHOPLEX." Thus, in the full-duplex mode only received information is displayed on display 22 unless previously stored information within the hand-held terminal is desired to be displayed, as will be discussed more fully below.

In addition, some present-day teletypewriter halfduplex mode of transmission. In this particular type of transmission, all information generated by the keyboard is simultaneously transmitted to the interconnected device as well as being displayed on display 22. Thus this mode of transmission does not error check the information transmitted to the interconnected device but merely displays this information as generated by the hand-held terminal. Although this method of transmission is not widely used in present-day teletypewriter, the present invention includes this method of transmission in order to be compatible with all present-day teletypewriter. As is best seen in FIG. 4C, one of the array of eight switches 34 is utilized to select either full or half-duplex mode of transmission.

The present hand-held computer terminal also includes various parameters that may be selected by the array of switches 34 in order to make the present invention completely compatible with present-day teletypewriter. Thus two of the array of eight switches 34 allow the operator to select one of four different communication speeds. More particularly, the operator may choose whether information is to be transmitted from and received by the hand-held terminal at rates of 10, 15, 30, or 120 characters per second.

These are the standard BAUD rates commonly used in present-day data communication. It should be noted that in the 10 character per second speed, the transmission format for the information is one start-bit, eight information bits, (including parity), and two stop bits, making an eleven-bit code. For the 15, 30 or 120 character per second speeds, the format is one start bit, eight information bits (including parity) and one stop bit for a 10-bit code.

In addition, two other switches of the array of eight switches 34 allow the operator to choose one of four parity modes of transmission. Thus odd, even, mark, or space parity may be selected. These parity modes are well known in the data communication art and are generally utilized for error detection. Thus if the parity bit added to the seven bit code defining the character transmitted is to always to be a one, then a mark parity has been selected. Similarly, if a zero is always to be the eighth bit of the character code, then a space parity has been selected. Furthermore, even parity and odd parity may be selected so that the total number of binary ones is always even or odd respectively.

In addition, one of the switches of the eight arrays of switches 34 allows the operator to choose a method of displaying information on display 22 so as not to show a word of 10 characters or less on more than one line of readout at any particular time. In this mode of operation called the JUSTIFY mode, the hand-held terminal 20 causes all information generated by the display 22 to be shown from the left hand most character display of both lines of display. Further, if the word displayed on either line is less than 10 characters, and a second word is sequentially received for display on the same line but the number of characters in this second word would cause this word to be broken up and shown in part on the second line of display, the JUSTIFY mode of display prevents this second word being displayed on the former display line and causes this word to be shown on the subsequent display line with the first character of this word being placed in the left hand most character of the subsequent line of display. In this mode of display, it is readily apparent that the operator may more easily review the information being received by the hand-held terminal. The operation of this JUSTIFY mode of display as well as the other selectable parameters previously described will be discussed more fully later in this description.

In addition to the generation of the full ASCII characters plus "break" in a manner that makes the present invention a functional equivalent to present-day teletypewriter, the present invention also includes various other features which make the receiving and transmitting of information to interconnected devices more easily facilitated with less chance for error. Thus, the present invention includes a LOCKOUT feature which prevents the transmission of incorrect code information when more than one keyboard key is depressed simultaneously. Furthermore the present invention includes a REPEAT feature that automatically repetitiously generates any character selected and depressed for approximately one second. Following this one second time interval the particular character chosen will be automatically transmitted at a rate of approximately 7½ characters per second as long as the key is held depressed. This feature greatly facilitates the transmission of repetitious characters.

In addition, terminal 20 also incorporates a scroll switch 30, which allows the operator to present on display 22 any of the information which has been stored in the self contained memory in terminal 20. By maintaining scroll switch 30 in the NORMAL position, the information entered on keyboard 24 or received by terminal 20 is displayed on the first or lower line 23 of display 22; and when all 10 characters of the first line of display 22 are filled the display automatically moves the contents of the first line to the second line 25 or upper line of display 22. When the lower line of display 22 has been filled, the information presented on this line is shifted to the upper line of display 22 and the new information is displayed on line 23. When retrieval of any information stored in the self-contained memory of terminal 20 which is not visually seen on display 22 is desired, scroll switch 30 is moved into the DOWN position, which automatically retrieves on a line-by-line basis the information stored in the memory. When the desired line from the memory's storage is displayed, scroll switch 30 is placed in the NORMAL position in order to assure the operator has sufficient time to visually read and understand the information displayed. Thus as seen in FIG. 1A, when the operator moves scroll switch 30 via his thumb in a backward motion, the scroll feature of the present invention allows one to visually see information that has previously been obtained or generated by the terminal and stored in the terminal's self-contained memory. This operation is thus functionally equivalent to rolling back the teletypewriter printout paper that contains the information previously received or generated on a teletype.

In the present invention the scroll switch 30 may be a rocker type switch which for each time the switch is rocked in a direction toward the operator, one line of printout within the internal memory is displayed on line 25 along with the immediately chronologically newer line of information on line 23. Thus, for example, if the operator is looking at the most recent two lines of information, which are the fourth and fifth memory lines, the newer or fifth line of information would be stored in the lower line of the display 23 while the fourth line or the line previously received or transmitted by the terminal is displayed in the upper line 25 of display 22. If the operator desired to view line number 3, stored in the memory, he would rock scroll switch 30 toward himself and then memory line 3 would appear in the upper display line 25 while memory line 4 would appear in the lower display line 23. The operator could continue to rock scroll switch 30 and each time he would view a previously stored memory line in the terminal's memory.

However, the scroll back operation could only be performed until the first line of information, mainly memory line 1, is obtained in upper line 25. If the operator tried to scroll back to view the next earlier line, the hand-held terminal would generate an audible BELL signal indicating to the operator that a non-existant line of information was being requested to be viewed by the operator. The display would remain on memory lines 1 and 2 until the operator moved the scroll switch rocker arm to the UP position away from himself. At this time the memory lines would be advanced one line per depression of the rocker scroll switch until the most recent line, or memory line 5, is displayed in the lower display line 23, If the operator attempted to advance the scrolling operation to view line 6, which is nonexistant, the audible BELL would again be generated indicating to the operator that in incorrect scrolling operation was being attempted.

It is thus apparent that the scrolling operation allows the operator to view all the memory lines stored in the internal memory of the terminal 20. In addition, if the scroll switch is placed in the NORMAL position, the display will remain indicating the two lines of memory most recently selected by the scroll switch.

It should be noted that if the operator is viewing previously stored information and new information is being received by the hand-held terminal 20, the fact that this new information is being received is indicated to the operator by the modulation of the light intensity of the information shown on display 22. If the operator then desires to view this incoming information without scrolling ahead through all the lines between the line he is presently viewing and the most recent line of information being received, the operator merely needs to depress any of the side keys 26, 27 or 28 or any of the 20 front keys which will automatically advance the information shown in display 22 to the NOW state.

In addition, the scroll switch 30 incorporates an AUTO-REPEAT function which causes the scrolling operation to be moved backward or forward in memory whenever the switch is held in the background or forward moe for approximately 1 second. After this one second interval, the scrolling operation will automatically cause the information shown in display 22 to be moved at a rate of approximately 4 lines per second. This allows the operator in effect to read the information stored in the memory at a rate which allows easy comprehension of the material without long time intervals between the advancing or retreating memory lines.

The audible bell mentioned earlier is also sounded when a BELL code is received by terminal 20 from the interconnected device. In addition, the audible bell is sounded automatically when an improper keyboard operation is attempted by the operator. Thus the audible bell feature of the present invention is a very useful diagnostic tool for the operator which informs him of incoming bell information as well as improper operation of the terminal.

Figure 1D:
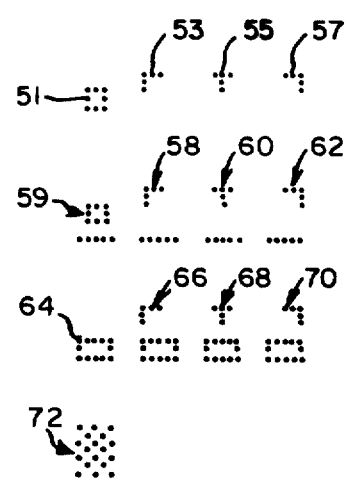
FIG. 1D is a diagrammatic representation of the various cursors that may be generated by the hand-held terminal of the present invention.

Furthermore, the present invention incorporates the use of a cursor that indicates the position where the next character will be shown in display 22. Since all incoming characters, as well as all information transmitted when in the half-duplex mode, is first shown on the lower line 23 of display 22, the cursor is only found in one of the 10 character locations of the lower line 23 of display 22. As best seen in FIG. 1D, the configuration of the cursor displayed in the character location of the next character to be displayed on the lower line 23 may comprise various shapes. These various shapes indicate to the operator whether a lower or upper case character is to be displayed, whether a side-mounted key 26, 27 or 28 is depressed, whether a "control" character is to be generated, as well as whether it is not now possible to send information to the interconnected device. Thus, for example, if cursor 51 shown in FIG. 1D is displayed in the third character position of lower display line 23, the operator would be informed that an upper case character was to be transmitted and displayed in the third character position of display line 23. Similarly, if cursor 53 appeared in the third character window of lower display line 23, the operator would be informed that a second information level of an upper case character is to be transmitted and displayed by the hand-held terminal. This second information level indicates that side-key 26 has been depressed and therefore that an upper left hand character on the keyboard is to be transmitted. Similarly, if cursor 55 is displayed in the third character window, it would indicate to the operator that an upper case third information level character is to be transmitted by the hand-held terminal. Cursor 57 indicates to the operator that a fourth information level upper case character is to be transmitted and thus that the upper right hand character from keyboard 24 is to be transmitted, indicating that side key 28 has been depressed by the operator.

Furthermore, if a lower case character is to be generated and transmitted, the operator will be informed of this via cursors 59, 58, 60 and 62. These cursors again indicate not only that a lower case character is to be generated, transmitted and displayed by the hand-held terminal but also indicate the information level and therefore whether the lowermost, upper left hand, upper middle, or upper right hand character from keyboard 24 is to be transmitted by the hand-held terminal.

Similarly, cursors 64, 66, 68, and 70 indicate to the operator that a control character is to be transmitted by the hand-held terminal and also that either the first, second, third or fourth information level character is to be transmitted.

Cursor 72 indicates to the operator that he is unable to effectively send information to the interconnected device. This cursor indicates to the operator that there is either a malfunction between the hand-held terminal and the interconnected device or a malfunction with the interconnected device itself.

In addition, these cursors always modulate in light intensity so as to be distinguished from the characters presently displayed by display 22. In this manner, confusion between cursor and the displayed characters is avoided. It is thus readily apparent that the cursor function of the present invention provides a novel and effective means for the operator to realize the next character that is to be transmitted by him to the interconnected device. He need not look at the condition of the side key switches 26, 27 or 28 nor need he determine whether normally upper or normally lower case or control information has been selected. All this information is readily and instantaneously available to him by the cursor. In addition, the cursor shows exactly where the next displayable character is to be shown on display 22. It should be noted that although control characters that are received by the hand-held terminal are not shown on display 22, nor stored in the internal memory, if these control characters are to be transmitted by the handheld terminal, the operator does realize via display 22 that he is about to generate a control character.

Figure 3A:
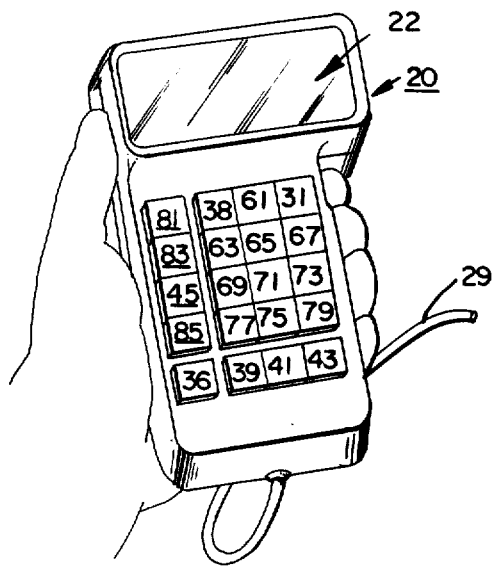
FIG. 3A is a perspective view of the hand-held terminal of the present invention in the direction connect configuration.
Figure 3B:
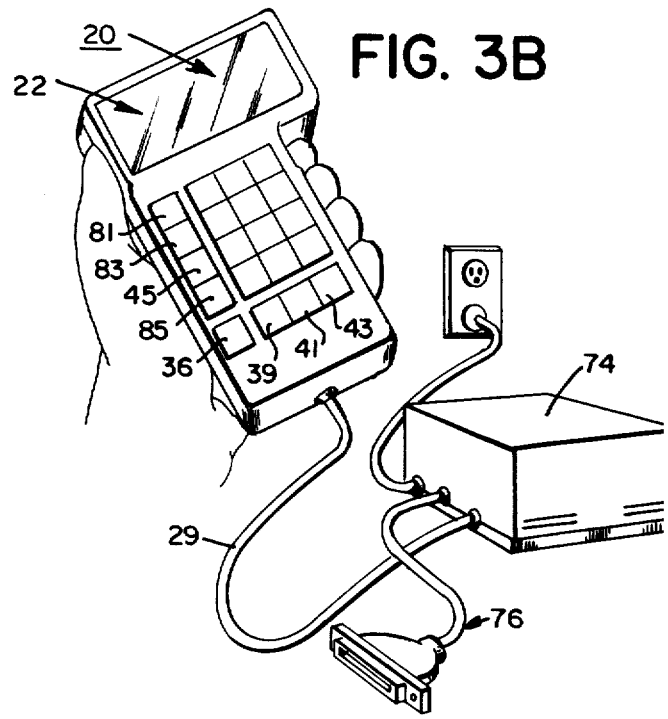
FIG. 3B is a perspective view of the hand-held terminal of FIG. 1 in the current loop configuration.
Figure 3C:
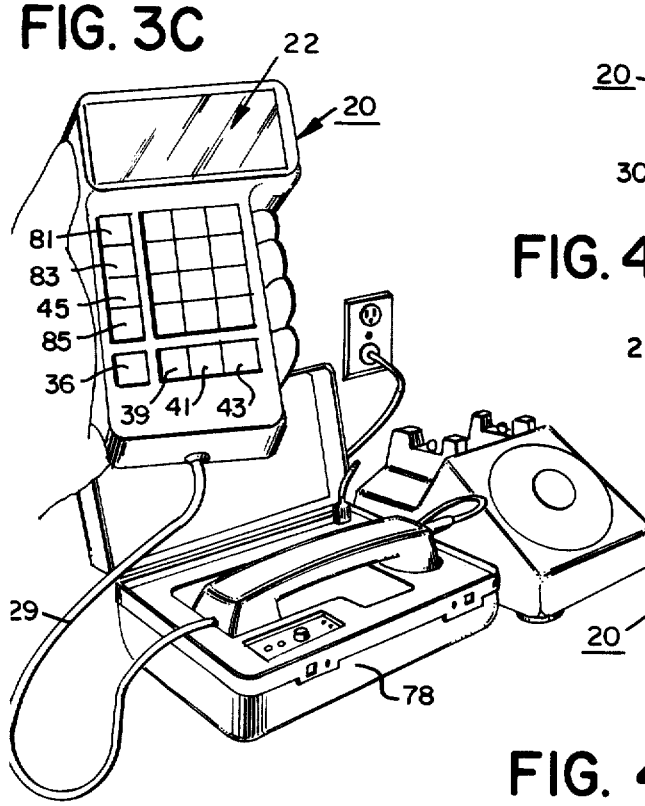
FIG. 3C is a perspective view of the hand-held terminal of FIG. 1 interconnected with an acoustic coupler.

As best seen in FIGS. 3A, 3B and 3C, the present invention may communicate wit external devices via several different means. A cable 29 utilized in the various interconnecting configurations of the present invention need only use 4 lines that represent DATA IN, DATA OUT, power, and ground. As is quite obvious to one skilled in the art, the terminal of the present invention can incorporate its own power source and thereby eliminate one of the 4 wires included in cabld 29. As best seen in FIG. 3A, the present invention may be directly wired to a computer whereby the bit-serial interface with RS-232C signal levels receives and transmits information from and to the computer terminal. If the terminal of the present invention does not include a power supply, a supply of 5VDC at 3 amperes is necessary to properly drive the terminal.

As best seen in FIG. 3B, a RS-232C/current loop connection module may be interconnected with cable 29. In this arrangement the hand-held terminal utilizes the current loop connection module as a power supply source and as a conversion for receipt and transmittal of information to an interconnected computer via cable connection 76.

As best seen in FIG. 3C, the present invention may utilize an acoustic coupler 78 to properly communicate with a computer. In this configuration, any computer equipped for remote access via telephone modem type 103A, over the switch network with standard voice-grade telephone lines may communicate with terminal 20. When the acoustic coupler 78 is utilized, a local 117 VAC power source is required. Short term battery operation is also possible with the acoustic coupler 78. As is readily apparent, this mode of communication with an interacting computer is extremely mobile and allows the operator of terminal 20 to use the present invention wherever voice-grade telephones are available.

It is obvious to one skilled in the art that the present invention can incorporate not only its own power source but also signal transmitting and receiving means. When such means are incorporated into the terminal or are in a portable self-contained unit to which the terminal is connected (see FIGS. 3B and 3C), no direct connection between the terminal and the external device need be made, and the hand-held terminal of the invention will be completely portable and functional without any wire length limitation.

TERMINAL OPERATION

Figure 2:
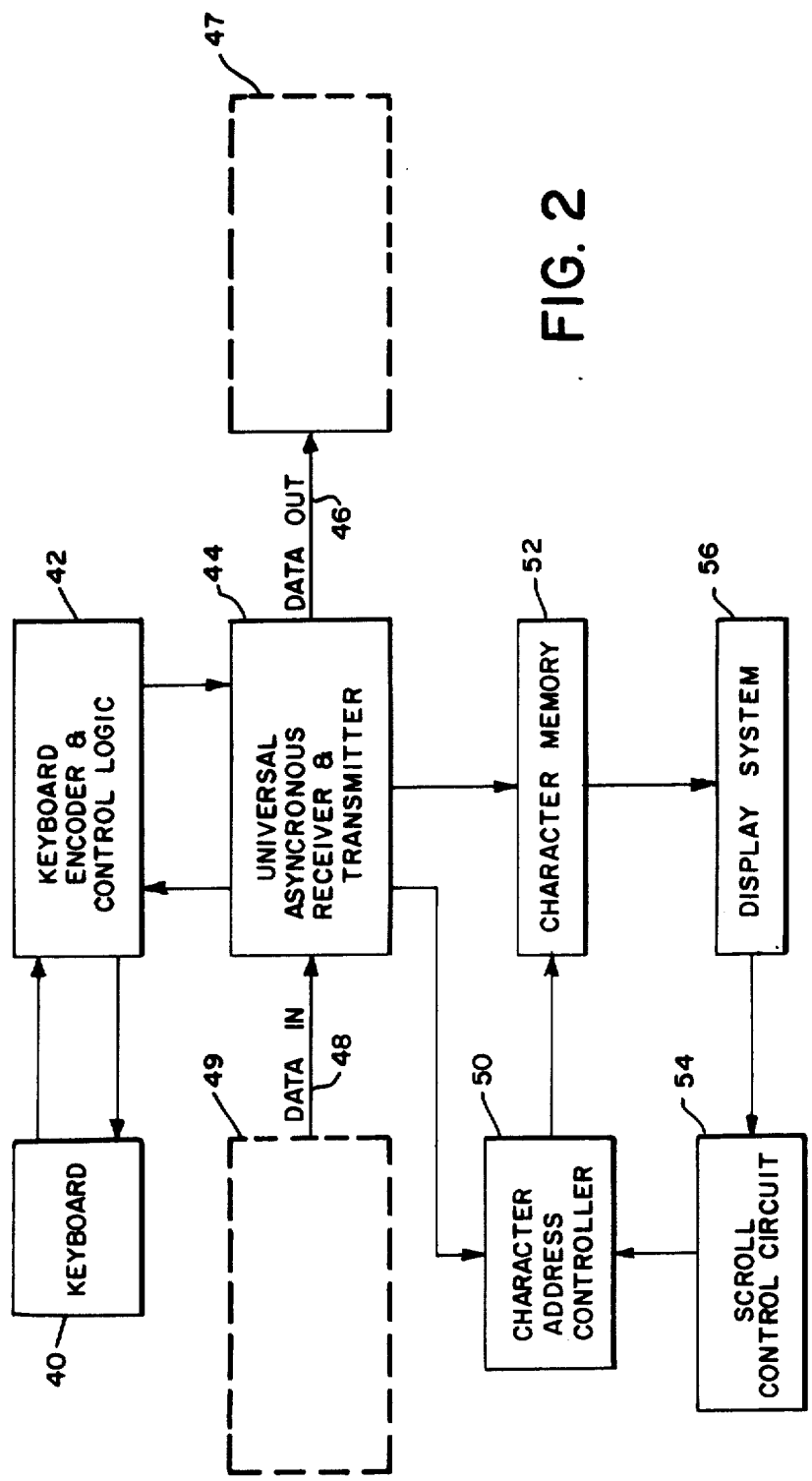
FIG. 2 is a simplified block diagram showing the operation of the hand-held terminal of the present invention.

The actual operation of interactive terminal 20 is better understood by referring to the simplified schematic block diagram shown in FIG. 2. In FIG. 2, an overall schematic block diagram showing the receiving, transmitting, displaying and scrolling of data by terminal 20 is shown. Keyboard block 24 incorporates the previously described transmission information entry keys of keyboard 24, the shift level control keys 26, 27 and 28 and scroll switch key 30.

Keyboard 24 is interconnected to a keyboard encoder and control logic block 42. The keyboard encoder and control logic block 42 receives a signal from keyboard 40, converts the signal into a binary signal which represents the information received, and sets a data ready signal when the binary signal is ready for a transmission to a universal asynchronous receiver and transmitter 44 (UART). As soon as a ready signal is received, keyboard encoder and control logic block 42 transfers the binary signal stored therein to registers incorporated in the UART 44. The UART 44 incorporates two distinct portions, one being a transmitter portion and one being a receiver portion. The information transferred from the keyboard encoder and control logic 42 is transferred directly into registers located in the transmitter portion. When the proper timing signals have been received, this information is transferred along line 46 as serial data to a particular data receiving means 47. Data receiving means 47 can take various forms, such as a frequency shift-keying radio receiver, a modem input, or a computer communication input channel.

The serial data entering the UART 44 on line 48 is transmitted by data transmitting means 49. Data transmitting means 49 can also take various forms, such as a frequency shift keying radio transmitter, a modem output, or a computer communication output channel. Serial data entering on line 48 is stored in registers incorporated as part of the receiving portion of receiver-transmitter 44.

When the data stored in the receiver portion of receiver-transmitter 44 is ready for transmission to a character memory 52, a data-ready signal is transmitted from receiver-transmitter 44 to a character address controller 50. Character address controller 50 incorporates a clock oscillator and a clock counter in combination with comparator circuits which determine the timing when the serial data stored in the receiver portion of the receiver-transmitter 44 can be transmitted to character memory 52. Character address controller 50 indicates the particular line and the particular character position in that line which the information being transferred from the receiver portion of receiver-transmitter 44 should have been stored in character memory 52, along with the position presently available in memory 52. When comparison is achieved, the data stored in receiver-transmitter 44 is transferred to character memory 52.

Character address controller 50 in combination with scroll circuit 54 controls the readable display associated with display system 56. When the proper timing has been achieved, character address controller 50 signals character memory 52 to transfer the digital signal stored in character memory 52 to display system 56. Display system 56 incorporates an ASCII character font generator which converts the digital signal into a signal for illuminating the light-emitting diode of the display. Upon receipt of the proper strobing signals, the display is illuminated with the desired characters and lines.

The particular lines which are presented on the display associated with display system 50 are controlled by scroll control circuit 54, which sets the particular mode for the display. Scroll control circuit 54 allows the operator to select whether the serial data entering on line 48 is immediately displayed by display system 56 or whether information stored in character memory 52 is presented by display system 56. Depending upon the particular mode selected, scroll control circuit 54 indicates the desired mode to character address controller 50, which performs the required timing and comparison functions and informs character memory 52 which information should be transferred and displayed by display system 56.

In the manner described above, the hand-held interactive terminal of this invention efficiently operates without any noise, allowing the operator to enter instructions on his hand-held terminal, have these instructions sent directly to the data-receiving means, while having the information so transmitted to data receiving be displayed on the display associated with terminal 20. Furthermore, the operator is capable of reviewing any of the information contained in the memory associated with terminal 20, allowing the operator to review either instructions that have been sent or information which has been transferred to the terminal by the external data-transmitting means.

Figure 5:
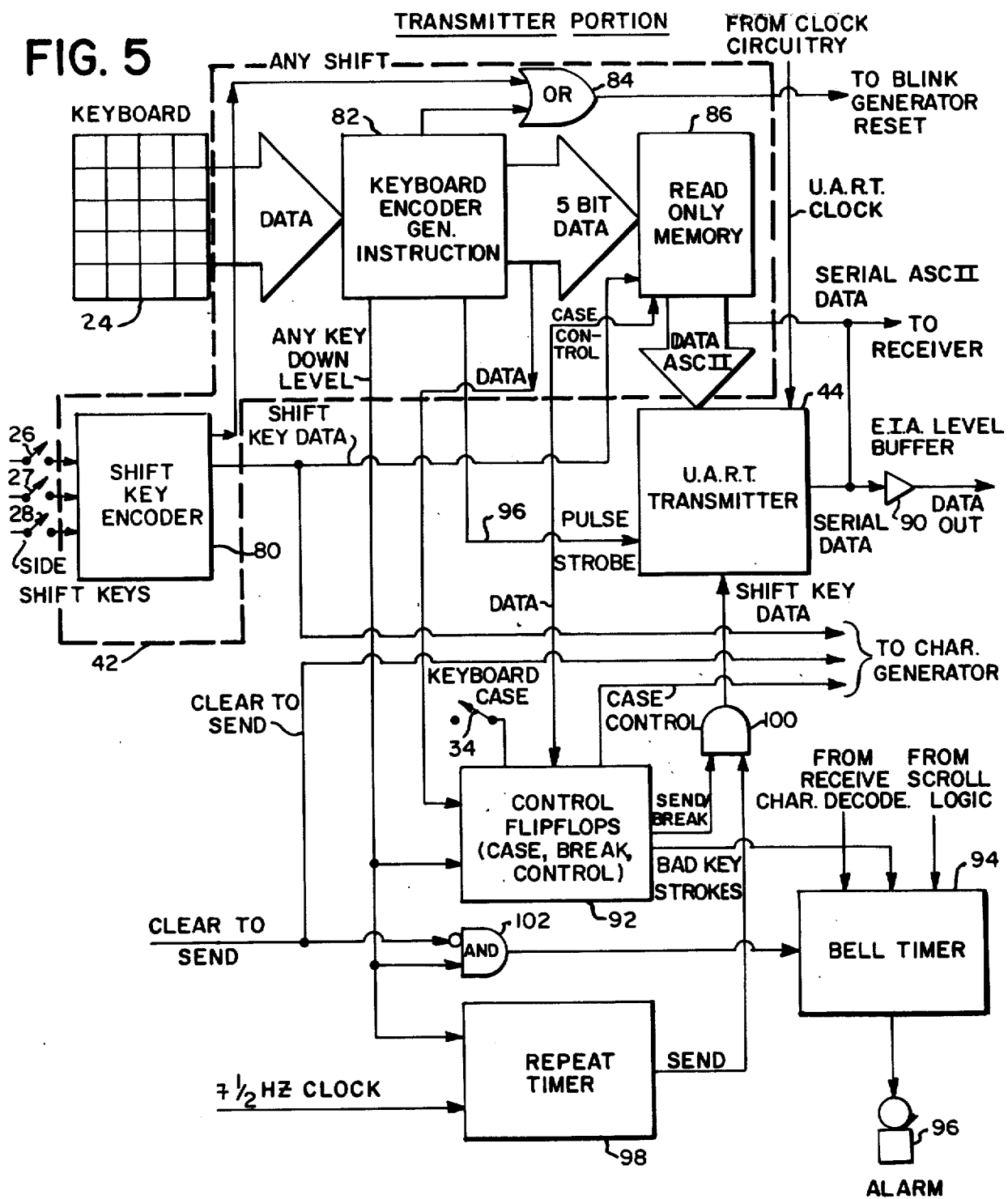
FIG. 5 is a more detailed block diagram of the transmitter portion of the computer terminal of FIG. 1.
Figure 6:
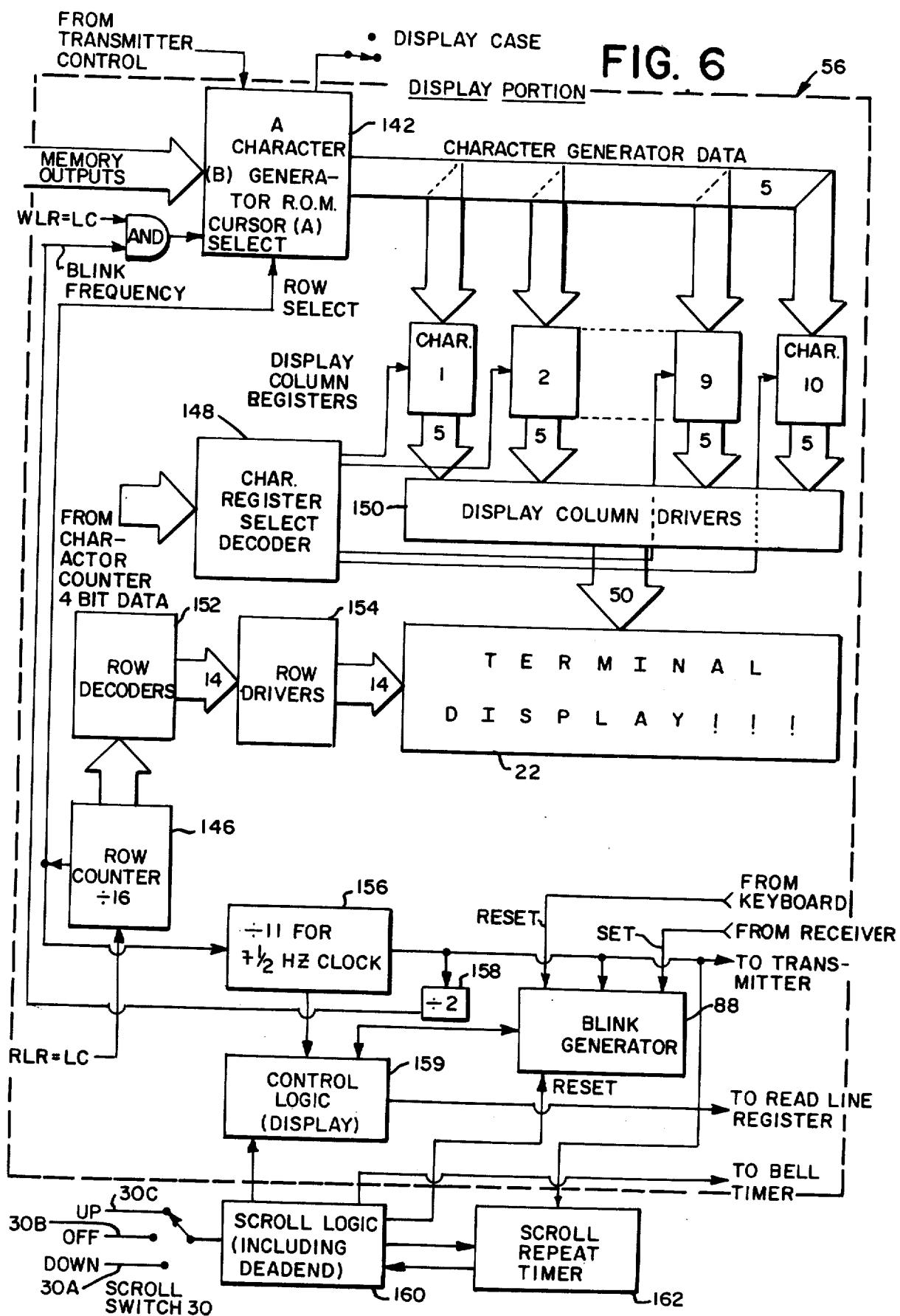
FIG. 6 is a more detailed block diagram of the display portion of the computer terminal of FIG. 1.
Figure 7:
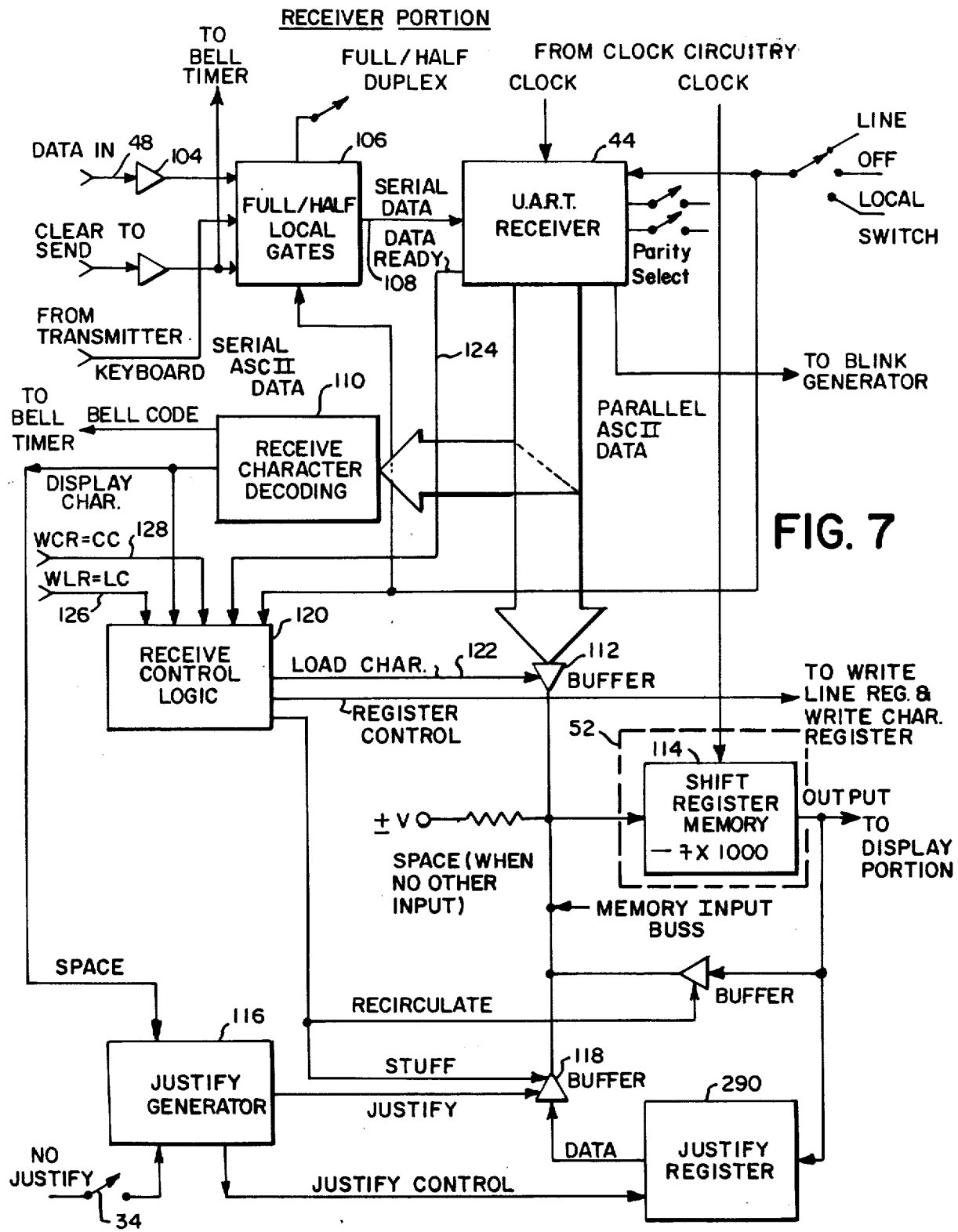
FIG. 7 is a more detailed block diagram of the receiver portion of the hand-held terminal of FIG. 1.
Figure 8:
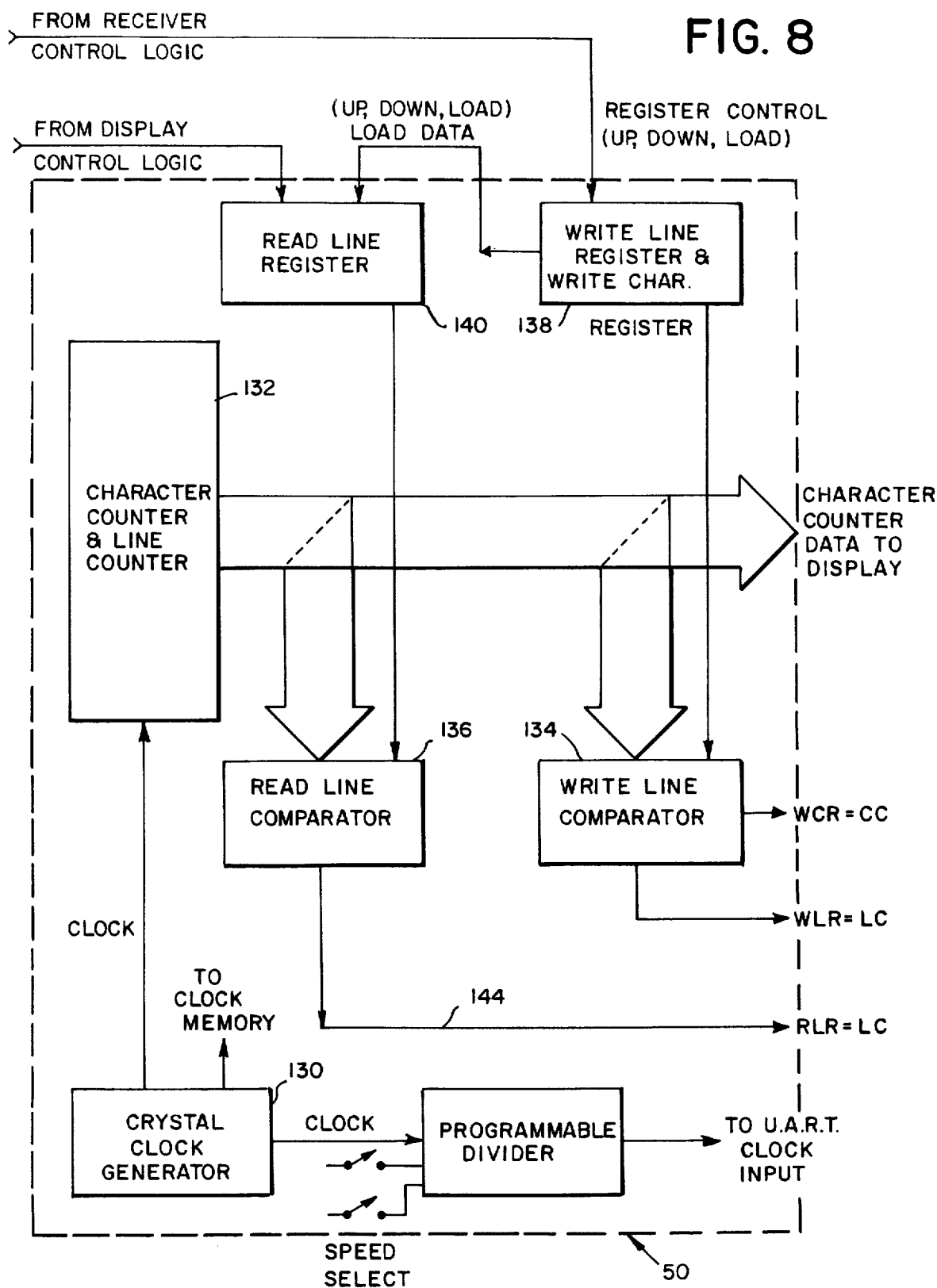
FIG. 8 is a more detailed block diagram of the register portion of the hand-held terminal of FIG. 1.

A more detailed block diagram showing the operation of all the circuitry of the terminal including the various features discussed in the first part of this description is shown in FIGS. 5, 6, 7 and 8. Each of these FIGURES represents a various portion of terminal 20; thus FIG. 5 illustrates the transmitter portion, FIG. 6 illustrates the display portion, FIG. 7 illustrates the receiver portion, and FIG. 8 illustrates the registers used to read in and write out information to and from terminal 20.

As best seen in FIG. 5, keyboard 24 along with shift level control keys 26, 27 and 28, which comprise keyboard block 40, communicate with keyboard encoder and control logic block 42. Keyboard encoder and control logic block 42 incorporates a shift key encoder 80, a keyboard encoder 82, OR gate 84 and read only memory (ROM) 86. Shift key encoder 80 utilizes exclusive oring logic to determine the information level selected for the keys depressed on keyboard 24 (see FIG. 1A). Keyboard encoder 82 sequentially examines each key switch of keyboard 24 and this information, along with the shift encoder information is transferred to OR gate 84.

The output of OR gate 84 is transferred to blink generator 88 (see FIG. 6) so as to reset the blink generator when information is being transmitted by terminal 20. The reason for resetting the blink generator is that when information is being transmitted by terminal 20, the display is at the current or NOW line and thus current information is being displayed by the terminal. As is noted above, the present invention incorporates a modulation feature that notifies the operator when information is being received while the operator is viewing past memory lines. The blink generator is the device used by the present invention to cause this modulation in the light intensity.

Keyboard encoder 82 generates a 5-bit parallel data word to read only memory 86. Read only memory 86 interprets this 5-bit data word and generates an ASCII data word from this information. This ASCII information is then transferred to UART transmitter 44 where the information is transferred to external devices via EIA level buffer 90. As is well known in the art, EIA is the standard electronic association level which is used to receive and transfer serial data.

As is also seen in FIG. 5, keyboard encoder 82 also transfers data to control flip-flops 92 where this information is used to ascertain the proper alphanumeric case, whether a "break" signal is to be generated or whether a control character is to be generated. Control flip-flops 92 in turn communicate with a bell timer 94 for causing an audible alarm 96 to be sounded when an incorrect key operation has been attempted by the operator. In addition, control flip-flops 92 communicate with read only memory 86 with respect to the alphanumeric case and as to whether control information is to be generated by the read only memory. The particular alphanumeric case is determined by the array of switches 34 (see FIG. 4C) and this information is in turn received by control flip-flops 92. The control flip-flops in turn monitor the read only memory for the synchronization of the above instructions.

Clocking information with respect to the generation of transmittal information by UART 44 is received from keyboard encoder 82 via signal line 96. This strobing of the UART 44 ensures that the transmittal of information occurs in proper synchronization with the remainder of the terminal 20.

As is also seen in FIG. 5, the transmitter portion of the present invention includes a repeat timer 98 that communicates with an AND gate 100 to cause the UART transmitter 44 to automatically repetitiously transmit the ASCII data received from read only memory 86 when the key on keyboard 24 is depressed for approximately one second. In addition, if a CLEAR TO SEND signal is not received by terminal 20 from the interconnected device, an AND gate 102 causes bell timer 94 to sound alarm 96. In addition, this CLEAR TO SEND signal is transferred to the character generator portion of display portion of the present invention (see FIG. 6).

The receiving portion of the present invention is best seen in FIG. 7. In order to perform the entire function required of a terminal, the terminal of this invention must be capable of receiving information transmitted from the particular data-transmitting means and display this information on a readable character display. The receiving function of the terminal of this invention starts with the particular data-receiving means 49 (see FIG. 2). As described above, the data-receiving means 49 can take many various forms such as frequency shift-keying radio receiver, a modem output, or the computer communication output channel. The serial data being received by the terminal of this invention on line 48 is fed into an interfacing amplifier 104 which converts the signal to the proper logic level. The information is then transferred to a full/half local gate 106 wherein the serial data is transferred to UART receiver 44 via signal line 108. The UART receiver 44 incorporates a serial-receiving register, which when filled, transfers a parallel ASCII data character to a receive character decoding module 110 and an interfacing buffer 112 communicating with a shift register memory 114. The information in the received character decoding module 110 is transferred to a justify generator 116. If the JUSTIFY generator is in the ON state, via the ON condition of one of the switches of the eight array of switches 34 (see FIG. 4C), coded signals representing spaces are inserted into a buffer 118 if the display of information on a particular line would otherwise cause a word of 10-characters or less to be displayed on more than one display line at a particular time.

The shift register memory 114 to which the parallel ASCII data from UART receiver 144 is transferred is a part of the character memory 52 (see FIG. 2). In the particular embodiment of the present invention, character memory 52 comprises seven, 1000-bit recirculating shift registers which are interlaced to provide the memory capability of 1000 ASCII characters. The proper placement of the parallel ASCII data within shift register memory 114 is accomplished via a receive control logic module 120 which generates a LOAD CHARACTER signal 122 when the write line register is equal to the count in a line counter (WLR=LC) 128, a write character register is equal to a character counter's count (WCR=CC) 126, and a data ready signal 124 is received from the UART receiver 44. At this time, the information in buffer 112 is then properly transferred to shift register memory 114.

The generation of the write line register equal to line counter signal 126 and the generation of the write character register equal to character counter 128 is best understood by referring to FIG. 8. As can be seen in FIG. 8, the character address controller 50 receives its clock pulses from a crystal clock generator 130. In the preferred embodiment of the present invention the crystal clock generator operates at a 1.2 megahertz rate. These clock pulses are fed into a character counter and a line counter 132. The information generated by the character counter and line counter is transferred to a write line comparator 134 and a read line comparator 136. In addition the write line comparator 134 receives a signal from a write line register and write character register 138. The write line register and write character register 138 is activated upon the proper signal being generated by the receive control logic module 120 of the receiver portion of the terminal (see FIG. 7). Thus the write line comparator 134 generates the write line register equal to line counter signal 126 and the write character register equal to the character counter signal 128 when the shift register memory is in the proper position to receive ASCII data.

More particularly, write line register and write character register 138 maintain the particular character position and line position available for loading in character memory 52 and, when clock generator 130, which drives character counter and line counter 132, reaches a count indicating that the desired position in character memory 52 is now available to be loaded, write line comparator 134 initiates the data transfer signals. When 10 characters have been received and written into character memory 52, write character register 138 increments the write line portion of this register by one.

The recovery of information stored in character memory 52 for transmission to display system 56 can best be understood by referring to FIGS. 6 and 8. As best seen in FIG. 8, a read line register 140 is utilized to cause the proper energization of read line comparator 136 in conjunction with the counter signals generated by character counter and line counter 132. When equality is reached in read line comparator 136 this equality indicates that the desired line position is now available for loading into the display portion of the present invention. As best seen in FIG. 6, in order to achieve the particular character display desired, a read only memory 142 is employed to generate the ASCII character font. This font generator 142 receives the 7-bit binary signal representing the particular character desired from the character memory 52.

The character read-only memory 142 generates a 5-bit signal representing the actual number of diodes which must be illuminated in order to visually present the character desired on the display 22. As earlier discussed, each character comprises a 35-dot light emitting diode matrix. The 35-dots are formed by five vertical rows, each containing seven light emitting diodes. The font generator 142 produces a 5-bit signal containing the number and position of the light-emitting diodes which must be illuminated in that particular vertical row in order to produce the desired character display.

The read line comparator 136 causes an output control signal when the read line register 140 is equal to the line count, that is, when RLR = LC. This insures that the desired line in the memory will be read out into the display 22. In addition the character counter and line counter 132 transfers its information to a character register and select decoder 148. When equality is obtained in this character register and select decoder, a display column signal is generated for one of the 10 possible characters to be displayed. The information from the character generator 142 is thus transferred to a set of display column drivers 150 wherein the information regarding the particular illumination of the columns to generate 10 characters is stored and amplified. In addition, the row counter 146 communicates with a row decoder 152 which sequentially energizes one of 14 rows corresponding to the 14 rows in the two lines of display of display 22. The row decoder 152 communicates with a row driver 154 which amplifies the signal on the 14 lines from the row decoder. These outputs from the row driver are then inputted to the display 22 sequentially causing the columns corresponding to the particular row energized to in turn be energized if the display column driver 150 has indicated that that particular diode in that particular column is to be energized.

It is thus seen that the 14-diode rows constituting the two lines of display are sequentially reviewed and enabled by the row drivers 154 in accordance with the information inputted from display column drivers 150. Thus the generation of the particular characters chosen for the two lines of display are sequentially created. Since the row drivers perform the entire generation of the 14 rows of the display, 82.5 times per second, the display seen by the observer appears to be constant with virtually no flicker. The two other counts from the row counter 146 are utilized by the character generator 142 to input the desired character information into the display column drivers so as to show two different character lines for the 2-line display. Thus after the first seven rows, constituting one line of display have been shown, the row counter 146 commands the character generator 142 to transfer the next 10 characters of the next line of memory to the display column drivers 150. This is repeated at a rate of 82.5 times per second. It should be noted that spaces may be inserted in any display line by the use of a SPACE command, which when decoded causes all the 35 LEDs in one character location to be deenergized.

In addition, the row counter output is transferred to a divide by 11 module 156 so as to generate a 7½ hertz clock. This clock signal is used to transmit characters generated on keyboard 24 at a rate of 7½ characters per second if the selected key is depressed for at least approximately 1 second. In addition, the output of the 7½ hertz clock is sent to a divide by 2 module 158. This module thus causes an output signal of 3¾ which is utilized to modulate the cursor generated by the terminal. It should be noted that the character generator 142 includes a cursor select portion which is also inputted to the display column drivers in the proper character position. The amplitude of this cursor is modulated to indicate to the observer that the cursor is not one of the ASCII characters. The 7½ hertz clock 156 also communicates with a control logic module 159 that in turn is used to generate the read-line information to the read-line register 140 (see FIG. 8).

The hand-held interactive terminal of this invention also incorporates a scroll control circuit. More particularly, as described above, the terminal of this invention incorporates a finger operated 3-position scroll switch 30 having a DOWN position 30A, an OFF or normal position 30B and an UP position 30C. These positions are interconnected with a scroll logic module 160. Scroll positions 30A, 30B and 30C, through scroll logic module 160 and control logic module 159 control read-line register 140 which in conjunction with read-line comparator 136 determines which word is being read-out of character memory 52. When scroll switch 30 is in the OFF or NORMAL position, 30B, the control logic 159 controls the displaying of the latest-selected line of memory as well as the next previously stored line of memory.

When scroll switch 30 is placed in the scroll DOWN position 30A, the control logic 159 will be decremented by one line of memory. Similarly, when the scroll switch 30 is placed in the scroll UP position 30C, the control logic 159 will be incremented by one line of memory.

The present invention includes a scroll repeat timer 162 that receives the output from the 7½ hertz clock 156 and causes the scroll logic to repeatedly send signals to the control logic 159 so as to decrement or increment the memory lines being displayed at a rate of approximately 3½ lines per second. In this manner the operator may view the memory of the terminal at a rate which is convenient to read.

In addition, it should be noted that the blink generator 88 communicates with the control logic 159 so as to cause the light amplitude of the displayed information to modulate when the scroll switch 30 causes the display to be showing previously stored memory lines while incoming information is arriving at the terminal. In this manner, the operator of the terminal is made aware that incoming information is being received that is not currently being displayed on the display 22.

DETAILED CIRCUIT DESCRIPTION

A detailed analysis of the particular circuits used in the hand-held terminal of the present invention is best seen in FIGS. 9, 10, 11, 12, 13, 14, 15, 16, 17 and 18. These FIGURES illustrate the entire circuitry utilized in the present invention.

More particularly, the hand-held terminal of the present invention utilizes the ASCII code and, as mentioned earlier, may operate in either a full or half-duplex mode. The terminal may be conveniently divided into three sections; the keyboard and transmitter section, the receiver and memory section and the display section.

The keyboard and transmitter circuitry is contained primarily in FIGS. 9A, 9B, 9C and 9D. The information from keyboard 24 is received by a keyboard encoder 82 via lines 164, 166, 168 and 170. Thus every key closure of any particular key on keyboard 24 is encoded by the keyboard encoder into a 5-bit code defining the particular key depressed. This 5-bit code is transmitted via five lines to the read-only memory 86.

As can best be seen in FIG. 9C, the shift keys 26, 27 and 28 located on one side of the hand-held terminal are in turn encoded by shift key encoder 80 and exclusive gates 174, 176 and 178. Two of the three signals generated are binary encoding of the state of the three shift keys, and the third signal indicates when more than one key has been depressed at any particular time. This information plus the keyboard encoder output code is transferred to read-only memory 86 (see FIG. 9A). This read-only memory converts the data from the keyboard encoder 82 and the shift key encoder 80 into an ASCII code, which is available on the outputs of the read-only memory. These in turn are transferred to the universal asynchronous receiver/transmitter integrated circuit 44 (see FIG. 9B). This UART takes the parallel bit influx, serializes this influx, adds the proper parity that is previously selected by the operator by two of the array of eight switches 34 located on the back portion of the hand-held terminal, and adds START and STOP bits for EIA and ASCII compatible transmission. The input from the two parity switches is shown in FIG. 9B, which are used to determine whether mark, space, even, or odd parity is to be generated for the transmitted code information.

As best seen in FIGS. 9B and 9D, four flip-flops 180, 182, 184 and 188 and associated gates 190, 192, 194, 196, 198, 200, 202, 204 and 206 are utilized to indicate when a lock, unlock, space, control, break, or bad key action has been performed in the hand-held terminal. This information is used to set or reset the appropriate flip-flops as indicated below.

Flip-flop 182 is the BREAK flip-flop. It is set and held set during the time that the break key 41 (see FIG. 1A) in conjunction with side shift-key 27 is depressed, and is immediately cleared upon release of key 41.

The case lock flip-flop 184 is set by the depression of LOCK KEY 36 in conjunction with side-shift key 26 (see FIG. 1A). In this configuration the previously chosen normal case of the alphanumeric information is converted to the other case for each key on keyboard 24 depressed after the lock case key 36 has been depressed. Thus if the normal case mode of transmission is the upper case mode and key 36 is depressed after the depression of side key 26, all later depressed keyboard keys will cause lower case alphanumeric information to be transmitted from the hand-held terminal. Flip-flop 184 is cleared either by depression of the unlock key (side shift key 28 in conjunction with keyboard key 36) or by depression of the case key (side shift key 27 in conjunction with keyboard key 36). That is, the CASE KEY causes the previous CASE mode of transmission of the hand-held terminal to be inverted.

Flip-flop 186 is the CASE KEY flip-flop. It is set by the depression of the CASE KEY only when the LOCK flip-flop is not set. In this manner, the CASE LOCK flip-flop and the CASE flip-flop provide a typewriter-like operation of the LOCK, UNLOCK and CASE keys.

Flip-flop 188 is the CONTROL flip-flop. It is set by depression of the CONTROL key 36. Both the CONTROL and CASE flip-flops are cleared by the next keyboard key transmitted. That is, they last for only one depression of keyboard 24 and then are cleared. The LOCK key remains in whatever state it had been previously set in. That is, the LOCK KEY flip-flop remains in whatever state it had been set or reset in by depression by the LOCK or UNLOCK keys (keyboard key 36 in conjunction with side shift keys 26 or 28).

Gate 208 provides a low output whenever the CASE LOCK flip-flop or the CASE key flip-flop is set. This signal is exclusive ored with the keyboard normal lower switch 34 which is part of the array of 8 switches 34 on the back of the handheld terminal, by exclusive or gate 210. This thus acts as a programmable inverter. Thus when the keyboard normal lower switch is closed, the exclusive or gate 210 acts as a noninverting buffer, and when the switch is open the gate acts as an inverter. This output is designated as CASE and is used to drive gates 212 and 214 shown in FIGS. 9A and 9B. These gates provide for the detection of an alphabetic or alphanumeric symbol code; that is the ASCII code from 100 to 177 octal, and this in turn provides for changing the case of the code received from the read-only memory. It should therefore be noted that the code received from read-only memory 82 is the same for both upper and lower case alphanumeric information. It should also be noted that the control codes used in the ASCII code are not affected by the state of the CASE signal.

A J-K flip-flop 216 is utilized as the transmitter/buffer register load flip-flop for UART 44. This flip-flop is set by the STROBE signal from keyboard 24 and provides a pulse to the UART which then initiates conversion of the parallel data received into serial data and transmission on the terminal register output.

Gates 218, 220, 222 and 224 along with amplifiers 226, 228 and 230 (see FIG. 9B) provide for the BREAK function. This function also prevents the transmission of information from the hand-held terminal when the terminal is not in the LINE mode and further provides for the conversion of the signal levels to EIA bi-polar high-current levels. The line switch 32 is in the open position when the switch is placed in the OFF or LOCAL modes.

As best seen in FIG. 9C flip-flop 232 is used as a strobe flip-flop that provides for a keyboard lock-out when a key has been depressed; thus depression of a second keyboard key will not immediately cause transmission of a second code. Associated with this flip-flop is the REPEAT TIME OUT integrated circuit 234 which counts at a rate of 7½ hertz until a count of 8 is reached. At this time the 7½ hertz clock is gated into the clocking circuitry for the transmit/buffer register mode flip-flop 216. Thus, while the counter is counting up, the delay is achieved and then once this delay has been reached, as long as the key is held depressed the character will be transmitted at a 7½ hertz rate. Once the key is released, the strobe flip-flop 232 is cleared and the repetitive transmission of the character is halted.

The receiver and memory portion of the hand-held terminal 20 is best seen in FIGS. 10, 12, 13, and 14. As best seen in FIG. 10 the character counter and line counter 132 (see FIG. 8) is divided into a character counter 236 and a line counter 238. Thus an address for each of the 1024 locations in memory is provided for by the line counter 238. This counter is configured to count up to 1000 and to reset to 977 and then count to 1000 and finally reset to 0. Thus the line counter provides the extra 24 counts necessary to correspond to the 24 character memory locations presently not used in character memory 52 (see FIG. 2).

The circuitry used to accomplish this configuration of the counter is best seen in FIG. 15. Thus flip-flops 242 and 244 provide for this counting of the extra 24 counts of memory.

Figure 12A:
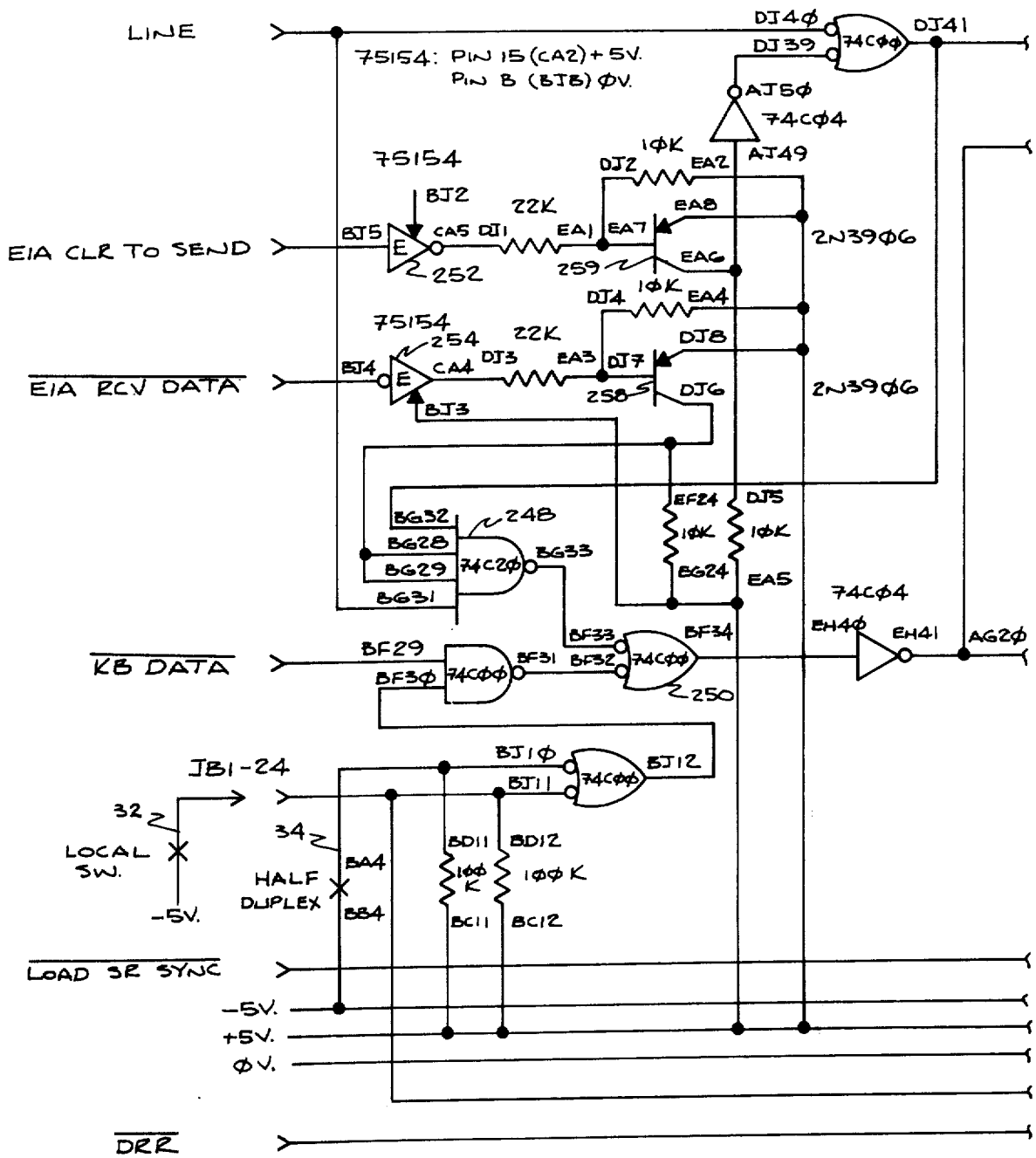
Figure 12B:
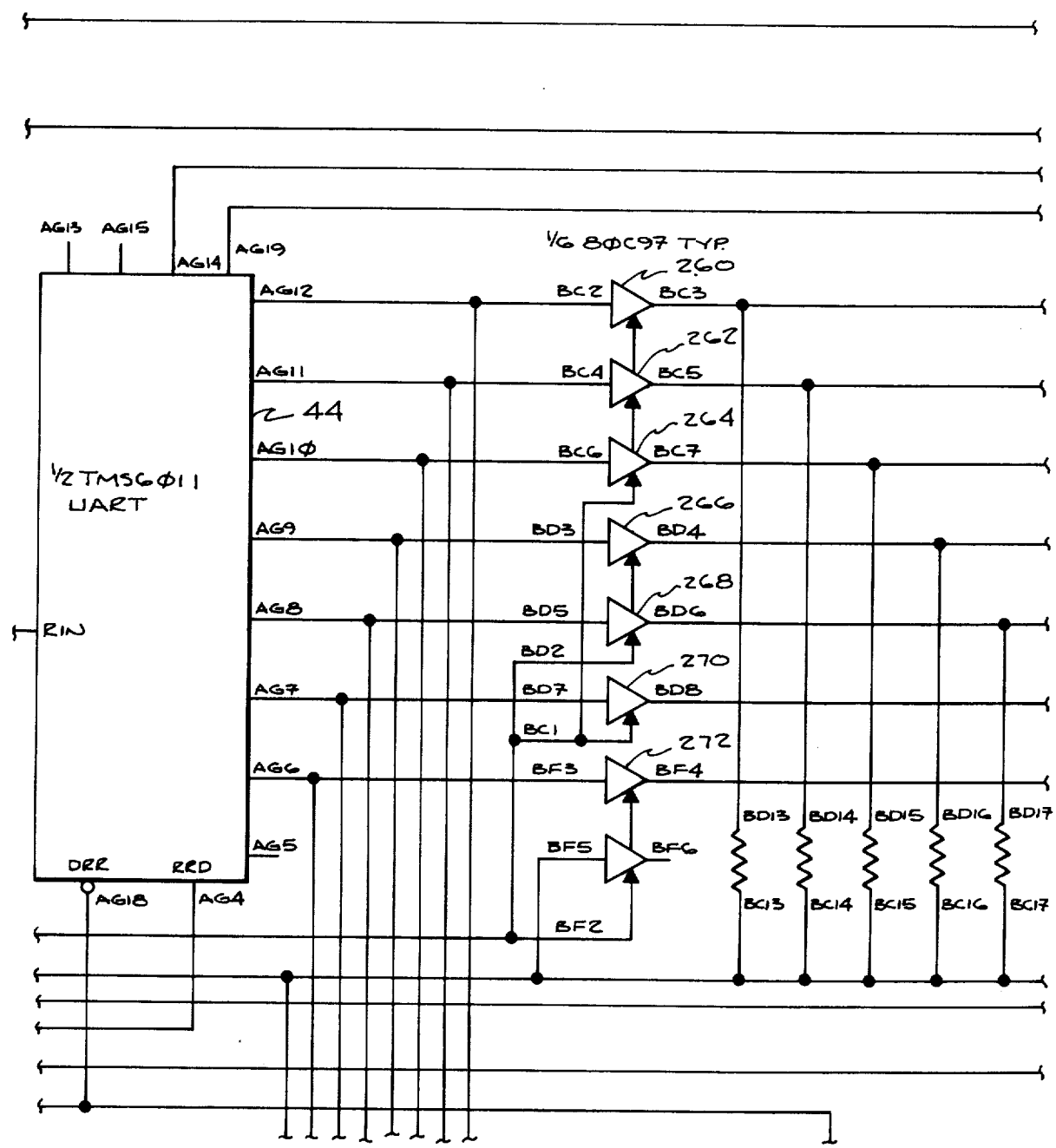
Figure 12C:
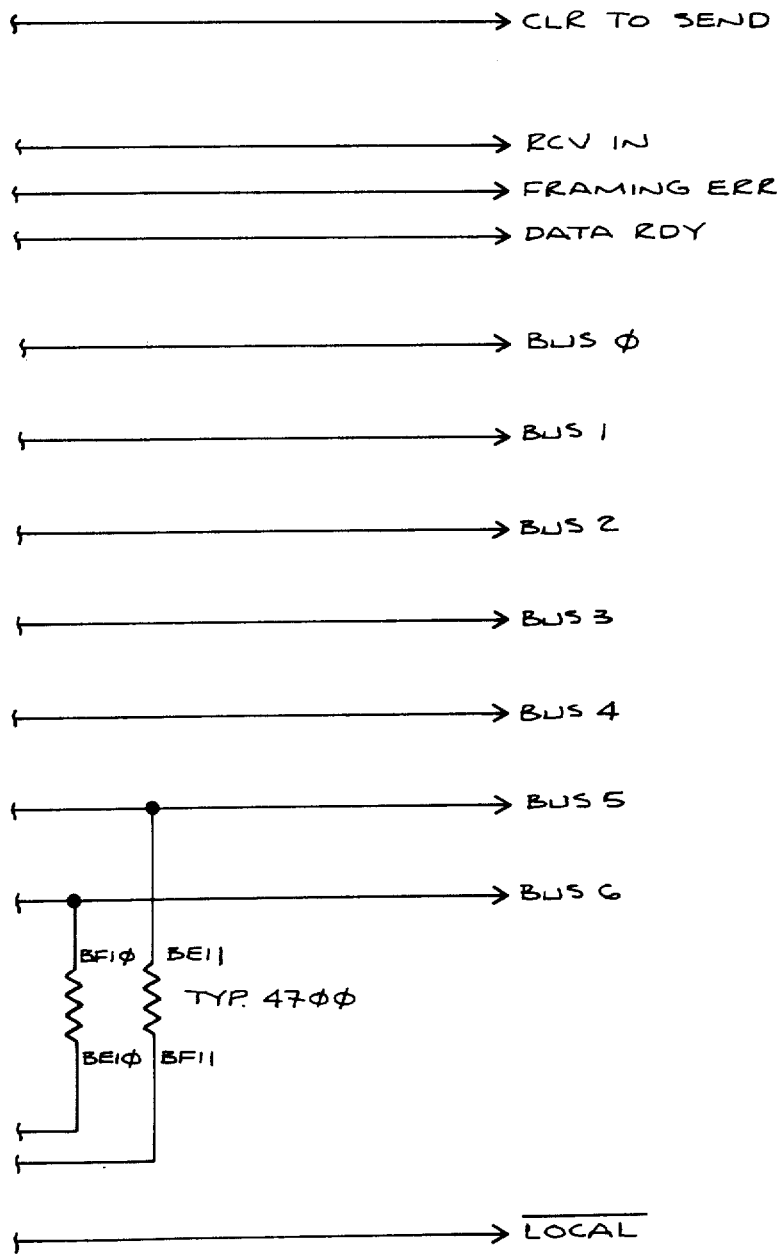

The output of the counter is constantly compared with the output of write line register 244 and write character register 246 that comprise the write line register and write character register 138 as shown in FIG. 8. This comparison is performed by the write line comparators 134 shown in FIG. 10D. Signal WLR equal LC indicates when the write line register is equal to line counter 238. Similarly the write character register 246 is equal to the character counter 236 when the WCR equals CC signal is high. Characters received in the communication lines are processed by the circuitry shown in FIG. 12. As best seen in FIG. 12A, EIA receiver gates 248 and 250 along with level shifters 252 and 254 and associated transistors 256 and 258 are used to send received data to the universal asynchronous receiver-transmitter 44 when the handheld terminal is in the LINE mode. When in the half-duplex mode, as evidenced by switch 34 shown in FIG. 12A, the keyboard data is also sent to the receiver portion of UART 44 so as to cause the generation of the display data from information depressed on keyboard 24. Also, when the hand-held terminal is in the LOCAL mode the keyboard data is also fed to the receive portion of UART 44. This is evidenced by the LOCAL switch 32.

The receiver portion of UART 44 receives the data as a serial bit-stream and converts it into parallel outputs. These outputs are buffered by amplifiers 260, 262, 264, 166, 268, 270 and 272 which in turn generate the memory input bus. The associated resistors cooperating with these amplifiers are used to provide the SPACE code (ASCII octal 040) whenever no other signals are being placed on the memory bus. This provides for the erasure of memory when the unit is turned on or when starting a new line of memory.

Figure 12D:
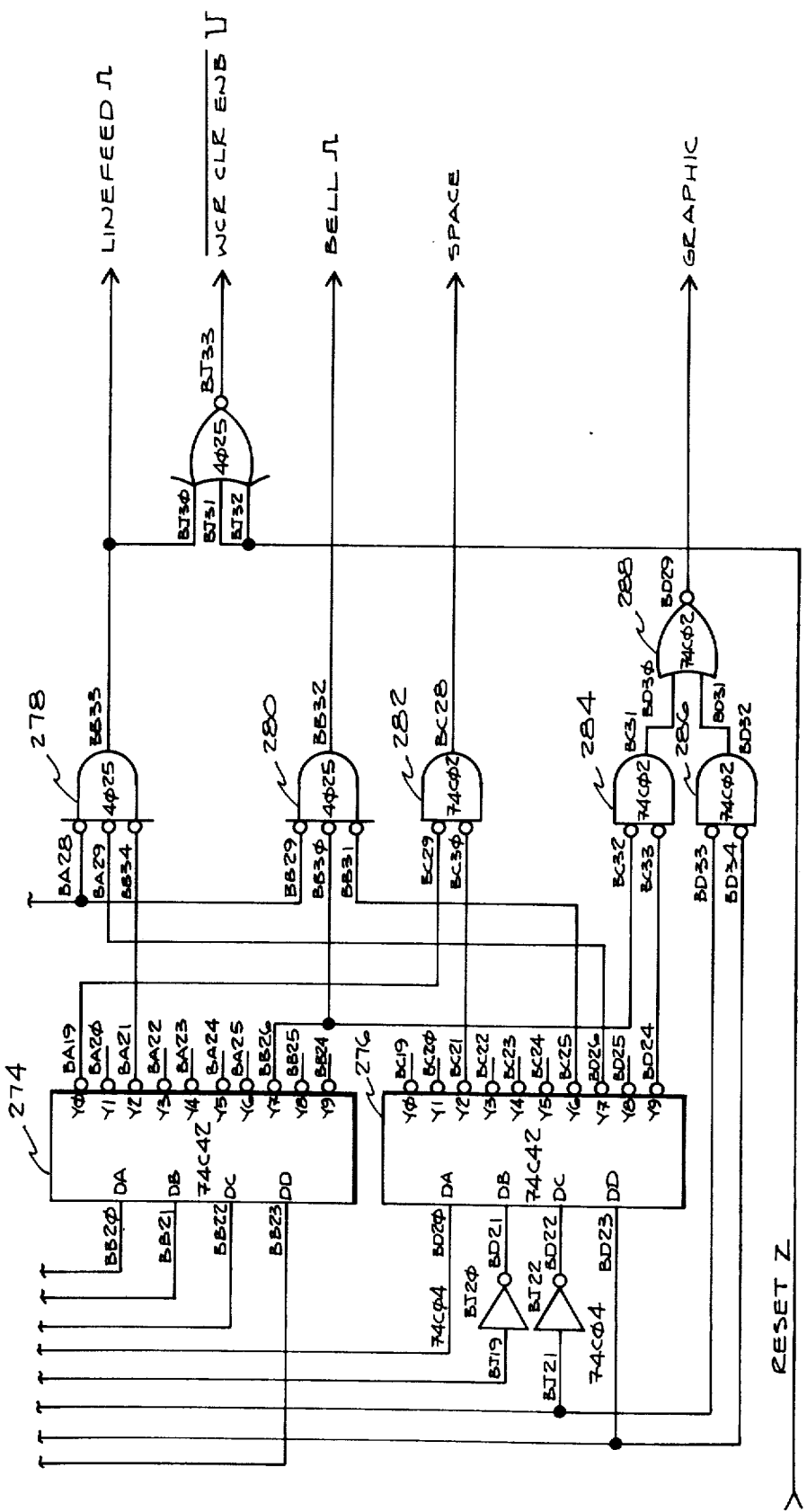

The decoding of the ASCII characters is best seen in FIG. 12D. Decoders 274 and 276 in conjunction with gates 278, 280, 282, 284, 286 and 288 decode the following ASCII characters: LINE-FEED (OCTAL 012), BELL (OCTAL 007), SPACE (OCTAL 040), and GRAPHIC, which encompasses any character between octal 040 and 176. These GRAPHIC codes incorporate all the generated displayable characters shown on display 22. This decoding excludes the CONTROL codes and the RUBOUT or DEL code 177.

The memory of the present invention can best be seen in FIG. 13. The memory bus from FIG. 12 is best seen in FIG. 13A and is designated as lines bus 0 - bus 6.

Figure 13A:
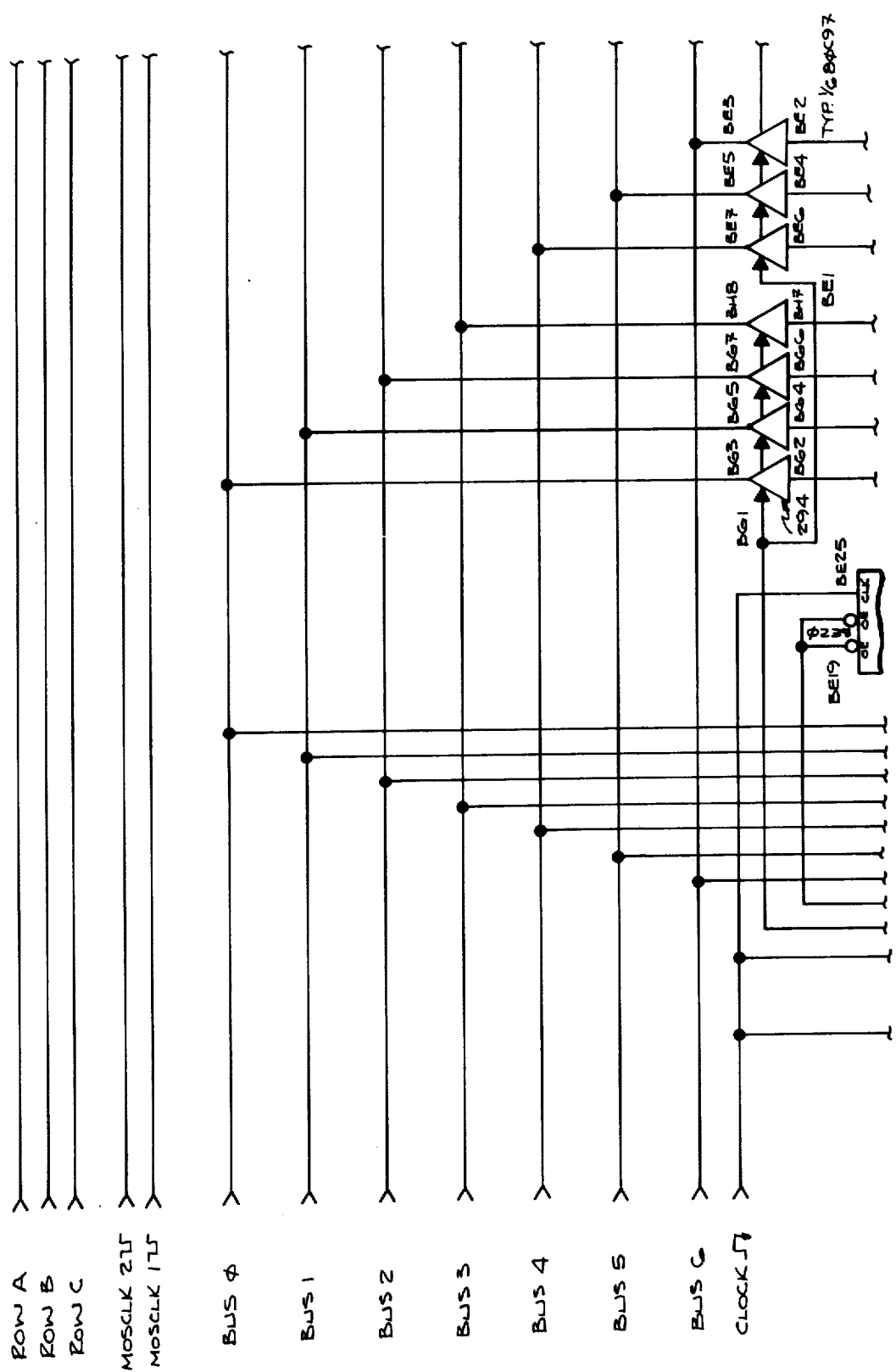
Figure 13B:
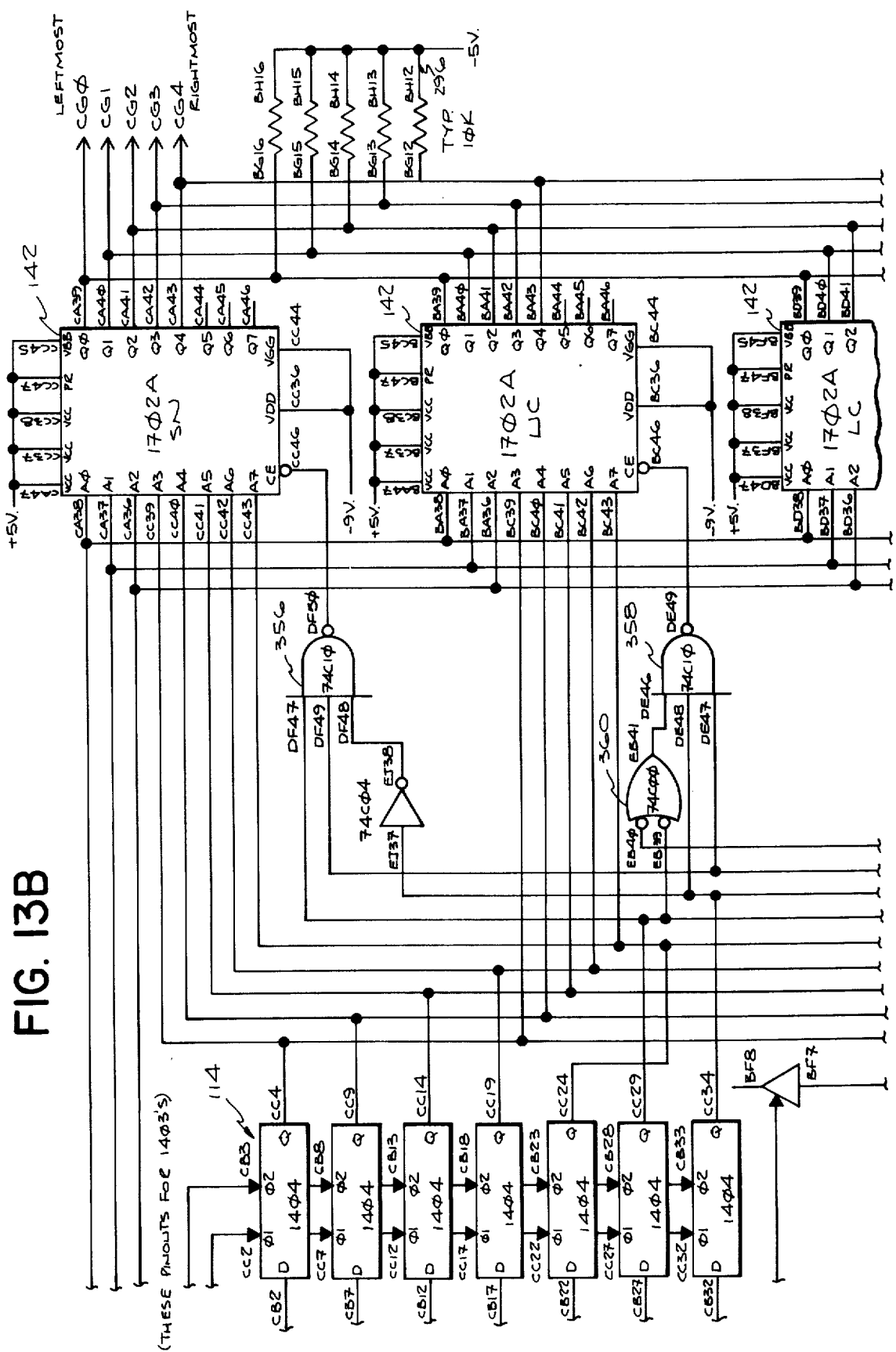
Figure 13C:
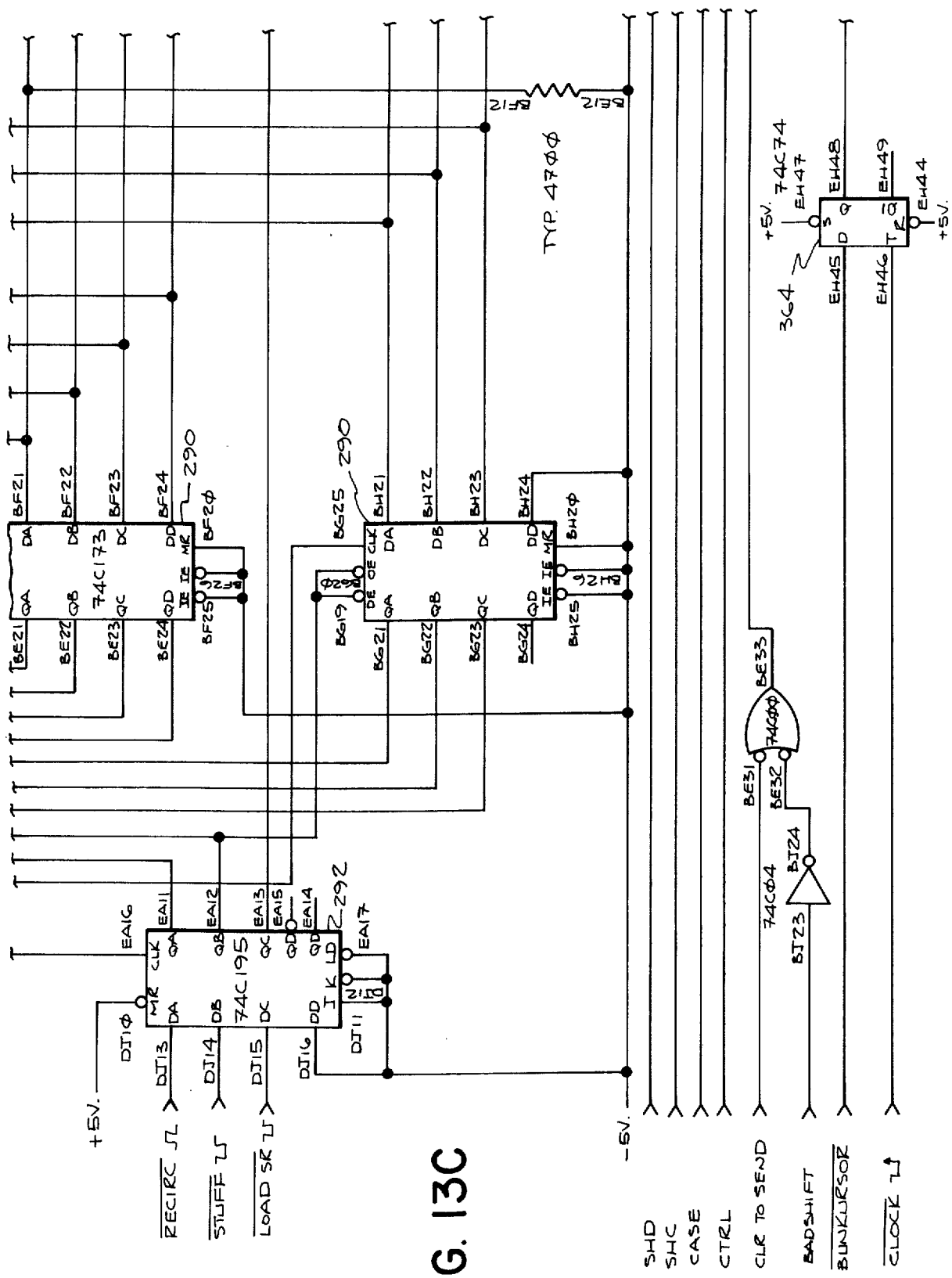
Figure 13D:
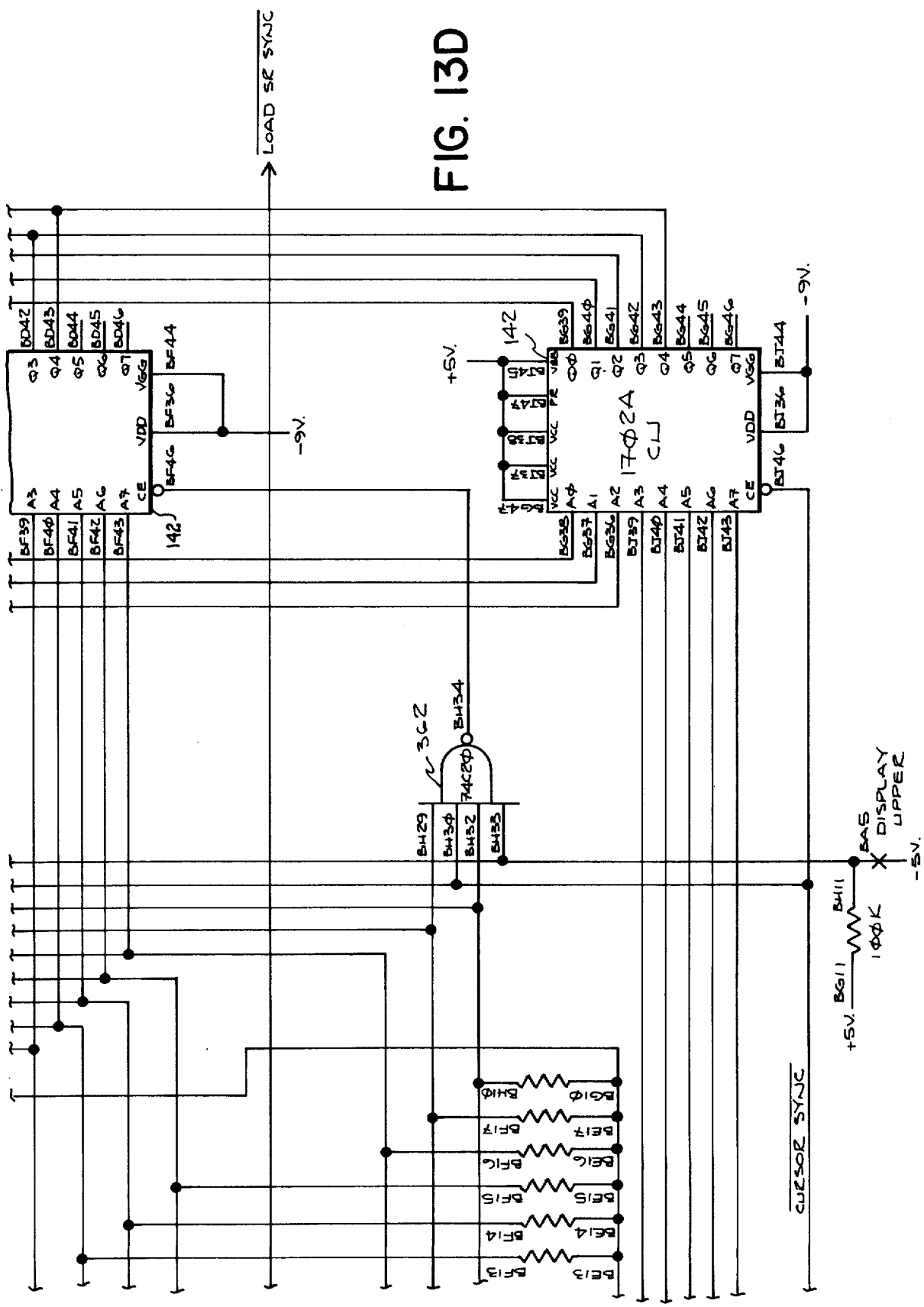

The shift registers 114 receive the information from the memory bus and in turn store this information. These registers are 1024 bits long each, but as noted earlier the extra 24 bits after the 1000th bit are always considered to be blank. The output from the memory goes to character generator 142 which consists of a read-out memory (Intel corporation, Part No. 1702A). This read-only memory is best seen in FIG. 13D. The memory outputs are also sent to a JUSTIFY register 290 (see FIG. 13C) which serves to increase the effective length of the shift registers to 1025 bits so as to allow the shifting of characters by one position in each full circulation of these shift registers. The JUSTIFY register 290 is only used when the hand-held terminal is in the JUSTIFY mode. This particular mode of operation, as discussed above, prevents the displaying of a word of 10 characters or less on more than one line at any particular time.

The memory bus load commands ae synchronized with the rest of the electronic circuitry via integrated circuit 292. One such command is the LOAD SR which when synchronized gates the UART parallel output onto the memory bus. The command STUFF gates the JUSTIFY register onto the memory input bus when this command is enabled. Furthermore the RECIRC command gates the output of the shift register memories back to their inputs via the buffers generally shown as 294 (see FIG. 13A). When none of these three signals are enabled, as explained earlier, the memory input bus is in a condition of ASCII SPACE or octal 040. The resistors generally shown as 296 (see FIG. 13B) are utilized to ensure that the read-only memories have the proper voltage compatability.

The control logic of the present invention is best seen in FIG. 14. As best seen in FIG. 14A, the network of gates generally shown as 298 determine when a character has been received, when it is the proper time to insert it into the memory, and if it is a graphic or displayable character. If the character is not a graphic or displayable character, these gates set the data-ready flip-flop 300. Thus for all nonprinting ASCII codes, including all CONTROL codes, the RUBOUT code, LINE FEED code (which is not considered a printing code), the DATA READY RESET flip-flop is set as soon as possible after receipt of the data ready signal form UART 44. In all other cases, that is, for all printing characters including the SPACE code, once the data ready signal has been received the circuitry waits until the write line register 244 and the write character register 246 coincide with the clock counter, thus indicating the proper slot into which to place the received data. At that time the data ready reset flip-flop is set. This allows for synchronization with UART 44. It should also be noted that the signal $\overline{\text{LOAD SR}}$ which provides for the loading of the memory is also generated by the control logic circuitry and is best seen in FIG. 14B.

Figure 14A:
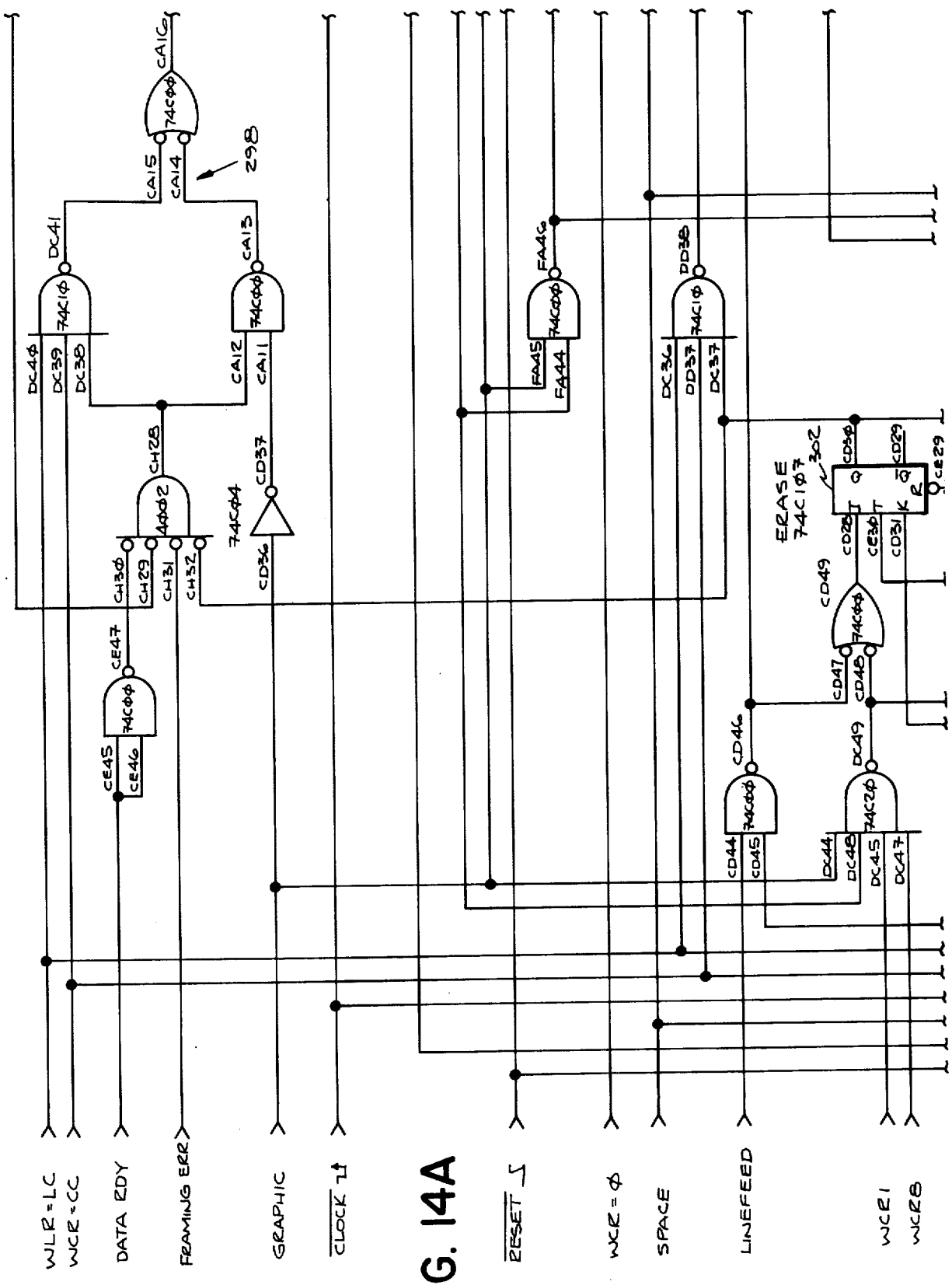
Figure 14B:
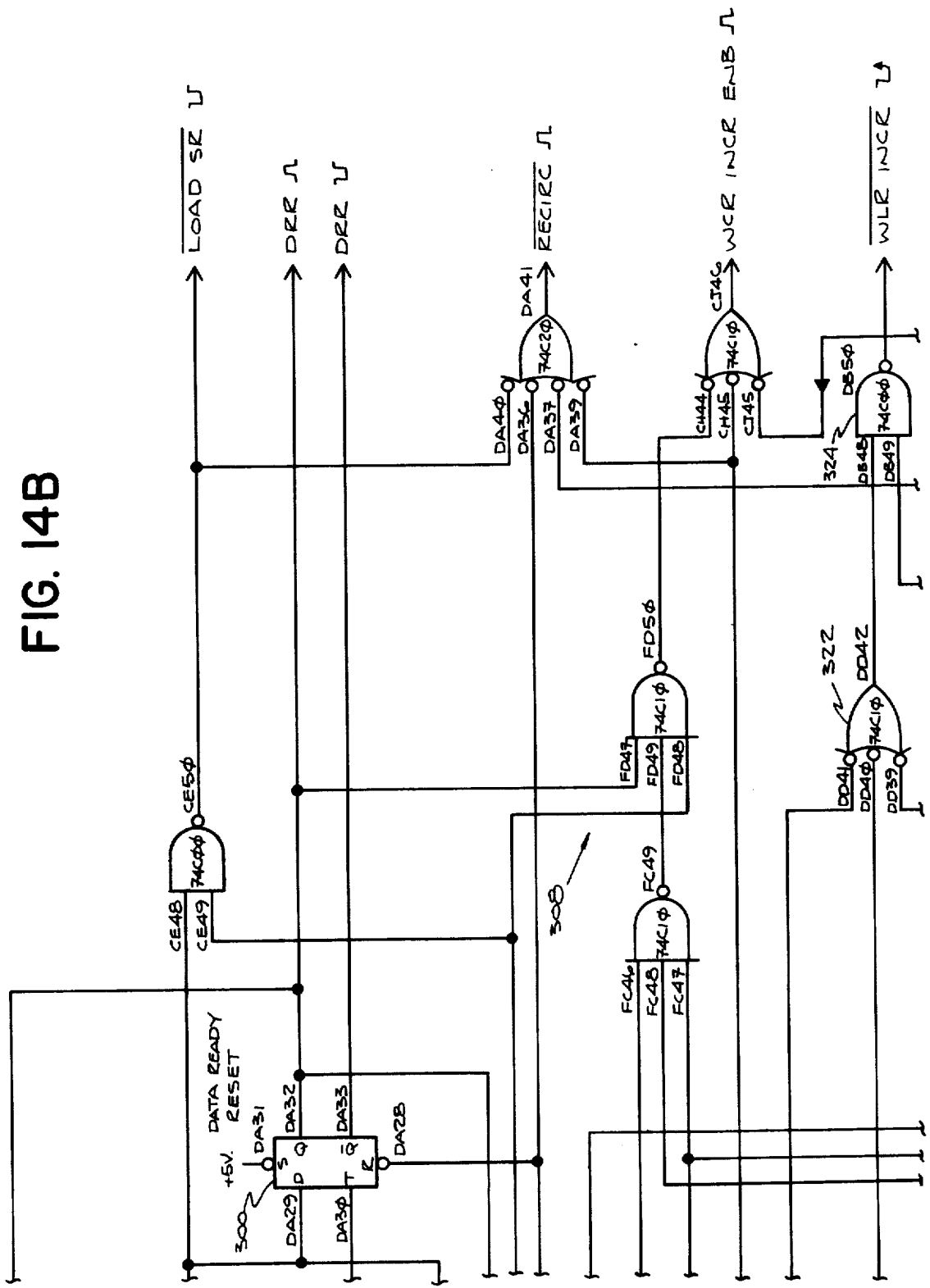
Figure 14C:
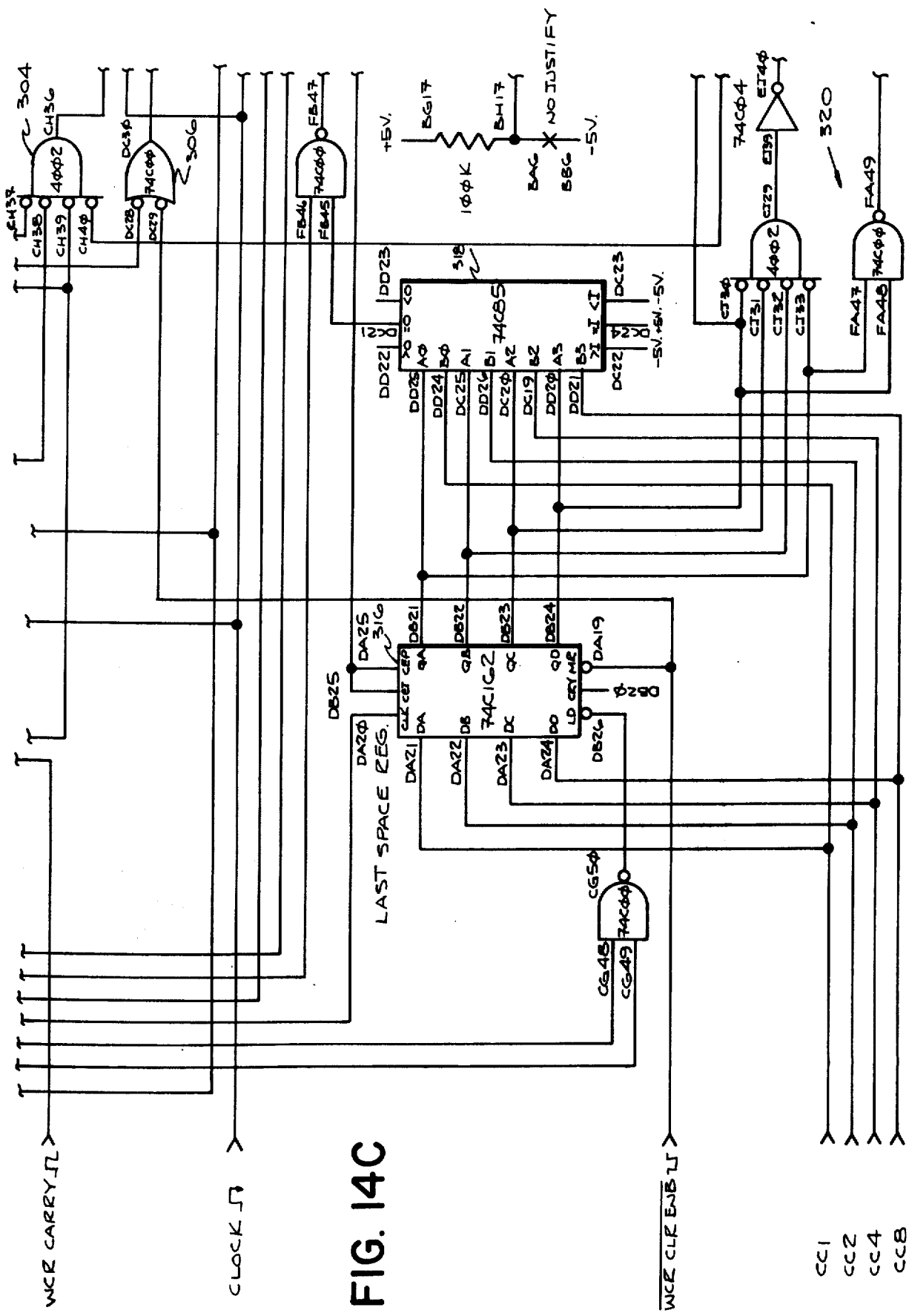

As best seen in FIGS. 14A and 14C, the control logic includes an erasure flip-flop 302 which communicates with LOAD gates 304 and 306. This flip-flop is set for a total of 10 clock periods after the last character in a line has been inserted and erases the next 10 charcters in memory in order to clear the next line for the display. At the beginning of this time the write line register 244 is incremented. At the end of this time the write line register is left at the new line and the write character register 246 is returned to 0 or the first character in the line. The gates generally shown as 308 in FIG. 14B determine the times at which to increment the write line register and write character register. It also provides for the generation of the re-circulation signal that allows the memory contents to be saved.

Figure 14D:
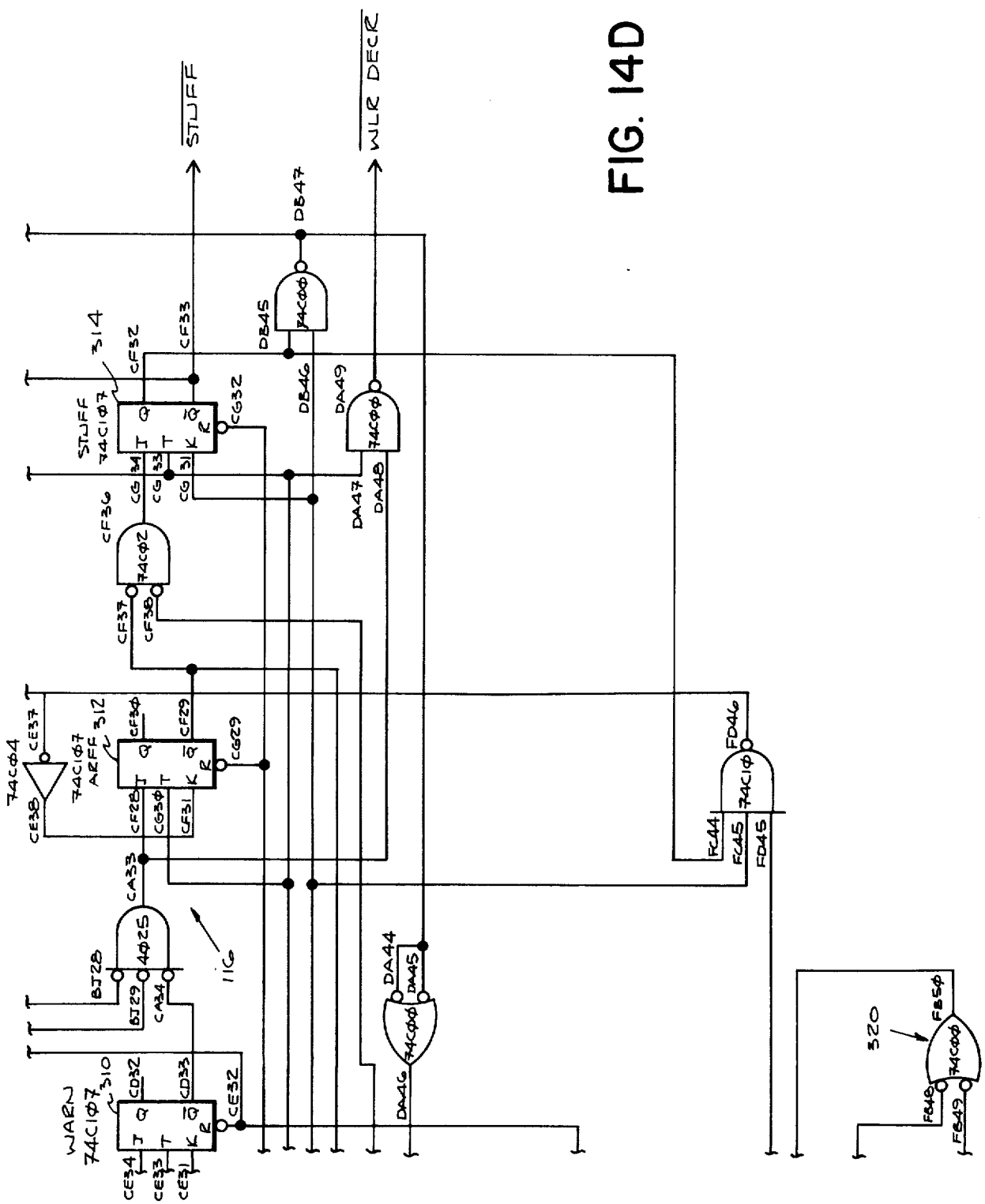

As best seen in FIG. 14D the JUSTIFY generator 116 is composed of three flip-flops 310, 312 and 314 and associated gates. Flip-flop 310 is set when the last character inserted in a line is a printing character; that is, a graphic character other than the SPACE character. This warns the JUSTIFY generator that a word may possibly be broken up on this particular line of display.

Flip-flop 312 is called the ADJUST REQUEST flip-flop (ARFF) and is set upon the receipt of the next character. If the next character is not a graphic or displayable character the JUSTIFY mode does not proceed. However if the character is a graphic or printable character then flip-flop 312 is set. At this point the JUSTIFY generator is activated.

As best seen in FIG. 14C the JUSTIFY register includes a LAST SPACE register 316 and comparator 318. the LAST SPACE register is loaded with the character number of any SPACE CODE received by the UART receiver 44. It contains at any time the location of the most recent SPACE code received, or if no SPACE code has been received on a line, it contains a 0. The comparator 318 continuously compares the character counter with the last space register and gives a high output which will set the STUFF flip-flop 314 (see FIG. 14D) if the ARFF flip-flop 316 is set. Thus once the ARFF flip-flop is set the memory cycles around until the most recent space is available at the output of the memory. The STUFF flip-flop is then set which in turn increases the length of the shift register by 1; thus duplicating the space in memory. Everything in the memory subsequent to that space is then shifted down one position by going through the JUSTIFY register until the most recently received character is available in the JUSTIFY register. At this point the STUFF flip-flop is cleared which then effectively deletes the character subsequent to the most recently received character which is a space and shortens the memory to 1024 bits. The last space register 316 is then incremented and the procedure is repeated after the memory cycles around again to receive the new position of the last space. Once a space has been inserted in character 9 of any line, the ARFF flip-flop 312 is finally cleared, thus indicating the end of the JUSTIFY mode.

The effect of this is to move any word which was in previous danger of being split on a line boundary completely into the next line of display. All of the above electronic interaction occurs in a time less than the time required to receive another character. The gates generally shown as 320 in FIG. 14C and 14D determine either that the last space register 316 is empty or that the last character on a line has been filled. This is the condition which thus allows the JUSTIFY mode to occur. If no spaces have been received on a line, the WARN flip-flop 310 (see FIG. 14D) cannot be set indicating a "NO JUSTIFY" condition. Also gates 322 and 324 allow a LINE FEED code to increment the write line register and to clear the write character register.

The clock generators for the logic and memory portion of the hand-held terminal are best seen in FIG. 15. In addition FIG. 15 illustrates the electronic circuitry utilized to generate the BAUD rate counter that determines the transmission rate which is common to the transmitter and the receiver. As can best be seen in FIG. 15A, crystal clock generator 130 utilizes a clock oscillator circuit generally shown as 328 incorporating a crystal 330. The output of the oscillator is divided by four via flip-flops 332 and 334. The divided by four signal is used as the clock for the remainder of the logic circuitry.

Gates 336, 338, 340 and 342 as shown in FIG. 15B determine that the clock will only be present during the 1000 active characters of the memory and be disabled during the extra 24 blank characters in the shift register memory. In addition the clock is disabled for two pulses out of every three when the display is being loaded so as to allow for the inherent delay of the display character generator memory.

As best seen in FIG. 15B, a reset flip-flop 344 is cleared whenever power is turned off and held clear for approximately ⅓ of one second. This allows for a power-on reset. The reset flip-flop is also cleared when the terminal is in neither LINE nor LOCAL mode; that is, when in the OFF mode via line/off/local switch 32. This particular reset goes to all parts of the logic circuitry.

As best seen in FIG. 15C, a MOS clock generation system is provided that generates a high level clock pulse of plus 5 volts DC and a minus 12 volt DC pulse to the shift register memories. The MOS clock generation system is generally designated as 346 and consists of resistors, capacitors, transistors and level shifters.

Flip-flops 240 and 242 serve to recycle the clock and line counters to allow them to count the extra 24 counts which are not used in the shift register. These flip-flops run continuously and are not gated off during the time of the extra 24 bits which is designated as the "idle" time and indicated via the $\overline{\text{idle}}$ signal 348,.

As best seen in FIGS. 15B and 15C counters 350, 352 and 354 along with the associated gating circuitry provide for a programmable BAUD rate divider. Counter 350 is a simple divide by 6 counter which runs off the 1.2 megahertz clock. The output of this counter is thus 211.2 kilohertz. This signal is sent into the subsequent counters 352 and 354 which are programmed to divide this frequency into 16 times one of the four possible BAUD rates; that is, rates 110, 150, 300 and 1200 bits per second. Sixteen times this frequency is available at the UART clock and is divided internally in the UART 44.

Selector switches 34 as seen in FIGS. 15C and 4C are used by the operator to choose the particular communication transmission rate for the hand-held terminal. These switches in conjunction with the associated gate circuitry are used to determine the modulus of this programmable counter. If both switches are closed, 110 BAUD is selected, when the 110/150 switch is closed 150 BAUD is selected, when the 110/300 switch is closed 300 BAUD is selected; and when both switches are open 1200 BAUD is selected.

As thus seen in FIG. 13, the display portion of the hand-held terminal consists of the data path from the memory output to the display plus the control logic for displaying, scrolling and bell generation. As best seen in FIGS. 13B and 13D, the character generator read-only memory 142 consists of four integrated circuit chips each comprising a read-only memory. One of these read-only memories is for the lower case information, another for the upper case information, another for the symbol number information and another for the cursor generated codes. Each of the read-only memories is capable of providing 32 ASCII character codes. Gates 356, 358, 360 and 362 select the appropriate memory depending upon the code available at the output of the memory shift registers 114. When the most recent character position into which the next character to be placed is available at the output memory, the output will be 0 indicating a space. At this time, flip-flop 364 (see FIG. 13C) synchronizes the cursor and disables the upper three read-only memories; and thus provides for the generation of the cursor pattern on the display. The cursor pattern is a combined function of the states of the side shift keys 26, 27 and 28, the case flip-flip from the transmitter portion, the control flip-flop from the transmitter portion and a combined clear to send and bad shift indication. As can best be seen in FIGS. 13C and 13D, five signals are sent into the cursor ROM 142 which indicate the case, control, clear to send and the side shift key signals from the terminal. These signals are fed into the ROM and determine one of the cursor patterns possible as shown in FIG. 1D. As seen in FIG. 1D, the cursor may indicate NOT CLEAR TO SEND, or possibly no shift with respect to lower case, upper case or control information or either second information levels or third information levels or fourth information levels with respect to upper case, lower case or control code information. Thus these cursors show the complete range of usable combinations of these shift keys, the keyboard case flip-flop, the control flip-flop and the clear to send condition.

The output of the character generators are transferred to the circuitry shown generally in FIG. 18. The buffers shown in FIG. 18A are not presently used in the preferred embodiment of the present invention. The outputs from the character generator are transferred to the circuitry generally shown in FIG. 11.

As best seen in FIGS. 11A and 11B, the signals from the character generators are transferred to 10 five-bit registers 366, 368, 370, 372, 374, 376, 378, 380, 382, and 384. A selector 386 selects one of the 10 characters registers to be loaded with the character generator information depending upon which character is present at the output of the memory. The clock is stopped for two pulses during the time that these registers are being loaded in order to allow the read-only memory character generator to settle to a steady state condition. The registers are loaded one clock pulse after the character is available at the output of the memory in order to allow for synchronization. The characters are loaded from left to right, that is from register 366 to register 384 and the output of these registers is transferred to column drivers 388, 390, 392, 394, 396, 398, 400, 402, 404, 406, 408, 410 and 412 (see FIGS. 11C and 11D).

As best seen in FIG. 10, read line register 140 normally equals the same number as the write line register 244 when loading the bottom line of the display and is decremented to point to the previous line when showing the top line of the display 25 (see FIG. 1A). In this way the most recent data is presented on the bottom line 23 of the display.

Alternately the read line register 140 may be decremented or incremented and may be also left to reside at a particular point in the memory by alternate incrementation and decrementation thus providing for the display of any two lines of memory.

As best seen in FIG. 10C, the read line comparator 136 interconnects with the read line register 140. This comparator provides a high output on the RLR = LC line 144 when the read line register is equal to the line counter. This signal is then used to load the display. Thus, once every memory cycle the RLR = LC signal is enabled.

As best seen in FIG. 6 and FIG. 16, the row counter 146 divides the RLR = LC signal 144 by 16. This in turn points to the rows of the display. This counter is clocked by the read line register equal to line counter signal 144 which occurs once every shift register memory cycle as this memory cycle counts up to 7. The output of this counter is decoded by the row decoder 152 shown generally in FIG. 16B. The 14 resultant lines, only one of which is active or enabled at any particular time, drive the rows of the display through Darlington transistor pairs as shown in FIG. 16C and generally indicated as 414. Gates 416, 418, and amplifier 420, as shown in FIG. 16A, select which line of the two lines of the display is being shown information and also provides for the blanking of the display during loading and when the unit is off or in the auto dim mode. This mode causes the automatic dimming of the display if no information is received or generated on the display for approximately five minutes. The electronics utilized in the auto dim counter is best seen in FIG. 17A; however, in the present version of the invention, this feature has been eliminated.

Figure 17A:
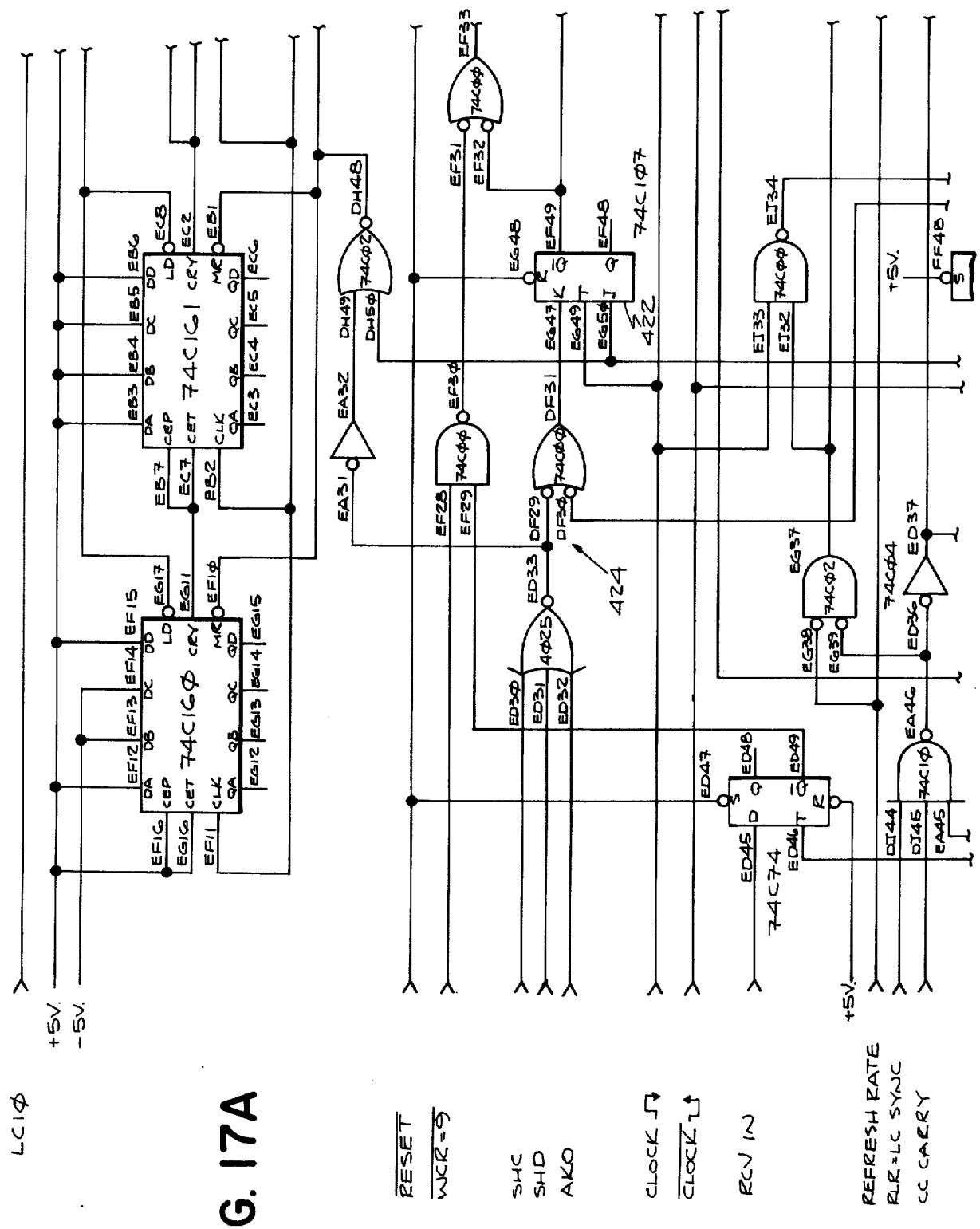
Figure 17B:
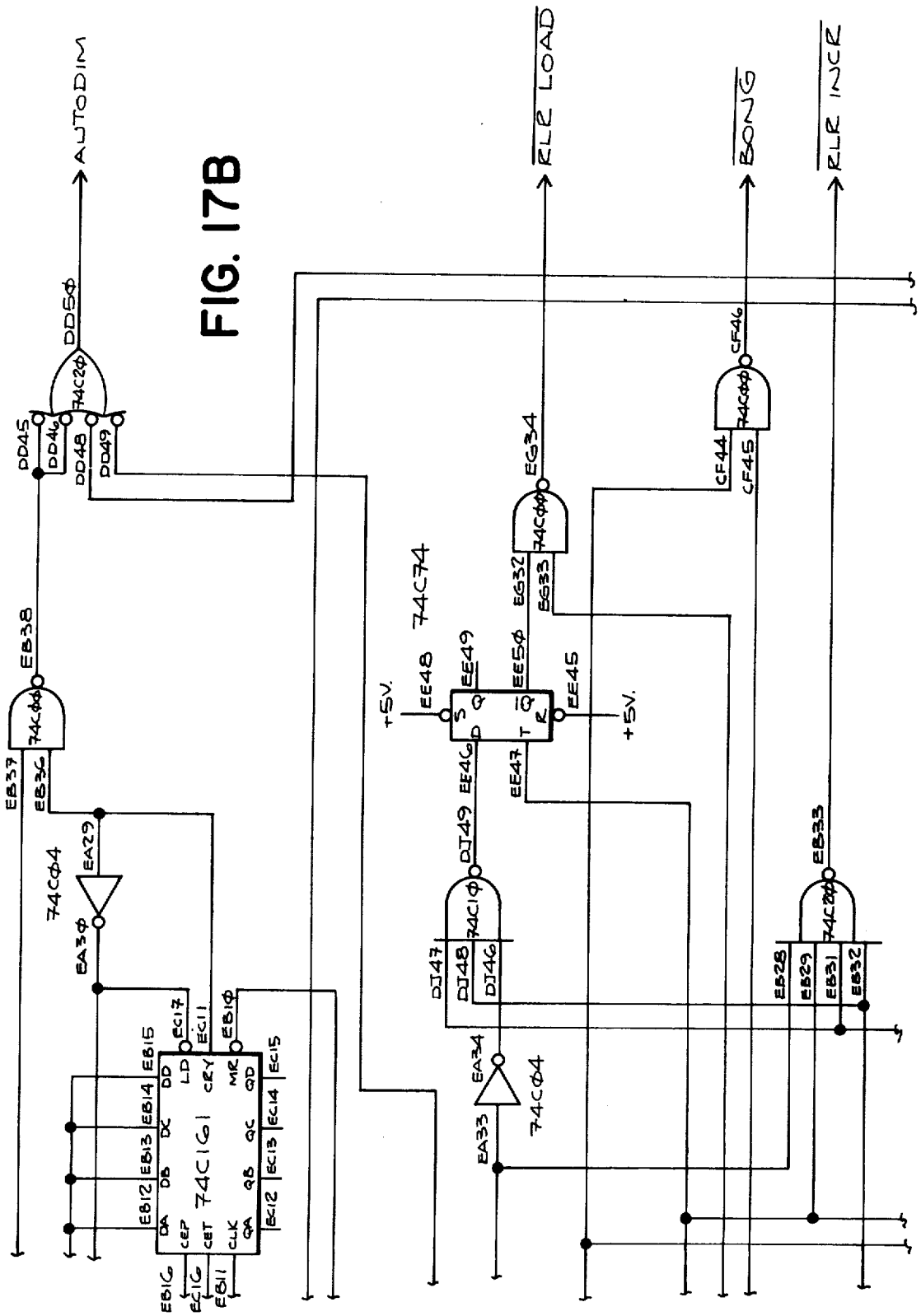

Also seen in FIG. 17A is the NOW flip-flop 422 and associated gating generally shown as 424. The NOW flip-flop is set to NOW whenever any key stroke from either the keyboard 24 or side shift key 26, 27 or 28 is received by the internal circuitry of the hand-held terminal. The flip-flop is reset when a scroll command is received from either the scroll up or scroll down position of scroll switch 30. When in the NOW MODE, the scroll UP signal is disabled, thus preventing the display from moving into the future by passing the most recent line. When the scroll is activated in the DOWN configuration, the scroll DOWN signal clears the NOW flip-flop. When the NOW flip-flop is clear, the signal which ordinarily loads the read line register from the write line register is disabled and an increment signal is instituted. Thus, the read line register is broken free from the write line register and stays at wherever it is set. Each subsequent scroll DOWN command disables the increment signal for one clock period, thus providing for the read line register to slowly decrement back into memory.

When the scroll UP command is transmitted, the decrement pulse is disabled for one clock time, thus allowing the read line register to increment in value. At any time, when the scroll key is activated, any depression of any key on the keyboard 24 will bring the NOW flip-flop 422 into the set condition, which will allow the next pulse to load the read line register directly from the write line register; thus bringing the most recent data onto the display. The read line register load increment and decrement signals only occur at the end of 7 display cycles, which is enough to display one entire line of characters. Thus, normal operation of the display is for the read line register to stay constant for seven complete memory cycles filling the 7 rows of display in order. When the read line register is incremented, decremented, or loaded, the register will stay where it is for another seven memory cycles while the other line of display is being presented. While in the NOW mode, the read line register is alternately loaded and decremented to provide for the displaying of the most recent and second most recent lines; while not in the NOW mode, the read line register is alternately incremented and decremented to provide display of the line selected and the one previous in memory.

During scrolling, one increment and decrement pulse is dropped to provide for moving the position of the scroll information.

Figure 17C:
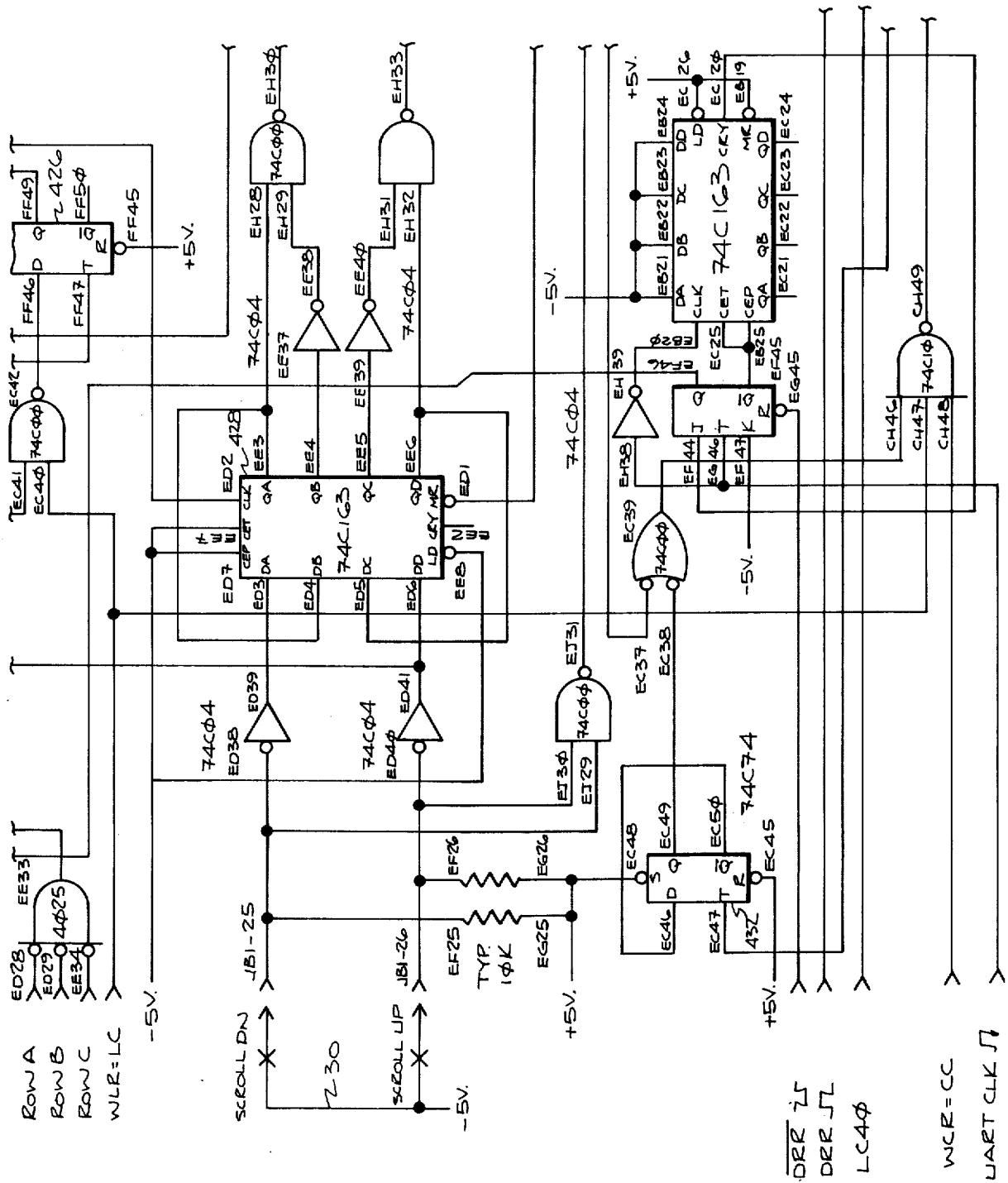

As best seen in FIG. 17C, a flip-flop 426 is used to determine that a NOW line is present. If a scrolling is in the UP position and moves up to the most recent line in the display, this flip-flop is cleared, which then forces the NOW flip-flop 422 (see FIG. 17A) to be set. Thus, a scrolling into NOW provides for the setting of the NOW flip-flop.

Figure 17D:
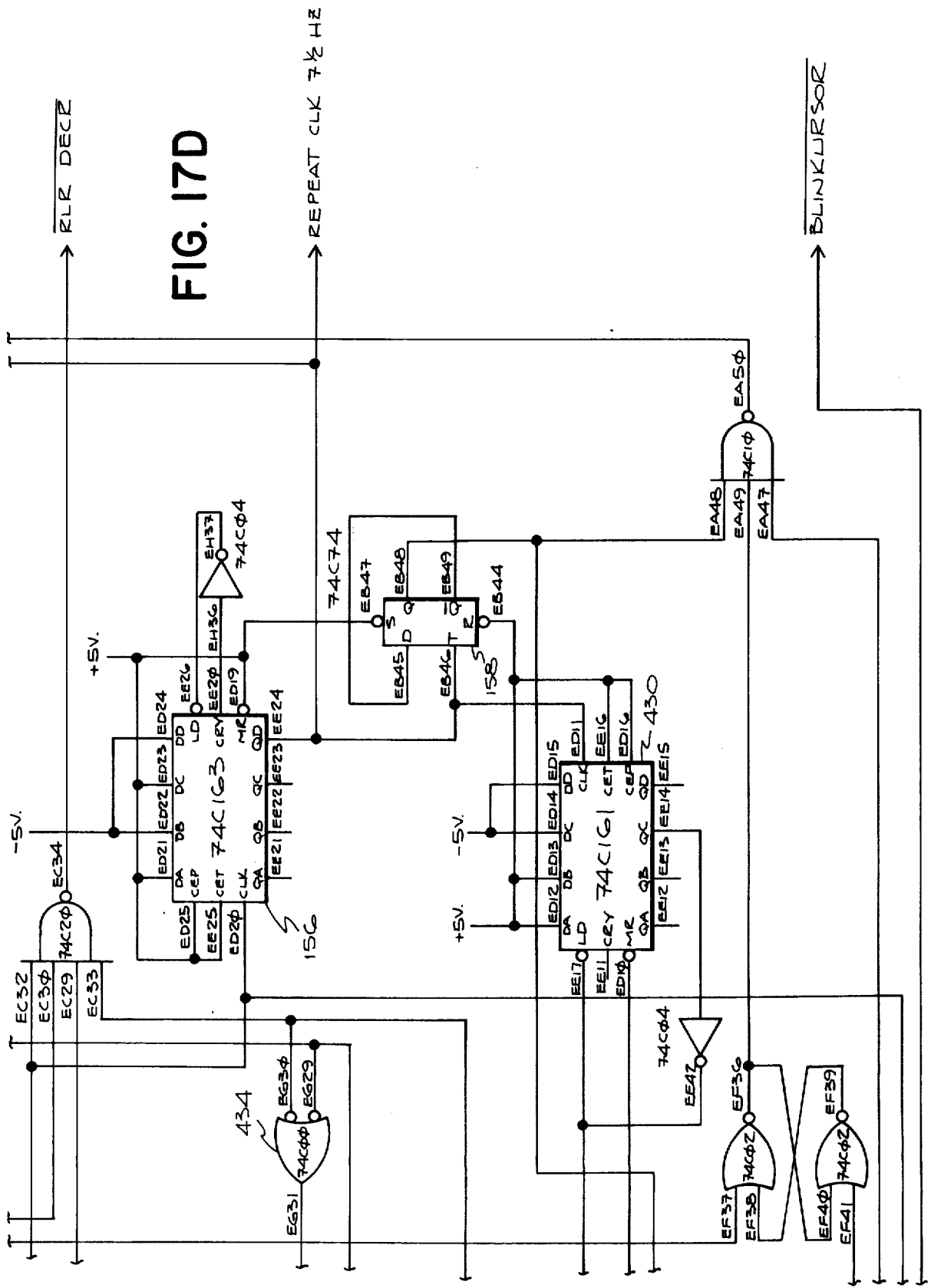

As best seen in FIG. 17C, a buffer 428 is utilized that synchronizes and buffers the scroll switch 30 and provides for a single pulse output on depression of the scroll switch in either the UP or DOWN mode. As seen in FIG. 17D, a repeat counter 430 provides for the automatic scrolling if the scrolling switch is held depressed for approximately one second. This automatically repeats the scrolling at a 3¾ per second rate. Once the scroll switch 30 is placed into the normal mode, this repeat counter is immediately cleared, thus resetting the delay.

As best seen in FIG. 6 and FIG. 17D, a divide by 11 counter 156 generates a 7½ hertz square wave from the clock information inputted to it. The flip-flop 158 interconnecting with the divide by 11 counter is the divide by 2 counter also shown in FIG. 6. This divide by 2 counter thus generates the 3¾ hertz signal used in the auto repeat mode of the scroll switch.

As best seen in FIG. 17C, flip-flop 432 is also a divide by 2 counter that generates the cursor blink frequency as best seen in FIG. 17D. This blink frequency is also at approximately 3¾ hertz. As noted earlier, its cursor always blinks or modulates the light intensity in order not to be confused with one of the display characters of display 22.

As best seen in FIG. 17D, a NOR gate 434 is utilized so as to reset whenever a character is received and to set or enable whenever NOW flip-flop 422 is set and held set during the duration of the NOW flip-flop. This provides for blinking or modulation of the entire display when data has come in and the NOW flip-flop is not set to warn the user that data is present in memory. Returning to the NOW state will clear the blinking condition.

As best seen in FIG. 18A, flip-flop 436 is utilized to provide synchronization of the RLR=LC signal to the logic portion of the hand-held terminal so as to allow for the display in the character generator.

As best seen in FIGS. 18C and 18D, the bell generation logic comprises logic gates and one integrated circuit. More particularly, a bell signal is generated via the gates generally shown in conjunction with integrated circuit 440 and OR gate 422 when one of the following circumstances occurs:

1. The hand-held terminal is in the LINE mode and a keyboard action has been initiated, but there is a NOT CLEAR TO SEND signal from the interconnected device;

2. The side shift keys 26, 27 and 28 are in an illegal state; that is, more than one key is depressed simultaneously and a keyboard character generation has been attempted;

3. An illegal code is attempted to be generated from keyboard 24;

4. The scroll is attempting to move past the most recent line in the future direction or tending to move backward beyond the oldest line in the memory;

5. An ASCII bell code octal (octal 007) is received and decoded by the receiver.

In any of these five instances, the counter 440 is immediately reset. This, in turn, turns on the audible alarm which is gated with a frequency of roughly 1.2 kilohertz to ring the bell which is actually a small speaker 96 (see FIG. 5). The counter 440 turns the alarm 96 off via information received from refresh signal 444 shown in FIGS. 18C and 18D. The counter counts 10 of these pulses and when 10 has been reached, the alarm is shut off. Thus, a minimum of 120 milliseconds is obtained no matter how short the bell condition lasts. Also, for a condition which is persistent; such as scroll action attempting to move forward beyond the NOW line, the bell will ring continuously and will stop 120 milliseconds after the condition terminates.

As best seen in FIGS. 1A, 1B, and 1C, the keyboard configuration of the present invention allows the generation of all the 128 ASCII characters, including CONTROL codes or characters as well as "break." Key switches 38, 61, 31 63, 65, 67, 69, 71, 73, and 75 utilize a similar number configuration and letter configuration as used in present-day touch-tone telephones. The only difference between the indicia shown on these keys and touch-tone keys found on present-day telephones is that over the 1 key, that is key 38, the present invention includes a single and double apostrophe and a symbol; and that over the 0 which is present-day telephones has no other information above it, the present invention includes a the Z, Q, and $ sign.

The philospy for using this configuration for these ten keys is due to the wide familiarity of the touchtone telephone with most potential operators of the hand-held terminal. Such keyboards are, as shown by keys 38, 61, 31, 63, 65, 67, 69, 71, 73, 77, 75 and 79 in FIG. 1A, arranged in a matrix comprising four rows and three columns. In addition, the present invention utilizes keys 77 and 79 to generate additional typewriter punctuation marks including the exclamation, "", the "&"sign, the "="sign, the ","sign, and the ".". Thus, with the ten keys -- 38, 61, 31, 63, 65, 67, 69, 71, 73, 75, 77, and 79 -- a full alphanumeric font is shown. In addition, the present invention utilizes keys 81, 83, 45, and 85, which as shown in FIGS. 1A, 1B, 1C, 3A, 3b, 3C, and 4A comprise a 4 × 1 matrix, to allow the generation of other punctuation marks as well as marks which may be used in a standard typewriter mode, as well as for the generation of symbols which denote various arithmetic operations. Thus, as shown in key 85, the "( )" signs may be used in standard typewritten English to denote "( )", whereas with respect to arithmetic operations "( )" may be utilized for the grouping of numbers as well as indicating a multiply operation. Similarly, the "*" shown in key 83 may be used to designate a multiplication operation. The horizontal line shown in key 45 may be used as a dash in generating English information and also may designate a minus arithmetic operation. Similarly, the slanted line in key 81 may indicate a divide operation or may be used in standard English to denote "one of two possibilities." The brackets shown in key 45 may be used in standard English as well as to denote the factoring of components in an arithmetic operation as well as to possibly show a multiplication operation. Thus, these keys allow the operator to generate various English language symbols as well as allowing the operator to generate various arithmetic symbols.

With respect to the arithmetic generation, it is noted that these symbols are located on the left-hand edge of keyboard 24, thus not obscuring the view of these keys when the numeric keys are being used. As best seen in FIGS. 1B, 1C, 3A-3C, and 9A, these keys may be positioned to the left of the telephone keyboard at a distance greater than the distance between adjacent keys of the telephone keyboard. This spacing facilitates proper utilization of keyboard 24. This configuration of the arithmetic operators is somewhat different from most present-day calculators.

In addition, the present invention includes keys 36, 39, 41 and 43, which allow for the generation of various control information as well as for the transferral of the other keys from lower case mode to upper case mode, and vice versa. More particularly, key 36, when depressed without depressing any of the side keys 26, 27 or 28, causes the next depressed key to generate a CONTROL code. Thus, the keys above and to the right of key 36 may then be transformed to generate control codes or characters. In the preferred embodiment, these control characters are ASCII control characters. In addition, the depression of key 36 while depressing side key 27 causes the case of the alphanumeric information shown on the keyboard to be transferred to the opposite case. Thus, for example, if the present invention is in the upper case mode, as determined by the switch on the back of the hand-held terminal as part of the array of switches 34, the depression of the CASE key 36 while depressing shift level control key 27, causes the next depressed key of the keyboard to be in the lower case alphanumeric configuration. After this depression of the other keys, the CASE reversal is eliminated and the unit reverts back to the original alphanumeric case. If it is desired to maintain the generated information to be in the opposite case, then a CASE LOCK position of key 36 may be generated by first depressing side key 26 and then depressing key 36. If this is desired to be unlocked, side key 28 is depressed along with key 36.

As best seen in FIGS. 1A,-1C, 3A-3C, and 4A, key 36 is placed to the lower left of information entry keyboard 24, and as shown in FIGS. 1B-1C, 3A, 3C, and 4A, is spaced from adjacent keys 85 and 39, at a distance greater than the distance between adjacent keys of the telephone keyboard as well as the distance between adjacent keys of control keys 39, 41 and 43 and arithmetic operator and punctuation indicia keys 81, 83, 45, and 85. This spacing facilitates proper actuation of key 36.

Keys 39, 41 and 43 generate non-alphanumeric characters as well as the "break" signal. Thus, key 39 when depressed without depressing any of the side keys causes a line feed character code to be generated. Similarly, when key 41 is depressed without depressing the side keys, a SPACE ASCII code is generated; a CARRIAGE RETURN signal is generated when key 43 is depressed. These signals are commonly used to move the type head of a normal typewriter and are therefore referred to as TYPE HEAD control signals. The other controls possibly generated by keys 39, 41 and 43 are interpreted by various interconnected devices to cause different functions. Thus, one particular interconnected device, when the NUL position of key 41 is generated, would erase the previously transmitted character to this interconnected device from the hand-held terminal.

The generation of the "break" mode causes the hand-held terminal to be opened from the interconnected device. It is thus a different type of code than all the other codes generated, since no particular code is actually generated since the hand-held terminal is simply transferred into a zero mode. This condition remains so long as the "break" signal is depressed via key 41. The other control codes that are generated via keys 39, 41, and 43 have specific control functions with respect to specific interconnected devices.

As best seen in FIGS. 1A-1C, 3A-3C and 4A, keys 39, 41 and 43 are arranged in a one by three matrix and are spaced below the lowest row of keys 77, 75 and 79 of telephone keyborad keys 38, 61, 31, 63, 65, 67, 69, 71, 73, 77, 75 and 79 at a distance greater than the distance between rows of the telephone keys. This additional distance facilitates proper actuation of keys 39, 41 and 43.

The generation of lower case alphanumeric information is shown best in FIG. 1C. As shown in FIG. 1C, the information generated by depression of the keys when in the lower case mode is basically to transform the upper case characters to lower case characters. However, as mentioned earlier, some of the symbols generated are different when in the lower case mode. Thus, with respect to key 45, the brackets in the upper case mode are changed to braces, while the back slash in the upper case mode is changed to a vertically slashed line. Similarly, in the upper case mode, key 38, when in the third information level, generates a whereas in the lower case alphanumeric mode of transmission, the third information level of causes an accent grave to be generated. It should also be noted that in either the upper or lower case mode, the fourth information level with respect to key 81 is a "~" or an approximation sign which is not an upper case ASCII character. This character is included in order to allow for the showing of approximation symbols.

It is thus apparent that the keyboard utilized in the present invention has a key arrangement which is novel and unobvious in its ability to generate all the ASCII characters alphanumeric as well as control -- as well as allowing the generation of control characters via depressing one key as well as allowing the change of the alphanumeric case from lower to upper or vice versa via depressing one key of the keyboard. The generation of control signals may also occur with respect to several keys by merely depressing these keys. These control codes are the more common codes, especially the typehead movement codes commonly used in present-day teletypewriters. In addition, the present keyboard allows for the generation of arithmetic operations in conjunction with the numbers and letters shown on the rest of the keys of the keyboard in such a manner that the generation of algebraic or arithmetic equations is easily obtainable and readily visible.

Thus, the present invention provides a hand-held terminal that incorporates many features which allow the terminal to be easily operated. The present invention not only transmits information to interconnected devices, but also receives information back from these devices and is able to store up to 1000 characters of information within its memory. The selectable parameters on the present invention make the hand-held terminal completely compatible with any interconnected device which is able to communicate with standard teletypewriters. In addition, the present invention incorporates modulation features and scrolling features which allow the operator to view past memory lines as well as to indicate to the operator while viewing past memory lines, that present information is being received by the hand-held terminal.

Having described the invention, what is claimed is:

1. An improved interactive terminal for communication with external data processing means, having:
   A. an alphanumeric display for visually presenting information received and transmitted;
   B. a memory communicating with said display for storage and processing for display at least a portion of the information received and transmitted;
   C. at least N-1 shift level control keys operable and holdable by the user's first hand for selecting any of N information levels. N being an integer greater than 1;
   D. an information entry keyboard operable by the user's second hand wherein each of a plurality of the keys of said keyboard represents the transmission of N different units of information, each unit of information corresponding to a different information level;
   E. information transmission means communicating with said keyboard and shift level control keys for transmitting selected keyboard information to at least said external data processing means;
   F. information receiving means communicating with said external data processing means and said memory for receipt of information; and
   G. housing means dimensioned for the palm of the user's first hand having a front face dimensioned for mounting said keyboard, and at least one side dimensioned for mounting said shift level control keys,
   whereby the fingers of the user's first hand select desired shift level control keys and the user's second hand selects the desired keys of the information entry keyboard; wherein the improvement comprises:
   H. light modulation means communicating with said alphanumeric display for repetitively varying the amplitude of the light intensity of the display.

2. A terminal as defined in claim 1, wherein said light modulation means are activated when said information receiving means is receiving information from an interconnected device and said display is displaying information previously stored in memory; thereby indicating to the user that information is being received, which otherwise would be undetectable to the user.

3. An improved interactive terminal for communication with external data processing means, having:
   A. an alphanumeric display for visually presenting information received and transmitted;
   B. a memory communicating with said display for storage and processing for display at least a portion of the information received and transmitted;
   C. at least N-1 shift level control keys operable and holdable by the user's first hand for selecting any one of N information levels, N being an integer greater than 1;
   D. an information entry keyboard operable by the user's second hand wherein each of a plurality of the keys of said keyboard represents the transmission of N different units of information, each unit of information corresponding to a different information level;
   E. information transmission means communicating with said keyboard and said shift level control keys for transmitting selected keyboard information to at least said external data processing means;
   F. information receiving means communicating with said external data processing means and said memory for receipt of information; and
   G. housing means dimensioned for the palm of the user's first hand having a front face dimensioned for mounting said keyboard, and at least one side dimensioned for mounting said shift level control keys,
   whereby the fingers of the user's first hand select desired shift level control keys and the user's second hand selects the desired keys of the information entry keyboard; wherein the improvement comprises:
   H. cursor generating means communicating with said alphanumeric display and said shift level control keys for indicating the next area of the display where the next unit of information is to be shown when generated by the information entry keyboard, as well as the nature of the unit of information.

4. A terminal as defined in claim 3, wherein said cursor generating means indicates the information level selected by the shift level control keys.

5. A terminal as defined in claim 3, wherein said information entry keyboard represents the transmission of upper and lower case alphanumeric information and wherein the cursor generating means further indicates the generation of upper and lower alphanumeric information.

6. A terminal as defined in claim 3, wherein said cursor generating means further comprises means for modulating the display of the generated cursor on said alphanumeric display.

7. An improved interactive terminal for communication with external data processing means, having:
   A. An alphanumeric display comprising at least two lines, each line having a predetermined number of alphanumeric characters generating generting areas for visually presenting information received and transmitted;
   B. a memory communicating with said display for storage and processing for display at least a portion of the information received and transmitted;
   C. at least N-1 shift level control keys operable and holdable by the user's first hand for selecting any one of N information levels, N being an integer greater than 1;
   D. an information entry keyboard operable by the user's second hand wherein each of a plurality of the keys of said keyboard represents the transmission of N different units of information, each unit of information corresponding to a different information level;

E. information transmission means communicating with said keyboard and said shift level control keys for transmitting selected keyboard information to at least said external data processing means;

F. information receiving means communicating with said external data processing means and said memory for receipt of information; and G. housing means dimensioned for the palm of the user's first hand having a front face dimensioned for mounting said keyboard, and at least one side dimensioned for mounting said shift level control keys, whereby the fingers of the user's first hand select desired shift level control keys and the user's second hand selects the desired keys of the information entry keyboard; wherein the improvement comprises:

H. means interconnected with the alphanumeric display and the memory for causing the display of consecutive alphanumeric characters equal to a number less than one plus the number of characters in each line of the alphanumeric display on only one line of said alphanumeric display at any particular time.

8. An improved interactive terminal as defined in claim 7, wherein the means for displaying consecutive characters on one line of the alphanumeric display is selectable by the user by a manually operable switch interconnected with said consecutive character displaying means.

9. An information signal generator for generating signals corresponding to information represented in one of at least four information levels, comprising:

A. shift means operable and maintainable to select any one of said information levels;

B. an information entry keyboard operable to select desirable information, incorporating twelve keys arranged in a four by three matrix wherein each number from 0 to 9 is individually selectable by operation of a corresponding individual key of the twelve keys when the first information level is selected and maintained during said key operation, and wherein the letters from A to Z are divided into first, second and third mutually exclusive groups, each group having less than thirteen letters, wherein each letter of the first group of letters is individually selectable by operation of a corresponding individual key of said keyboard when the second information level is selected and maintained during said key operation, wherein each letter of the second group of letters is individually selectable by operation of a corresponding individual key of said keyboard when the third information level is selected and maintained during said key operation, and wherein each letter of the third group of letters is individually selectable by operation of a corresponding individual key of said keyboard when the fourth information level is selected and maintained during said key operation;

C. a signal-generating circuit responsive to the selected and maintained operation of the shift means and the corresponding selection of a key of the information entry keyboard for generating a signal corresponding to the information represented by operation of the selected key of the keyboard while an information level has been selected by operation of the shift means; and D. a mode-select means operable to select at least one alteration of at least a portion of the information represented by said keyboard when said keyboard is operated during the selection of at least one information level, wherein said signal generating circuit is further responsive to operation of said mode-select means to alter the signal corresponding to the information represented by operation of the selected key of the keyboard while an information level has been selected by operation of the shift means.

10. An information signal generator as defined in claim 9, wherein said signal generating circuit generates the altered signal only in response to selection of the next subsequently operated key of said keyboard.

11. An information signal generator as defined in claim 10, wherein said mode-select means comprises a key.

12. An information-signal generator as defined in claim 11, wherein the mode-select key is positioned to the lower-left of the keyboard.

13. An information-signal generator as defined in claim 12, wherein the mode-select key is diagonally spaced from the keyboard at a distance greater than the distance between diagonally adjacent keys of said keyboard.

14. An information signal generator as defined in claim 9, wherein said mode-select means represents up to four separately selectable alterations of said information represented by said keyboard.

15. An information signal generator as defined in claim 14, wherein said mode-select means incorporates a key and wherein the separately selectable alterations represented by the mode-select key are determined by the information level selected and maintained by the shift means while the mode-select key is operated.

16. An information-signal generator as defined in claim 15, wherein two of the separately selectable keyboard alterations represented by the mode-select key are:
1. ASCII control codes
2. lower case letters from A through Z.

17. An information signal generator as defined in claim 9, wherein said twelve keys comprise a standard pushbutton telephone keyboard.

18. An information signal generator as defined in claim 17, wherein the key representing 0 further incorporates representation of Z, $, and Q and wherein each of the symbols is individually selectable by operation of said key when the second, third, and fourth information level is respectively selected and maintained during said key operation, wherein said 1 of said standard keyboard further incorporates the representation of ', and ", wherein each symbol is individually selectable by operation of said key when the second, third, and fourth information level is respectively selected and maintained during said key operation; and wherein the two keys positioned on opposite sides of the key representing 0, Z, $, and Q each represent additional punctuation symbols selectable by operation of each of said two keys when the first, second, third or fourth information level is respectively selected and maintained during said key operation.

19. An information signal generator as defined in claim 9, wherein said keyboard further incorporates additional keys representing typewriter head controls, including:
1. a first additional key representing a carriage return control,
2. a second additional key representing a space control, and
3. a third additional key representing a line feed control.

20. An information-signal generator as defined in claim 19, wherein said first, second, and third additional keys of said keyboard are positioned in a one by three matrix below the twelve keys arranged in a four by three matrix.

21. An information-signal generator as defined in claim 20, wherein the first, second, and third additional keys are positioned below said twelve keys at a distance greater than the distance between adjacent rows of said twelve keys arranged in said four by three matrix.

22. An information signal generator as defined in claim 9, wherein said keyboard further incorporates additional keys representing arithmetic operators, including:
1. a first additional key representing addition,
2. A second additional key representing subtraction,
3. a third additional key representing multiplication, and
4. a fourth additional key representing division.

23. An information signal generator as defined in claim 22, wherein said first, second, third and fourth additional keys of said keyboard are positioned in a four by one matrix to the left of the twelve keys arrayed in said four by three matrix.

24. An information signal generator as defined in claim 23, wherein the first, second, third, and fourth additional keys are positioned to the left of said twelve keys at a distance greater than the distance between the adjacent columns of said twelve keys arranged in said four by three matrix.

25. An information signal generator as defined in claim 24, wherein non-alphanumeric typewriter symbols are divided into first, second and third mutually exclusive groups, each group having less than five symbols, wherein each symbol of the first group of symbols is individually selectable by operation of a corresponding individual key of said additional keys when the second information level is selected and maintained during said key operation, wherein each symbol of the second group of symbols is individually selectable by operation of a corresponding individual key of said additional keys when the third information level is selected and maintained during said key operation, and wherein each symbol of the third group of symbols is individually selectable by operation of a corresponding individual key of said additional keys when the fourth information level is selected and maintained during said key operation.

26. An information signal generator for generating signals corresponding to information represented in one of at least four information levels, comprising:
A. a shift means operable and maintainable to select any one of said information levels;
B. an information entry keyboard having less than twenty-one keys operable to select desired information, incorporating:
1. a first group of twelve keys arranged in a four by three matrix wherein each number from 0 to 9 is individually selectable by operation of a corresponding individual key of the twelve keys when the first information level is selected and maintained during said key operation and wherein up to thirty-six symbols including the letters from A to Z are divided into first, second, and third mutually exclusive groups each group having less than 13 symbols, wherein each symbol of the first group of symbols is individually selectable by operation of a corresponding individual key of said keyboard when the second information level is selected and maintained during said key operation, wherein each symbol of the second group of symbols is individually selectable by operation of a corresponding individual key of said keyboard when the third information level is selected and maintained during said key operation, and wherein each symbol of the third group of symbols is individually selectable by operation of a corresponding individual key of said keyboard when the fourth information level is selected and maintained during said key operation;
2. a second group of at least three keys representing typewriter head controls, arranged in a row below said first group of keys, at a distance from said first group of keys greater than the distance between adjacent keys in said first group of keys, wherein each typewriter head control is selectable by operation of a corresponding individual key of said second group of keys when the first information level is selected and maintained during said key operation, wherein a first key of said group represents a carriage return control, and second key of said group represents a space control, and a third key of said group represents a line feed control; and
3. a third group of at least four keys representing arithmetic operators arranged in a column to the left of said first group of keys, at a distance from said first group of keys greater than the distance between adjacent keys in said first group of keys, wherein the arithmetic operations of addition, subtraction, multiplication, and division are individually selectable by operation of a corresponding individual key of said third group when the first information level is selected and maintained during said key operation; and
c. a signal generating circuit responsive to the selected and maintined operation of the shift means and the corresponding selection of a key of the information entry keyboard for generating a signal corresponding to the information represented by operation of the selected key of the keyboard while an information level has been selected by operation of the shift means.

27. An information signal generator as defined in claim 26, wherein a plurality of control symbols are divided into first, second, and third mutually exclusive control groups, each control group having less than four symbols, wherein each symbol of said first control group of symbols is individually selectable by operation of a corresponding individual key of said second group of keys when the secod information level is selected and maintained during said key operation, wherein each symbol of the second control group of symbols is individually selectable by operation of a corresponding individual key of said second group of keys when the third information level is selected and maintained during said key operation, and wherein each symbol of said third control group of symbols is individually selectable by operation of a corresponding individual key of said second group of keys when the fourth information level is selected and maintained during said key operation; and wherein non-alphabetic typewriter symbols are divided into first, second, and third mutually exclusive typewriter symbol groups, each group having less than five symbols, wherein each symbol of the first typewriter symbol group is individually selectable by operation of a corresponding individual key of said third group of keys when the second information level is selected and maintained during said key operation, wherein each symbol of the second typewriter symbol group is individually selectable by operation of a corresponding individual key of said third group of keys when the third information level is selected and maintained during said key operation, and wherein each symbol of the third typewriter symbol group is individually selectable by operation of a corresponding individual key of said third group of keys when the fourth information level is selected and maintained during said key operation.

28. An information signal generator for generating signals corresponding to information represented in one of at least four information levels, comprising:
  A. a shift means operable and maintainable to select any one of said information levels;
  B. an information entry keyboard operable to select desired information, incorporating:
    1. a first group of twelve keys arranged in a four by three matrix wherein each number from 0 to 9 is individually selectable by operation of a corresponding individual key of the twelve keys when the first information level is selected and maintained during said key operation and wherein up to 36 symbols including the letters from A to Z are divided into first, second, and third mutually exclusive groups each group having less than 13 symbols, wherein each symbol of the first group of symbols is individually selectable by operation of a corresponding individual key of said keyboard when the second information level is selected and maintained during said key operation, wherein each symbol of the second group of symbols is individually selectable by operation of a corresponding individual key of said keyboard when the third information level is selected and maintained during said key operation, and wherein each symbol of the third group of symbols is individually selectable by operation of a corresponding individual key of said keyboard when the fourth information level is selected and maintained during said key operation;
    2. a second group of at least three keys representing typewriter head controls, wherein each typewriter head control is selectable by operation of a corresponding individual key of said second group of keys when the first information level is selected and maintained during said key operation, wherein a first key of said group represents a carriage return control, and second key of said group represents a space control, and a third key of said group represents a line feed control; and
    3. a third group of at least four keys representing arithmetic operators, wherein the arithmetic operations of addition, subtraction, multiplication, and division are individually selectably by operation of a corresponding individual key of said third group when the first information level is selected and maintained during said key operation;
  C. a signal generating circuit responsive to the selective and maintained operation of the shift means and the correspnding selection of a key of the information entry keybord for generating a signal corresponding to the information represented by operation of the selected key of the keyboard while an information level has been selected by operation of the shift means; and
  D. a mode-select key operation to select up to four separately selectable alterations of said information represented by said keyboard when said keyboard is subsequently operated during the selection of at least one of said four information levels, wherein the separately selectable alterations represented by the modeselect key are determined by the information level selected and maintained by the shift means while the mode-select key is operated and wherein said signal generating circuit is further responsive to operation of said mode-select key and said shift means to alter the signal corresponding to the information represented by subsequent operation of the selected key of the keyboard while an information level has been selected by operation of the shift means.

29. An information signal generator for generating signals corresponding to information represented in one of at least four information levels, comprising:
  A. shift means operable and maintainable to select any one of said information levels;
  B. an information entry keyboard operable to select desired information, incorporating:
    1. a first group of twelve keys arranged in a four by three matrix wherein each number from 0 to 9 is individually selectable by operation of a corresponding individual key of the twelve keys when the first informtion level is selected and maintained during said key operation, and wherein up to 36 symbols including the letters from A to Z are divided into first, second, and third mutually exclusive groups, each group having less than 13 symbols, wherein each symbol of the first group of symbols is individually selectable by operation of a corresponding individual key of said keyboard when the second information level is selected and maintained during said key operation, wherein each symbol of the second group of symbols is individually selectable by operation of a corresponding individual key of said keyboard when the third information level is selected and maintained during said key operation, and wherein each symbol of the third group of symbols is individually selectable by operation of a corresponding individual key of said keyboard when the fourth information level is selected and maintained during said key operation;
    2. a second group of three keys arranged in a 1 by 3 matrix and spaced below the twelve keys arranged in the 4 by 3 matrix, wherein the typewriter head controls of "LINE FEED", "SPACE", and "CARRIAGE RETURN" are individually selectable by operation of a corresponding individual key of said second group of keys when the first information level is selected and maintined during said key operation, and wherein a plurality of control symbols are divided into first, second, and third mutually exclusive control groups, each control group having less than four symbols, wherein each symbol of said first control group of symbols is individually selectable by operation of a corresponding individual key of said second group of keys when the second information level is selected and maintained during said key operation, wherein each symbol of the second control group of symbols is individually selectable by operation of a corresponding individual key of said second group of keys from the third information level is selected and maintained during said key operation, and wherein each symbol of the third control group of symbols is individually selectable by operation of a corresponding individual key of said second group of keys when the fourth information level is selected and maintained during said key operation;

3. a third group of four keys arranged in a 4 by 1 matrix and positioned to the left of the twelve keys arranged in the 4 by 3 matrix at a distance greater than the distance between the adjacent columns of said twelve keys wherein the arithmetic operations of addition, subtraction, multiplication, and division are individually selectable by operation of a corresponding individual key of said third group of keys, and wherein nonalphabetic typewriter symbols are divided into first, second, and third mutually exclusive typewriter symbol groups, each group having less than five symbols, wherein each symbol of the first typewriter symbol group is individually selectable by operation of a corresponding individual key of said third group of keys when the second information level is selected and maintained during said key operation, wherein each symbol of the second typewriter symbol group is individually selectable by operation of a corresponding individual key of said third group of keys when the third information level is selected and maintained during said key operation, and wherein each symbol of the third typewriter symbol group is individually selectable by operation of a corresponding individual key of said third group of keys when the fourth information level is selected and maintained during said key operation; and 4. a mode-select key diagonally positioned to the lower left of the first group of twelve keys arranged and spaced therefrom at a distance greater than the distance between diagonally adjacent keys of said first group of twelve keys, wherein said key is operable to select up to four separately selectable alterations of said information represented by said first, second, and third group of keys when a key of said groups of keys is subsequently operated during the selection of at least one of said four information levels, wherein the separately selectable alterations represented by the mode-select key are determined by the information level, selected and maintained by the shift means while the mode-select key is operated; and C. a signal generating circuit responsive to the selected and maintained operation of the shift means and the corresponding selection of a key of the first, second, and third group of keys of said keyboard for genrating a signal corresponding to the information represented by operation of the selected key of the first, second, and third groups of keys while an information level has been selected by operation of the shift means, and wherein said signal generating circuit is further responsive to operation of said mode-select key and said shift means to alter the signal corresponding to the information represented by subsequent operation of the selected key of the first, second, and third groups of keys of said keyboard while an information level has been selected by operation of the shift means.

30. An improved interactive terminal for communication with external data processing means, having:
A. an alphanumeric display for visually presenting information received and transmitted;
B. a memory communicating with said display for storage and processing for display at least a portion of the information received and transmitted;
C. at least N-1 shift level control keys operable and holdable by the user's first hand for selecting any one of N information levels, N being an integer greater than 1;
D. an information entry keyboard operable by the user's second hand wherein each of a plurality of the keys of said keyboard represents the transmission of N different units of information, each unit of information corresponding to a different information level;
E. information transmission means communicating with said keyboard and said shift level control keys for transmitting selected keyboard information to at least said external data processing means;
F. information receiving means communicating with said external data processing means and said memory for receipt of information; and
G. housing means dimensioned for the palm of the user's first hand having a front face dimensioned for mounting said keyboard, and at least one side dimensioned for mounting said shift level control keys, whereby the fingers of the user's first hand select desired shift level control keys and the user's second hand selects the desired keys of the information entry keyboard; wherein the improvement comprises:
H. a control key of said information entry keyboard representing an alteration in the information represented by at least one of the remaining keys of the information entry keyboard in at least one of the N selectable information levels.

31. A terminal as defined in claim 30, whereby said altered information representation remains for one depression of one of the remaining keys of the information entry keyboard.

32. An interactive terminal as defined in claim 30, wherein a second plurality of keys of said information entry keyboard are alterable by the control key and represent an upper case alphanumeric font when the control key is not depressed, and represent a lower case alphanumeric font following depression of said control key.

33. An interactive terminal as defined in claim 30, wherein a second plurality of keys of said information entry keyboard are alterable by the control key and represent control codes following depression of said control key.

34. A terminal as defined in claim 33, wherein the keys of said information entry keyboard represent the entire font of the ASCII code.

35. A terminal as defined in claim 34, wherein at least one of said keys of said information entry keyboard represents a "break" function.

36. An interactive terminal as defined in claim 30, wherein said control key represents up to N alterations in the information represented by at least one of the remaining keys of the information entry keyboard, wherein each of the N alterations represented by the control key correspond to one of the N information levels selectable by the shift level control keys.

37. An interactive terminal as defined in claim 36, wherein:
1. a first of the alterations represented by the control key being the alteration of a second plurality of keys of the information entry keyboard to represent control codes for one depression of any one of the keys of the second plurality of keys following depression of said control key when the first information level is selected;
2. a second of the alterations represented by the control key being the locked alteration of a third plurality of keys of the information entry keyboard to represent the opposite alphanumeric case than what said third plurality of keys previously represented for all subsequent depressions of said keys of the third plurality of keys following depression of said control key when the second information level is selected;
3. a third of the alterations represented by the control key being the alteration of said third plurality of keys of the information entry keyboard to represent the opposite alphanumeric case than what said third plurality of keys represented for one depression of any one of the keys of the third plurality of keys following depression of said control key when the third information level is selected; and
4. a fourth of the alterations represented by the control key being the unlock alteration of said third plurality of keys of the information entry keyboard to represent the previous alphanumeric case than what said third plurality of keys represented subsequent to selection of the second alteration for all subsequent depressions of said keys of the third plurality of keys following depression of the control key when the fourth information level is selected.

38. An interactive terminal as defined in claim 37, further comprising a first manually operable switch interconnected with the information entry keyboard for altering the case of said third plurality of keys of the information entry keyboard for all subseqent depressions of said keys of the third plurality of keys.

39. An interactive terminal as defined in claim 38, further comprising a plurality of manually operable switches interconnected to the information transmission means for specifying the parity of the transmitted information, the rate of transmission of the transmitted information, and the full or half duplex transmission mode, said memory further comprising means for processing for display information transmitted, said means activated when a half duplex transmission mode has been selected.

40. An interactive terminal as defined in claim 39, wherein said housing means has a rear face with a portion thereof dimensioned for mounting said first manually operable switch and said plurality of manually operable switches.

41. An improved interactive terminal as defined in claim 37, further comprising a cursor generating means communicating with said alpha-numeric display, said shift level control keys, and said control key for indicating the next area of the display where the next unit of information is to be shown when generated by the information entry keyboard as well as whether this unit is an upper or lower case alpha-numeric character including the information level selected by the shift level control keys and whether the unit of information is a control code indicating the information level selected by the shift level control key.

42. An improved interactive terminal as defined in claim 41, wherein the cursor generating means also indicates when information may not be transmitted by the terminal to an interconnected external data processing means.

43. An improved interactive terminal for communication with external data processing means, having:
A. an alphanumeric display for visually presenting information received and transmitted;
B. a memory communicating with said display for storage and processing for display at least a portion of information received and transmitted;
C. at least N-1 shift level control keys operable and holdable by the user's first hand for selecting any one of N information levels, N being an integer greater than 1;
D. an information entry keyboard operable by the user's second hand wherein each of a plurality of said keys represents the transmission of N different units of information, each unit of information corresponding to a different information level;
E. information transmission means communicating with said keyboard and said shift level control keys for transmitting selected keyboard information to at least said external data processing means; and
F. information receiving means communicating with an external data processing means and said data memory for receipt of information;
wherein the improvement comprises:
G. improved scroll switching means interconnected with said memory, display, keyboard, and shift level control keys, and incorporating a three-position switch having a DOWN position for sequentially displaying chronologically older information held in said memory, said displaying being automatically repetitiously varied when said switching means is held in the DOWN position for a predetermined length of time, an UP position for sequentially displaying chronologically newer information held in said memory, said displaying being automatically repetitiously varied when said scroll switching means is held in the UP position for a short predetermined length of time, and a NORMAL position for displaying and holding on said display the information in said memory as selected by the DOWN position or UP position and for displaying at least a portion of the currently received information when a shift level control key or key of the information entry keyboard is operated;
H. light modulation means communicating with said alphanumeric display, the information receiving means, and the scroll switching means, for repetitively varying the amplitude of the light intensity of the display when information is received by the terminal while previously stored information is being displayed by the interactive terminal; and l. housing means dimensioned for the palm of the user's first hand having a front face dimensioned for mounting said keyboard, a first side dimensioned for mounting said shift level control keys and a second side for mounting said scroll switching means;

whereby the fingers of the user's first hand select desired shift level control keys, the thumb of the user's first hand selects the position of the scroll switching means, and the user's second hand selects desired keys of the information entry keyboard.

44. An improved interactive terminal as defined in claim 43, wherein the improvement further comprises means interconnected with the alpha-numeric display and the memory for causing the display of consecutive alpha-numeric characters equal to a number less than one plus the number of characters in each line of the alpha-numeric display on only one line of said alpha-numeric display at any particular time.

45. An improved interactive terminal as defined in claim 44, wherein the improvement further comprises a control key of said information entry keyboard representing an alteration in the information represented by at least one of the remaining keys of the keyboard in at least one of the "N" selectable information levels.

46. An improved interactive terminal as defined in claim 45, wherein said altered information representation remains for one depression of one of the remaining keyboard keys.

47. An improved interactive terminal as defined in claim 45, wherein said control key communicates with the shift level control keys and represents up to N alterations in the information represented by at least one of the remaining keys of the information entry keyboard, wherein each of the N alternations represented by the control key corresponds to one of the N information levels selectable by the shift level control keys.

48. An improved interactive terminal as defined in claim 47, wherein:
1. a first of the alterations represented by the control key being the alteration of a second plurality of keys of the information entry keyboard to represent control codes for one depression of any one of the keys of the second plurality of keys following depression of said control key when the first information level is selected;
2. a second of the alterations represented by the control key being the locked alteration of a third plurality of keys of the information entry keyboard to represent the opposite alpha-numeric case than what said third plurality of keys previously represented for all subsequent depressions of said keys of the third plurality of keys following depression of said control key when the second information level is selected;
3. a third of the alterations represented by the control key being the alteration of said third plurality of keys of the information entry keyboard to represent the opposite alpha-numeric case than what said third plurality of keys represented for one depression of any one of the keys of the third plurality of keys following depression of said control key when the third information level is selected; and
4. a fourth of the alterations represented by the control key being the unlock alteration of said third plurality of keys of the information entry keyboard to represent the previous alpha-numeric case than what said third plurality of keys represented subsequent to the selection of the second alteration for all subsequent depressions of said keys of the third plurality of keys following depression of the control key when the fourth information level is selected.

49. An improved interactive terminal as defined in claim 45, further comprisng cursor generating means communicating with said alphanumeric display and said shift level control keys for indicating the next area of the display where the next unit of information is to be shown and the information level selected by the shift level control key.

50. An improved interactive terminal as defined in claim 49, wherein the cursor generating means further comprises additional means communicating with said control key for indicating the nature of the alteration in the information represented by said remaining keys of the information entry keyboard.

51. An improved interactive terminal as defined in claim 44, wherein the improvement further comprises a plurality of manually operable switches interconnected to the information transmission means for specifying the parity of the transmitted information, the rate of transmission of the transmitted information, and the full or half-duplex transmission mode.

52. An improved interactive terminal as defined in claim 51, further comprising an additional manually operable switch interconnected with the information transmission means, information receiving means, and memory for causing the selected information to be stored in the memory and displayed on the alpha-numeric display while preventing said selected information from being transmitted to external data processing means.

53. An improved interactive terminal as defined in claim 51, further comprising lockout means interconnected with the information entry keyboard and the information transmission means for causing the depression of more than one key of the information entry keyboard to represent the transmission of only one unit of information related to only one of said depressed keys.

54. An improved interactive terminal as defined in claim 53, further comprising auto-repeat means interconnected with the information entry keyboard and the information transmission means for causing any key of the information entry keyboard to represent the automatic repetitious transmission of the selected unit of information after said selected key is depressed and held depressed for a short predetermined length of time.

55. An improved interactive terminal as defined in claim 54, further comprising an alarm interconnected with the information receiving means, the information entry keyboard, the shift level control keys, and the scroll swiching means, for generating an audible sound if:
a. a bell code information unit is received from the external data processing means,
b. more than one key of the information entry keyboard is depressed at the same time,
c. more than one key of the shift level control keys is depressed at the same time, and
d. the scroll switching means is in the DOWN position, and the user attempts to display information older than the oldest information in said memory, or the scroll switching means is in the UP position, and the user attempts to display information newer than the most recently received information in said memory.

56. An interactive terminal for communication with external data processing means, comprising:
   A. an alphanumeric display for visually presenting information;
   B. a memory communicating with said display for storage and processing for display at least a portion of information received;
   C. at least N-1 shift level control keys operable and holdable by the user's first hand for selecting any one of N information levels, N being an integer greater than 1;
   D. an information entry keyboard operable by the user's second hand wherein each of a plurality of the keys of said keyboard represents the transmission of N different units of information, each unit of information corresponding to a different information level;
   E. information transmission means communicating with said keyboard and said shift level control keys for transmitting selected keyboard information to at least said external data processing means;
   F. information receiving means communcating with an external data processing means and said memory for receipt of information;
   G. a control key representing an alteration in the information represented by at least one of the keys of the information entry keyboard in at least one of the N selectable information levels; and
   H. housing means dimensioned for the palm of the user's first hand having a front face dimensioned for mounting said keyboard and at least one side dimensioned for mounting said shift level control keys;
whereby the fingers of the user's first hand select desired shift level control keys and the user's second hand selects the desired keys of the information entry keyboard.

57. An interactive terminal as defined in claim 56, whrein said altered information repesentation remains for one depression for one of the information entry keyboard keys and wherein said control key represents up to N alterations in the information represented by at least one of the keys of the information entry keyboard, wherein each of the N alterations represented by the control key correspond to one of the N information levels selectable and maintainable by the shift level control keys.

58. An interactive terminal as defined in claim 57, further comprising scroll switching means interconnected with said memory, alphanumeric display, keyboard, and shift level control keys and incorporating a three-position switch having a DOWN position for sequentially displaying chronologically older information held in said memory, said displaying being automatically repetitiously varied when said switching means is held in the DOWN position for a predetermined length of time, an UP position for sequentially displaying chronologically newer information held in said memory, said displaying being automatically repetitiously varied when said scroll switching means is held in the UP position for a short predetermined length of time, and a NORMAL position for displaying and holding on said display the information in said memory as selected by the DOWN position or UP position and for displaying at least a portion of the currently received information when a shift level control key or key of the information entry keyboard is operated; and wherein said housing means is further dimensioned for mounting said scroll switching means to one side thereof for actuation by the thumb of the user's first hand; whereby the fingers of the user's first hand select desired shift level control keys, the thumb of the user's first hand selects the position of the scroll switching means, and the user's second hand selects desired keys of the information entry keyboard.

59. An interactive terminal as defined in claim 58, further comprising means interconnected with the alphanumeric display and the memory for causing the display of consecutive alphanumeric characters equal to a number less than one plus the number of characters in each line of the alphanumeric display on only one line of said alphanumeric display at any particular time.

60. An interactive terminal as defined in claim 59, further comprising lockout means interconnected with the information entry keyboard and the information transmission means for causing the depression of more than one key of the information entry keyboard to represent the transmission of only one unit of information relating to only one of said depressed keys.

61. An interactive terminal as defined in claim 60, further comprising a plurality of manually operable switches interconnected to the information transmission means for specifying the parity of the transmitted information, the rate of transmission of the transmitted information and the full or half duplex transmission mode, wherein the memory further comprises means for receiving information transmitted when the interactive terminal is in the half duplex transmission mode.

62. An interactive terminal as defined in claim 61, further comprising an additional manually operable switch communicating with the information transmission means and receiving means for disconnecting said means for intercommunicating external data processing means so that information selected by said shift level control keys and information entry keyboard is only displayed on the alphanumeric display and stored in said memory.

63. An interactive terminal as defined in claim 62, further comprising auto repeat means interconnected with the information entry keyboard and the information transmission means for causing any key of the information keyboard to represent the automatic repetitious transmission of the selected unit of information after said selected key is depressed and held depressed for a short predetermined length of time.

64. An interactive terminal as defined in claim 56, further comprising an alarm interconnected with the information receiving means, the information entry keyboard, shift level control keys, and the scroll switching means for generating an audible sound for any of the following conditions if:
   a. a bell code information unit is received from the external data processing means,
   b. more than one key of the information entry keyboard is depressed at the same time,
   c. more than one key of the shift level control keys is depressed at the same time, and
   d. the scroll switching means is in the DOWN position and the user attempts to display information older than the oldest information in said memory or the scroll switching means is in the UP position and the user attempts to display information newer than the newest information held in said memory.

65. An interactive terminal as defined in claim 56, further comprising cursor generating means communicating with alphanumeric display and said shift level control keys for indicating the next area of display where the next unit of information is to be shown when generated by the information entry keyboard, as well as the nature of the unit of information.

66. An interactive terminal as defined in claim 65, wherein said cursor generating means indicates the information level selected by the shift level control keys.

67. An interactive terminal as defined in claim 66, wherein said information entry keyboard represents the transmission of upper and lower case alphanumeric information and wherein the cursor generating means further indicates the generation of upper and lower alphanumeric information, and wherein said cursor generating means further comprises means for modulating the display of the generated cursor on said alphanumeric display.

68. An information signal generator operable in at least four information levels, comprising:

A. shift means operable and maintainable to select any one of said information levels;

B. an information entry keyboard having less than twenty-one keys operable to select desired alphanumeric information, non-alphanumeric typewriter symbols including punctuation symbols and mathematical operators, and typewriter head controls, incorporating:

1. a pushbutton telephone keyboard group of keys wherein each number from 0 to 9 is individually selectable by operation of a corresponding individual key of the telephone keyboard when the first information level is selected and maintained during said key operation; and wherein the key representing 0 further incorporates representation of Z, $, and Q and wherein each of these symbols is individually selectable by operation of said key when the second, third and fourth information level is respectively selected and maintained during said key operation, wherein the letters from A to P and R to Y are divided into first, second, and third mutually exclusive groups, each group having less than 9 letters, wherein each letter of the first group of letters is individually selectable by operation of a corresponding individual key of said telephone keyboard when the second information level is selected and maintained during said key operation, wherein each letter of the second group of letters is individually selectable by operation of a corresponding individual key of said telephone keyboard when the third information level is selected and maintained during said key operation, and wherein each letter of the third group of letters is individually selectable by operation of a corresponding individual key of said telephone keyboard when the fourth information level is selected and maintained during said key operation, and wherein said 1 of said telephone keyboard further incorporates the representation of ', , and ", wherein each symbol is individually selectable by operation of said key when the second, third, and fourth information level is repectively selected and maintained during said key operation, and wherein the two keys positioned on opposite sides of the key representing 0, Z, $, and Q each represent punctuation symbols selectable by operation of each of said two keys when the first, second, third or fourth information level is respectively selected and maintained during said key operation;

2. a second group of additional keys positioned in a 1 × 3 matrix below and at a distance greater than the distance between adjacent rows of said pushbutton telephone keyboard, wherein said additional keys represent typewriter head controls, including:
   a. a first additional key representing a carriage-return control,
   b. a second additional key representing a space control, and
   c. a third additional key representing a line feed control; and 3. a third group of additional keys representing arithmetic operators positioned in a 4 × 1 matrix to the left and at a distance greater than the distance between adjacent columns of said pushbutton telephone keyboard including:
   a. a first additional key representing addition,
   b. a second additional key representing subtraction,
   c. a third additional key representing multiplication, and
   d. a fourth additional key representing division; wherein non-alphanumeric typewriter symbos are divided into first, second, and third mutually exclusive groups, each group having less than five symbols, wherein each symbol of the first group of symbols is individually selectable by operation of a corresponding individual key of said third group of additional keys when the second information level is selected and maintained during said key operation, wherein each symbol of the second group of symbols is individually selectable by operation of a corresponding individual key of the third group of additional keys when the third information level is selected and maintained during said key operation, and wherein each symbol of the third group of symbols is individually selectable by operation of a corresponding individual key of said third group of additional keys when the fourth information level is selected and maintained during said key operation; and C. a signal-generating circuit responsive to the selected and maintained operation of the shift means and the corresponding selection of a key of the information entry keyboard for generating signal corresponding to the information repesented by operation of the selected key of the keyboard while an information level has been selected by operation of the shift means.

* * * * *

UNITED STATES PATENT AND TRADEMARK OFFICE
CERTIFICATE OF CORRECTION

PATENT NO. : 4,007,443

DATED : February 8, 1977

INVENTOR(S) : Michael Arnold Bromberg, William E. Fletcher, Richard E. Morley, and George G. Schwenk It is certified that error appears in the above-identified patent and that said Letters Patent are hereby corrected as shown below:

In the Abstract, Paragraph 3, line 4, insert --.-- after "simultaneously".

Column 1, line 25, cancel "teletype" and substitute therefor --teletypewriter--.

Column 1, line 32, cancel "teletypewriter" and substitute therefor --teletypewriters--.

Column 1, line 37, cancel "informationn" and substitute therefor --information--.

Column 1, line 37, cancel first occurrence of "teletype" and substitute therefor --teletypewriter--.

Column 1, line 37, cancel second occurrence of "teletype" and substitute therefor --teletypewriter--.

Column 1, line 38, cancel "teletypewriter" and substitute therefor --teletypewriters--.

Column 2, line 22, insert --are-- after "keys".

Column 2, line 23, cancel "leg" and substitute therefor --key--.

Column 3, line 5, cancel "teletypewriter" and substitute therefor --teletypewriters--.

Column 3, line 18, cancel "37".

Column 3, line 19, cancel " lockout" " and substitute therefor --"lockout"--.

Column 3, line 35, cancel "coputer" and substitute therefor --computer--.

Column 3, line 42, after "3", insert --shift--.

Column 3, line 43, cancel "keep" and substitute therefor --keys--.

UNITED STATES PATENT AND TRADEMARK OFFICE
CERTIFICATE OF CORRECTION

PATENT NO. : 4,007,443

DATED : February 8, 1977

INVENTOR(S) : Michael Arnold Bromberg, William E. Fletcher, Richard E. Morley, and George G. Schwenk It is certified that error appears in the above-identified patent and that said Letters Patent are hereby corrected as shown below:

Column 3, line 44, cancel "in" and substitute therefor --is--.

Column 3, line 52, cancel "diplayed" and substitute therefor --displayed--.

Column 4, line 51, insert --a-- before "displayable".

Column 5, line 16, cancel second occurrence of "or" and substitute therefor --on--.

Column 5, line 21, cancel "element" and substitute therefor --elements--.

Column 6, line 17, cancel "show" and substitute therefor --how--.

Column 8, line 38, cancel "th" and substitute therefor --the--.

Column 9, line 6, cancel "characters" and substitute therefor --character--.

Column 9, line 24, insert --key-- after "keyboard".

Column 9, line 53, cancel "aliphabetic" and substitute therefor --alphabetic--.

Column 9, line 57, insert --,-- between "26" and "27".

Column 9, line 60, cancel second occurrence of "and" and substitute therefor --@--.

Column 9, line 63, cancel "then" and substitute therefor --than--.

Column 10, line 15, cancel "teletypewriter" and substitute therefor --teletypewriters--.

UNITED STATES PATENT AND TRADEMARK OFFICE
CERTIFICATE OF CORRECTION

PATENT NO. : 4,007,443

DATED : February 8, 1977

INVENTOR(S) : Michael Arnold Bromberg, William E. Fletcher, Richard E. Morley and George G. Schwenk It is certified that error appears in the above-identified patent and that said Letters Patent are hereby corrected as shown below:

Column 10, line 39, cancel "teletypewriter" and substitute therefor --teletypewriters--.

Column 10, line 39, before "half", insert --use the--.

Column 10, line 49, cancel "writer" and substitute therefor --writers--.

Column 10, line 51, cancel "teletypewriter" and substitute therefor --teletypewriters--.

Column 10, line 58, cancel "writer" and substitute therefor --writers--.

Column 11, line 12, after "always" cancel --to--.

Column 11, line 32, after "word", insert --from--.

Column 11, line 46, cancel "typewriter" and substitute therefor --typewriters--.

Column 12, line 63, cancel "in" and substitute therefor --an--.

Column 13, line 14, cancel "20".

Column 13, line 19, cancel "background" and substitute therefor --backward--.

Column 13, line 20, cancel "moe" and substitute therefor --mode--.

Column 14, line 30, before "cursor", insert --the--.

Column 14, line 50, cancel "wit" and substitute therefor --with--.

Column 14, line 57, cancel "cabld" and substitute therefor --cable--.

UNITED STATES PATENT AND TRADEMARK OFFICE
CERTIFICATE OF CORRECTION

PATENT NO. : 4,007,443

DATED : February 8, 1977

INVENTOR(S) : Michael Arnold Bromberg, William E. Fletcher, Richard E. Morley and George G. Schwenk It is certified that error appears in the above-identified patent and that said Letters Patent are hereby corrected as shown below:

Column 15, line 35, cancel "block"

Column 15, line 36, cancel "transmission".

Column 16, line 14, cancel "been" and substitute therefor --when--.

Column 16, line 33, cancel "50" and substitute therefor --56--.

Column 18, line 36, cancel "144" and substitute therefor --44--.

Column 21, line 41, after "exclusive, insert --OR--.

Column 21, line 51, cancel "asychronous" and substitute therefor --asynchronous--.

Column 22, line 43, cancel "handheld" and substitute therefor --hand-held--.

Column 23, line 53, cancel "handheld" and substitute therefor --hand-held--.

Column 23, line 65, cancel "166" and substitute therefor --266--.

Column 24, line 24, cancel "read-out" and substitute therefor --read-only--.

Column 24, line 24, cancel "corporation" and substitute therefor --Corporation--.

Column 24, line 36, cancel "ae" and substitute therefor --are--.

Column 24, line 38, cancel "LOAD SR" and substitute therefor --LOAD SR--.

UNITED STATES PATENT AND TRADEMARK OFFICE
CERTIFICATE OF CORRECTION

PATENT NO. : 4,007,443            Page 5 of 7

DATED : February 8, 1977

INVENTOR(S) : Michael Arnold Bromberg, William E. Fletcher, Richard E. Morley and George G. Schwenk It is certified that error appears in the above—identified patent and that said Letters Patent are hereby corrected as shown below:

```
Column 24, line 40, cancel "STUFF" and substitute therefor
      --STUFF-- .
Column 24, line 42, cancel "RECIRC" and substitute therefor
      --RECIRC--.
Column 24, line 63, cancel "form" and substitute therefor
      --from--.
Column 25, line 11, cancel "charcters" and substitute
      therefor --characters--.
Column 25, line 38, cancel "the" and substitute therefor
      --The--.
Column 26, line 50, cancel "348,." and substitute therefor
      --348.--
Column 29, line 50, cancel "its" and substitute therefor
      --the--.
Column 29, line 51, cancel "the" and substitute therefor
      --its--.
Column 29, line 66, cancel "display" and substitute therefor
      --delay--.
Column 30, line 3, cancel "422" and substitute therefor
      --442--.
Column 30, line 39, after "31", insert --,--.

Column 30, line 45, before "symbol", insert --@--.

Column 30, line 46, cancel "is" and substitute therefor
      --in--.
Column 30, line 48, before "Z", cancel "the".
```

UNITED STATES PATENT AND TRADEMARK OFFICE
CERTIFICATE OF CORRECTION

PATENT NO. : 4,007,443
DATED : February 8, 1977
INVENTOR(S) : Michael Arnold Bromberg, William E. Fletcher, Richard E. Morley and George G. Schwenk It is certified that error appears in the above-identified patent and that said Letters Patent are hereby corrected as shown below:

Column 30, line 57, cancel " " and substitute therefor --the "?"--.
Column 30, line 58, after " "=" sign", insert --the ":" sign, the ";" sign,--.
Column 30, line 62, cancel "3b" and substitute therefor --3B--.
Column 32, line 31, cancel "keyborad" and substitute therefor --keyboard--.
Column 32, line 47, before "whereas", insert --@--.

Column 32, line 49, cancel "of".

Column 32, line 59, after "characters", insert -- -- --.

Column 33, line 31, after "any", insert --one--.

Column 34, line 56, cancel "generting".

Column 35, line 40, cancel "desirable" and substitute therefor --desired--.
Column 36, line 57, before "and", insert --@--.

Column 38, line 46, cancel "c." and substitute therefor --C)--.
Column 38, line 61, cancel "secod" and substitute therefor --second--.
Column 40, line 3, cancel "selective" and substitute therefor --selected--.
Column 41, line 68, cancel "genrating" and substitute therefor --generating--.
Column 43, line 54, cancel "subseqent" and substitute therefor --subsequent--.

UNITED STATES PATENT AND TRADEMARK OFFICE
CERTIFICATE OF CORRECTION

PATENT NO. : 4,007,443

DATED : February 8, 1977

INVENTOR(S) : Michael Arnold Bromberg, William E. Fletcher, Richard E. Morley and George G. Schwenk It is certified that error appears in the above-identified patent and that said Letters Patent are hereby corrected as shown below:

Column 45, line 37, cancel "alternations" and substitute therefor --alterations--.
Column 46, line 58, cancel "swiching" and substitute therefor --switching--.
Column 47, line 26, cancel "communcating" and substitute therefor --communicating--.
Column 50, line 2, after "',", insert --@--.

Column 50, line 36, cancel "symbos" and substitute therefor --symbols--.
Column 50, line 59, after "generating", insert --a--.
Column 50, line 60, cancel "repesented" and substitute therefor --represented--.

Signed and Sealed this

Thirtieth Day of May 1978

[SEAL]

Attest:

RUTH C. MASON
Attesting Officer

LUTRELLE F. PARKER
Acting Commissioner of Patents and Trademarks